United States Patent
Sasaki et al.

(10) Patent No.: US 8,828,488 B2
(45) Date of Patent: Sep. 9, 2014

(54) METHODS FOR PRODUCING A THIN FILM CONSISTING OF NANOSHEET MONOLAYER FILM(S) BY SPIN COAT METHODS, AND HYPERHYDROPHILIZED MATERIALS, SUBSTRATES FOR AN OXIDE THIN FILM AND DIELECTRIC MATERIALS OBTAINED THEREFROM

(75) Inventors: Takayoshi Sasaki, Ibaraki (JP); Kazuko Saruwatari, Ibaraki (JP); Kazuaki Matsuba, Ibaraki (JP); Kousyo Akatsuka, Ibaraki (JP); Yasuo Ebina, Ibaraki (JP); Minoru Osada, Ibaraki (JP)

(73) Assignee: National Institute For Materials Science, Ibaraki (JP)

( * ) Notice: Subject to any disclaimer, the term of this patent is extended or adjusted under 35 U.S.C. 154(b) by 0 days.

(21) Appl. No.: 13/591,372

(22) Filed: Aug. 22, 2012

(65) Prior Publication Data

US 2013/0101829 A1    Apr. 25, 2013

(30) Foreign Application Priority Data

Oct. 25, 2011 (JP) .................. 2011-233848

(51) Int. Cl.
| | |
|---|---|
| B05D 3/12 | (2006.01) |
| B05D 3/06 | (2006.01) |
| B32B 5/16 | (2006.01) |
| B82Y 30/00 | (2011.01) |
| B82Y 40/00 | (2011.01) |

(52) U.S. Cl.
CPC ... *B05D 3/06* (2013.01); *B32B 5/16* (2013.01); *B82Y 30/00* (2013.01); *B82Y 40/00* (2013.01); *B05D 3/12* (2013.01)

USPC ........... 427/240; 427/553; 427/595; 427/352; 427/353; 427/372.2; 427/425

(58) Field of Classification Search
CPC ...... B05D 1/005; B05D 3/065; B05D 3/0254; B32B 5/16; B82Y 40/00; B82Y 30/00
USPC .............. 427/240, 425, 372.2, 352, 353, 553, 427/595
See application file for complete search history.

(56) References Cited

U.S. PATENT DOCUMENTS

2008/0280103 A1* 11/2008 Uetsuka et al. ............... 428/148
2008/0311429 A1* 12/2008 Katsuragawa et al. ..... 428/820.1

OTHER PUBLICATIONS

T. Tanaka et al., "Highly Organized Self-Assembled Monolayer and Multilayer Films of Titania Nanosheets," Advanced Materials, Jun. 4, 2004, 16, No. 11, pp. 872-875.

(Continued)

*Primary Examiner* — Kirsten Jolley
(74) *Attorney, Agent, or Firm* — Wenderoth, Lind & Ponack, L.L.P.

(57) ABSTRACT

To provide a method for producing a thin film consisting of nanosheet monolayer film(s) and use of the thin film obtained thereby.

The method for producing a thin film consisting of nanosheet monolayer film(s) by a spin coat method according to the invention comprises a step for preparing an organic solvent sol formed by allowing nanosheets obtained by the exfoliation of an inorganic layered compound to be dispersed in an organic solvent; and a step for dropping the organic solvent sol onto a substrate and rotating the substrate using a spin coater. Preferably, the nanosheet size, the organic solvent sol concentration and the spin coater rotation speed are controlled.

17 Claims, 49 Drawing Sheets

(56) References Cited

OTHER PUBLICATIONS

K. Akatsuka et al., "Construction of Highly Ordered Lamellar Nanostructures through Langmuir—Blodgett Deposition of Molecularly Thin Titania Nanosheets Tens of Micrometers Wide and Their Excellent Dielectric Properties," ACS Nano, Apr. 2009, vol. 3, No. 5, pp. 1097-1106.

* cited by examiner

METHODS FOR PRODUCING A THIN FILM CONSISTING OF NANOSHEET MONOLAYER FILM(S) BY SPIN COAT METHODS, AND HYPERHYDROPHILIZED MATERIALS, SUBSTRATES FOR AN OXIDE THIN FILM AND DIELECTRIC MATERIALS OBTAINED THEREFROM

TECHNICAL FIELD

The present invention relates to a method for producing a thin film consisting of nanosheet monolayer film(s) by a spin coat method, and use of a thin film obtained thereby.

BACKGROUND ART

A nanosheet obtained by the exfoliation of an inorganic layered compound is known to be a substance having as a high two dimensional anisotropicity as several hundreds nm to several tens μm in lateral size relative to a thickness of several atoms. For example, among the inorganic layered compounds, a layered oxide is reported to exhibit a unique property reflecting the structure of the nanosheet mentioned above including a semiconductor property, a dielectric property, a ferromagnetic property, a fluorescent property, an optical catalytic property and the like.

In order to allow these properties to be exerted sufficiently, it is required to accomplish a formation of a highly defined nanosheet monolayer film in which the nanosheets are regularly aligned with an accuracy at a nanometer level while suppressing overlap or gap formation, and to repeat it to construct a multilayer film.

A technology for the aforementioned purpose includes a method involving a combination of an alternative adsorption method and an ultrasonic treatment method (see for example, Non-Patent literature 1). In Non-Patent literature 1, a substrate pre-coated with a polydiallyldimethyl ammonium (PDDA) ion having a positive charge is immersed in a colloid suspension having a negative charge for 20 minutes to allow the nanosheet to be adsorbed onto the substrate as a result of an electrostatic attractive force, followed by an ultrasonic treatment to remove the overlapped portions, thereby obtaining a satisfactorily aligned nanosheet monolayer film.

Another known technology is Langmuir-Blodgett (LB) method (see for example, Non-Patent literature 2). In Non-Patent Literature 2, on a trough where a colloid suspension is spread, a surface pressure is applied to allow the nanosheet to be adsorbed onto a gas-liquid interface, and then to be transferred onto a substrate, thereby obtaining a satisfactorily aligned nanosheet monolayer film.

Nevertheless, any of the technologies of Non-Patent literatures 1 and 2 involves a prolonged film-forming time (for example 2 hours in Non-Patent literature 1 and 1 hour in Non-Patent literature 2), a complicated film-forming operation or a reduced surface area of the substrate capable of film-forming, because of which a simple and highly productive novel film-forming technology is desired.

SUMMARY OF THE INVENTION

Problems to be Solved by the Invention

Accordingly, an object of the invention is to provide a method for producing a thin film consisting of nanosheet monolayer film(s) and use of the resultant thin film.

Means for Solving the Problems

The method for producing a thin film consisting of nanosheet monolayer film(s) by a spin coat method according to the invention comprises a step for preparing an organic solvent sol formed by allowing nanosheets obtained by the exfoliation of an inorganic layered compound to be dispersed in an organic solvent; and a step for dropping said organic solvent sol onto a substrate and rotating said substrate using a spin coater, and as a result the aforementioned problems are solved.

The inorganic layered compound may be selected from the group consisting of layered titanium oxide, layered perovskite oxide, layered manganese oxide, layered cobalt oxide, layered manganese.cobalt oxide, layered manganese.iron oxide, layered tungsten oxide, layered niobium oxide, layered tantalum oxide, layered titanium.niobium oxide, layered titanium.tantalum oxide, layered molybdenum oxide, and layered ruthenium oxide.

The organic solvent may be selected from the group consisting of dimethyl sulfoxide, formamide, propanol, dimethyl formamide, tetrahydrofuran, N,N-dimethyl acetamide, 1,3-dimethyl-2-imidazolidinone and N,N'-dimethyl propylene urea.

The inorganic layered compound is a layered titanium oxide; said nanosheet has a size within the range of 300 nm to 500 nm; and, in said step involving rotating, said spin coater rotation speed x (rpm) and said organic solvent sol concentration y(wt %) may satisfy Equation (1) shown below:

$$y=9\times10^{-9}x^2+4\times10^{-5}x+0.082 \quad (1)$$

in which the value of x includes an allowable range of ±300 rpm, and the value of y includes an allowable range of ±10% based on the value of y.

The inorganic layered compound is a layered titanium oxide;

said nanosheet has a size within the range of 2 μm to 20 μm; and, in said step involving rotating, said spin coater rotation speed x(rpm) and said organic solvent sol concentration y(wt %) may satisfy Equation (2) shown below:

$$y=2\times10^{-8}x^2+2\times10^{-5}x \quad (2)$$

in which the value of x includes an allowable range of ±300 rpm, and the value of y includes an allowable range of ±10% based on the value of y.

The inorganic layered compound is a layered perovskite oxide which is $M1Ca_2Nb_3O_{10}$ (M1 is at least one alkaline metal element);

said nanosheet has a size within the range of 2 μm to 10 μm; and, in said step involving rotating, said spin coater rotation speed x(rpm) and said organic solvent sol concentration y(wt %) may satisfy Equation (3) shown below:

$$y=10^{-8}x^2+0.0002x \quad (3)$$

in which the value of x includes an allowable range of ±300 rpm, and the value of y includes an allowable range of ±10% based on the value of y.

The step involving rotating may be conducted until said organic solvent sol dropped onto said substrate is dried.

A step for repeating the step for dropping said organic solvent sol onto a substrate and rotating said substrate using a spin coater may further be comprised.

The step for repeating may further comprise a step, subsequent to the step for dropping said organic solvent sol onto a substrate and rotating said substrate using a spin coater, for heating the thin film consisting of nanosheet monolayer film(s) formed on said substrate; and a step for washing the thin film consisting of nanosheet monolayer film(s) formed on said substrate with pure water.

The step for heating may involve heating the thin film consisting of nanosheet monolayer film(s) formed on said substrate at a temperature within the range from 150° C. to 250° C.

The step for repeating may further comprises a step, subsequent to the step for dropping said organic solvent sol onto a substrate and rotating said substrate using a spin coater, for washing the thin film consisting of nanosheet monolayer film(s) formed on said substrate with a further organic solvent; and a step for heating the thin film consisting of nanosheet monolayer film(s) formed on said substrate; wherein said further organic solvent has an affinity to said organic solvent and wherein the boiling point of said further organic solvent is lower than the boiling point of said organic solvent.

The further organic solvent may be selected from the group consisting of alcohols, acetone and acetonitrile.

The step for heating may heat the thin film consisting of nanosheet monolayer film(s) formed on said substrate at a temperature within the range from 50° C. to 150° C.

Subsequent to the step for repeating, a step for irradiating an ultraviolet light and removing the organic substances between said nanosheet monolayer films may further be comprised.

A material according to the invention comprises a thin film consisting of the nanosheet monolayer film(s) produced by the method described above wherein the thin film allows the surface to be hyperhydrophilized as a result of a UV irradiation, and as a result the aforementioned problems are solved.

A substrate for an oxide thin film according to the invention comprises a substrate; and, a seed layer positioned on the substrate; wherein the seed layer is a thin film consisting of nanosheet monolayer film(s) produced by the method described above, and as a result the aforementioned problems are solved.

The seed layer may be a thin film consisting of nanosheet monolayer film(s) obtained by the exfoliation from a layered titanium oxide; and wherein said oxide thin film is a (110)-oriented $SrTiO_3$.

The seed layer may be a thin film consisting of nanosheet monolayer film(s) obtained by the exfoliation from a layered perovskite oxide which is $M1Ca_2Nb_3O_{10}$ (M1 is at least one alkali metal element); and wherein said oxide thin film is a (100)-oriented $SrTiO_3$.

A dielectric material according to the invention is provided with a thin film consisting of the nanosheet monolayer film(s) produced by the method described above, and as a result the aforementioned problems are solved.

Advantage of the Invention

The method for producing a thin film consisting of a nanosheet monolayer film by a spin coat method according to the invention comprises a step for preparing an organic solvent sol formed by allowing nanosheets obtained by the exfoliation of an inorganic layered compound to be dispersed in an organic solvent; and a step for dropping the organic solvent sol onto a substrate and rotating the substrate using a spin coater. By using the spin coat, the nanosheet monolayer film can be obtained by a simple operation within a short time period. Also by using as an organic solvent an organic solvent selected from the group consisting of dimethyl sulfoxide, formamide, propanol, dimethyl formamide, tetrahydrofuran, N,N-dimethyl acetamide, 1,3-dimethyl-2-imidazolidinone and N,N'-dimethyl propylene urea, a satisfactory nanosheet monolayer film in which the nanosheets are aligned densely due to the spin coat can be obtained. Preferably, the production method according to the invention allows a nanosheet monolayer film to be obtained surely within a short time period by a simple operation, as a results of complying with a specific concentration and a specific rotation speed on the basis of a specific size of the nanosheet obtained by means of an exfoliation in a specific inorganic layered compound.

The thin film obtained by the method according to the invention can serve as a hyperhydrophilized material whose surface is hyperhydrophilized when irradiated with a UV light, a dielectric material having a high dielectric constant, or a seed layer preferable for developing an oriented film thereon. Since such a high-quality thin film can be produced conveniently by the method involving the spin coat according to the invention, the production cost of a hyperhydrophilized material, a dielectric material and a substrate accompanied with a seed layer can be reduced.

BEST MODE FOR CARRYING OUT THE INVENTION

Before discussing the Examples, the method for producing a thin film consisting of nanosheet monolayer film(s) by a spin coat method of the invention is described in detail. As used herein, the term "a nanosheet monolayer film" means a monolayer film formed by allowing nanosheets obtained by the exfoliation of an inorganic layered compound to be aligned densely without overlapping. It should be noted that the term "a thin film consisting of nanosheet monolayer film(s)" means both of a nanosheet monolayer itself and a multilayer film formed from such nanosheet monolayer films as a result of multilayering (also referred to as a nanosheet multilayer film).

First, the production of a nanosheet monolayer film as a thin film according to the invention is described.

Figure 1:
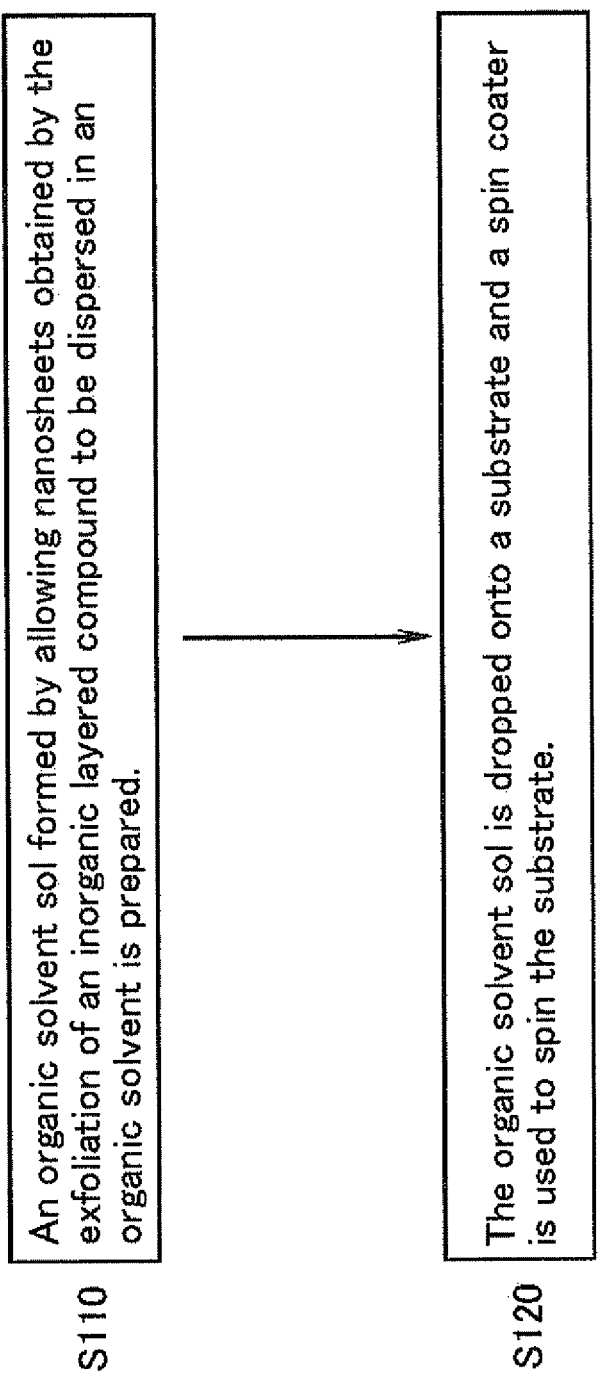
FIG. 1 is a flowchart showing a step for producing a nanosheet monolayer film as a thin film by a spin coat method according to the invention.

FIG. 1 is a flowchart showing a step for producing a nanosheet monolayer film as a thin film by a spin coat method according to the invention.

Step S110: An organic solvent sol formed by allowing nanosheets obtained by the exfoliation of an inorganic layered compound to be dispersed in an organic solvent is prepared. As used herein, the inorganic layered compound may be any substance capable of being exfoliated into nanosheets, and it is preferably selected from the group consisting of layered titanium oxide, layered perovskite oxide, layered manganese oxide, layered cobalt oxide, layered manganese.cobalt oxide, layered manganese.iron oxide, layered tungsten oxide, layered niobium oxide, layered tantalum oxide, layered titanium.niobium oxide, layered titanium.tantalum oxide, layered molybdenum oxide, and layered ruthenium oxide. Any of these substances exhibits or is expected to exhibit a unique property with regard to the semiconductor property, dielectric property, ferromagnetic property, fluorescent property, optical catalytic property and the like, and can advantageously be brought into practical use.

The layered titanium oxide is any layered titanium oxide which can be exfoliated to give titania nanosheets. As used herein, the exfoliated titania nanosheet is represented for example by Formula (Ti, M2)O$_x$ (wherein M2 is a metal element or a hole, $1 \leq x \leq 2$). The layered titanium oxide giving such a titania nanosheet may for example be $Na_2Ti_3O_7$, $K_2Ti_4O_9$, $Cs_2Ti_5O_{11}$, $M1_x(Ti,M2)_2O_4$ (wherein M1 is at least one alkaline metal element, $0<x<1$) and the like.

The layered perovskite oxide is any layered perovskite oxide which can be exfoliated to give perovskite nanosheets. As used herein, the exfoliated perovskite nanosheet is represented for example by Formula $A_{n-1}M_nO_{3n+1}$ (wherein A=Ca, Sr, Ba, Na, K, rare earth element, M=Nb, Ta, Ti, $2 \leq n \leq 7$). The layered perovskite oxide giving such a perovskite nanosheet is known to be of Dion-Jacobson type represented by $A'[A_{n-1}M_nO_{3n+1}]$ (A': alkaline metal), Ruddlesden-Popper type represented by $A'_2[A_{n-1}M_nO_{3n+1}]$ and Aurivillius type represented by $(Bi_2O_2)[A_{n-1}M_nO_{3n+1}]$. When the n is within the aforementioned range, the aforementioned perovskite nanosheet can be given while keeping the crystalline structure of the layered perovskite oxide. It is also possible that any of the A position, A' position and M position can be occupied with a plural of elements, the ratio of which in such a case is not limited particularly. This compound system may extremely be diverse, and the representative layered perovskite oxide may for example be $KLaNb_2O_7$, $KCa_2Nb_3O_{10}$, $KSr_2Nb_3O_{10}$, $CsCa_2Nb_3O_{10}$, $KCa_2NaNb_4O_{13}$, $KCa_2Na_2Nb_5O_{16}$, $KCa_2Na_3Nb_6O_{19}$, $Li_2Eu_{2/3}Ta_2O_7$, $K_2La_2Ti_3O_{10}$, $(K_{1.5}Eu_{0.5})Ta_3O_{10}$ and the like.

The layered manganese oxide is any layered manganese oxide which can be exfoliated to give manganate nanosheets. As used herein, the exfoliated manganate nanosheet is represented for example by Formula $MnO_2$. The layered manganese oxide giving such a manganate nanosheet is represented by Formula $M1_xMnO_2$ (wherein M1 is at least one alkaline metal element, and x is larger than 0 and not more than 1).

The layered cobalt oxide is any layered cobalt oxide which can be exfoliated to give cobalt oxide nanosheets. As used herein, the exfoliated cobalt oxide nanosheet is represented for example by Formula $CoO_2$. The layered cobalt oxide giving such a cobalt oxide nanosheet is represented by Formula $A_xMnO_2$ (wherein A is at least one alkaline metal element, alkaline earth metal element or transition metal element, and x is larger than 0 and not more than 1).

The layered manganese.cobalt oxide is any layered manganese.cobalt oxide which can be exfoliated to give manganic.cobalt oxide nanosheets. As used herein, the exfoliated manganic.cobalt oxide nanosheet is represented for example by Formula $Mn_{1-x}Co_xO_2$ (0<x<1). The layered manganese.cobalt oxide giving such a manganic.cobalt oxide nanosheet is represented by Formula $M1_yMn_{1-x}Co_xO_2$ (wherein M1 is at least one alkaline metal element, and x and y are larger than 0 and not more than 1).

The layered manganese.iron oxide is any layered manganese.iron oxide which can be exfoliated to give manganic.iron oxide nanosheets. As used herein, the exfoliated manganic.iron oxide nanosheet is represented for example by Formula $Mn_{1-x}Fe_xO_2$ (0<x<1). The layered manganese.iron oxide giving such a manganic.iron oxide nanosheet is represented by Formula $M1_yMn_{1-x}Fe_xO_2$ (wherein M1 is at least one alkaline metal element, and y is larger than 0 and not more than 1).

The layered tungsten oxide is any layered tungsten oxide which can be exfoliated to give tungsten oxide nanosheets. The layered tungsten oxide may for example be $Rb_4W_{11}O_{35}$, $Cs_{6+z}W_{11}O_{36}$ (0≤z≤0.31), $Cs_{8.5}W_{15}O_{48}$ and the like.

The layered niobium oxide is any layered niobium oxide which can be exfoliated to give niobate nanosheets. Examples of the niobate nanosheet herein are $Nb_3O_8$, $Nb_8O_{17}$ and the like. The layered niobium oxide giving such a niobate nanosheet may for example be $KNb_3O_8$, $K_4Nb_8O_{17}$ and the like.

The layered tantalum oxide is any layered tantalum oxide which can be exfoliated to give tantalate nanosheets. Examples of the tantalate nanosheet herein are $TaO_3$ and the like. The layered tantalum oxide giving such a tantalate nanosheet may for example be $RbTaO_3$ and the like.

The layered titanium.niobium oxide is any layered titanium.niobium oxide which can be exfoliated to give titanium-niobate nanosheets. Examples of the titanium-niobate nanosheet herein are $TiNbO_5$, $Ti_5NbO_{14}$, $Ti_2NbO_7$ and the like. The layered titanium.niobium oxide giving such a titanium-niobate nanosheet may for example be $M1[TiNbO_5]$, $M1_3[Ti_5NbO_{14}]$, $M1[Ti_2NbO_7]$ (M1 is at least one alkaline metal element) and the like.

The layered titanium.tantalum oxide is any layered titanium.tantalum oxide which can be exfoliated to give titanium-tantalate nanosheets. Examples of the titanium-tantalate nanosheet herein are $TiTaO_5$, $Ti_5TaO_{14}$, $Ti_2TaO_7$ and the like. The layered titanium.tantalum oxide giving such a titanium-tantalate nanosheet may for example be $M1[TiTaO_5]$, $M1_3[Ti_5TaO_{14}]$, $M1[Ti_2TaO_7]$ (M1 is at least one alkaline metal element) and the like.

The layered molybdenum oxide is any layered molybdenum oxide which can be exfoliated to give molybdenum oxide nanosheets. Examples of the molybdenum oxide nanosheet herein are represented by $MoO_2$. The layered molybdenum oxide giving such a molybdenum oxide nanosheet is represented by Formula $M1MoO_2$ (M1 is at least one alkaline metal element).

The layered ruthenium oxide is any layered ruthenium oxide which can be exfoliated to give ruthenium oxide nanosheets. Examples of the ruthenium oxide nanosheet herein are represented by $RuO_2$ and $RuO_{2.1}$. The layered ruthenium oxide giving such a ruthenium oxide nanosheet is represented by Formula $M1RuO_2$ (M1 is at least one alkaline metal element).

Formulae of the aforementioned inorganic layered compounds are only examples and heterogeneous metal elements such as added elements may be combined in the form of a solid solution as long as the layered structure is maintained, and it should be noted that the constituents are not necessarily limited to the aforementioned elements nor the aforementioned composition.

The organic solvent is not limited particularly, and is preferably selected from the group consisting of dimethyl sulfoxide (DMSO), formamide, propanol, dimethyl formamide, tetrahydrofuran, N,N-dimethyl acetamide, 1,3-dimethyl-2-imidazolidinone and N,N'-dimethyl propylene urea. These organic solvents are polar solvent, in which the nanosheets can readily be dispersed. Among these, DMSO is preferable in view of its suitable viscosity (being spread to form a thin liquid film upon spin coat discussed later) and vapor pressure (being dried relatively slowly thus being controlled easily).

The nanosheet content in the organic solvent sol is 0.001% by mass or more and 10% by mass or less, preferably 0.02% by weight or more, more preferably 0.05% by weight or more and 1.0% by weight or less, further preferably 0.1% by weight or more and 1.0% by weight or less relatvive to the total mass of the organic solvent sol. A higher content tends to lead a poor dispersibility of the nanosheets.

The typical production course of the organic solvent sol is described below.

Figure 2:
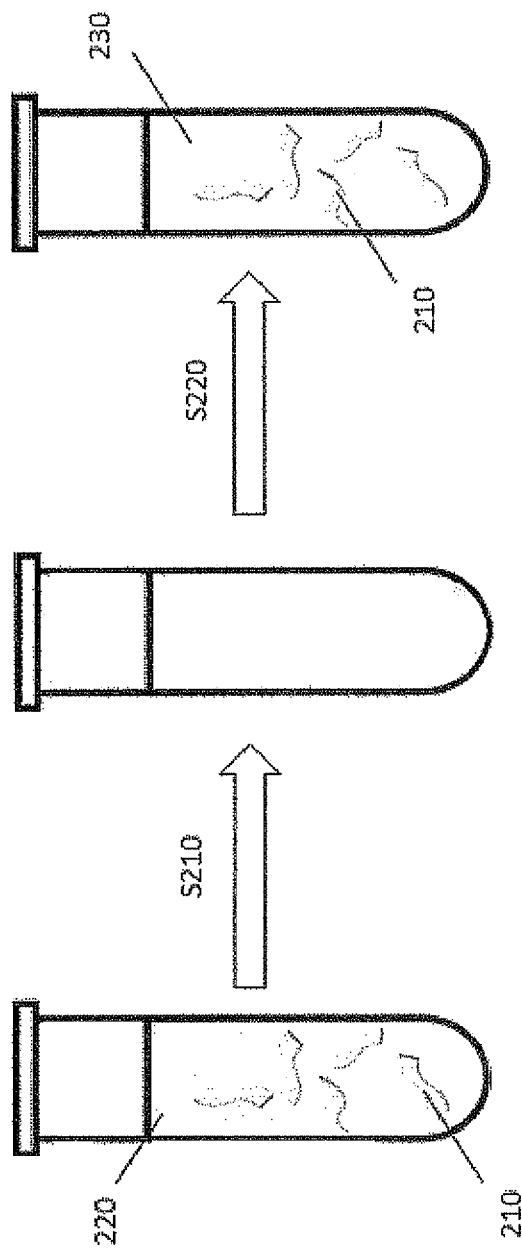
FIG. 2 is a procedure showing a production course of an organic solvent sol.

FIG. 2 is a procedure showing a production course of an organic solvent sol.

Step S210: A water-based sol having nanosheet 210 dispersed in water 220 is centrifuged. The nanosheet 210 is an inorganic layered compound obtained by exfoliation. The centrifuge condition involves, for example, 10000 rpm to 35000 rpm and 10 minutes to 45 minutes, which may vary depending on the inorganic layered compound selected. As a result, the nanosheet 210 in the water-soluble sol is sedimented.

Step S220: The supernatant water is removed, and the sedimented nanosheet 210 is combined with the aforementioned organic solvent 230 to disperse the nanosheet 210 again. As a result, an organic solvent sol is obtained.

The concentration of the organic solvent sol can be obtained from the difference between the absorbance of the water-based sol before centrifugation in Step S210 and the absorbance of the supernatant after centrifugation.

Alternatively, a process involving centrifugation of the organic solvent sol obtained in Step S220 to sediment the nanosheet 210, removal of the supernatant followed by re-dispersion in the organic solvent 230 may be repeated several times to produce an organic solvent sol whose residual water is reduced. The organic solvent sol concentration can be regulated by regulating the amount of the organic solvent 230 relative to the nanosheet 210.

Again, reference is made here to FIG. 1.

Figure 3:
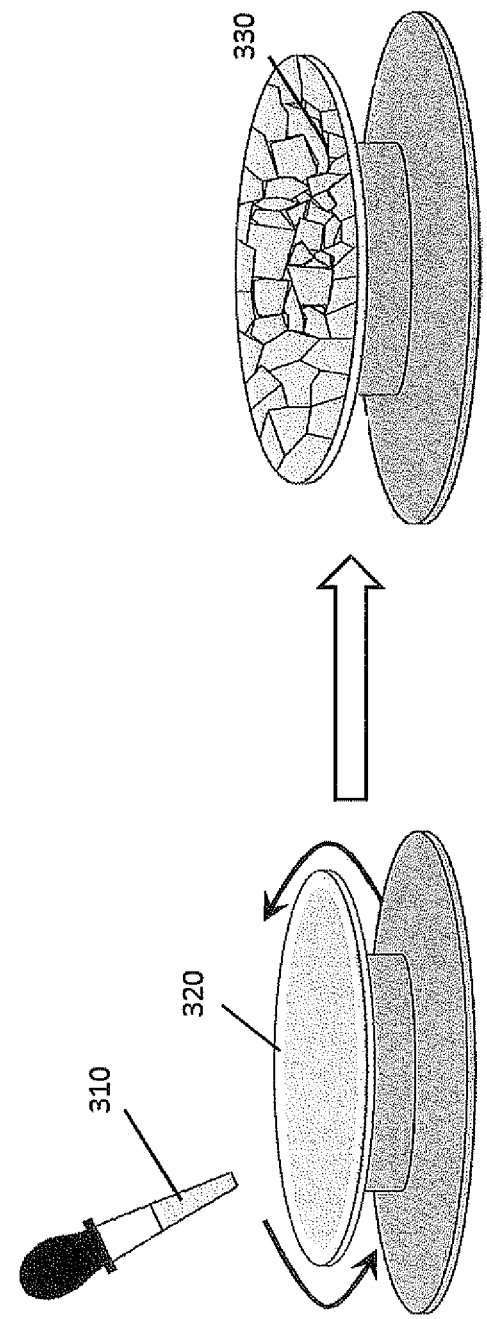
FIG. 3 is a procedure showing the production sequence of Step S120 in FIG. 1.

FIG. 3 is a procedure showing the production sequence of Step S120 in FIG. 1.

Step S120: The organic solvent sol 310 is dropped onto a substrate 320 and a spin coater is used to spin the substrate. The substrate may be any substrate such as a metal substrate of Pt and the like, a semiconductor substrate of Si, GaAs and the like, a transparent substrate of quartz, glass and the like, an organic substrate of a plastic and the like. The surface of the substrate has been treated to be hydrophilic. Specifically, the surface is wiped with acetone, and the organics-free substrate is immersed in a mixture solution of methanol and hydrochloric acid (1:1 in v/v) for 15 minutes to 45 minutes, washed with an ultra pure water, immersed in a concentrated hydrochloric acid for 15 minutes to 45 minutes, and then washed again with the ultra pure water.

Specifically, in Step S120, the organic solvent sol 310 dropped onto the substrate 320 is spread to the edge of the substrate 320 as a result of the rotation of the substrate 320 by the spin coater, and thereafter the substrate 320 is further spun until the organic solvent sol 310 has completely been dried. Under a certain condition, a nanosheet monolayer film 330 in which the nanosheets are aligned densely without overlapping each other is obtained as a thin film. According to the invention, a satisfactory nanosheet monolayer film can be obtained by the spin coat because of employing an organic solvent sol using the aforementioned specific organic solvent. While the film-forming time period required for obtaining a monolayer film (time period during which the substrate is spun to achieve a complete drying of the organic solvent sol) may vary depending on the type and the size of the inorganic layered compound selected as well as the organic solvent sol concentration, it may for example be within the range of 1 minute to 3 minutes, which is an extremely short period.

Preferably, in Step S120, the concentration of the organic solvent sol 310 and the rotation speed of the substrate 320 effected by the spin coater (hereinafter simply referred to as the spin coater rotation speed) are selected, depending on the type of the inorganic layered compound and the nanosheet size, so that the relationship shown below is satisfied. As used herein, the size means the lateral size of the nanosheet.

For example, when the inorganic layered compound is a layered titanium oxide and its nanosheet size is within the range of 300 nm to 500 nm, the spin coater rotation speed x (rpm) and the organic solvent sol 310 concentration y (% by weight) satisfy Equation (1).

$$y=9\times10^{-9}x^2+4\times10^{-5}x+0.082 \quad (1)$$

In the aforementioned equation, the value of x satisfying Equation (1) has an allowable range of ±300 rpm, and the value of y has an allowable range of ±10% based on the value of y, and in the case that the values of x and y within these range (thus, within the range of ±10% of the concentration y defined by Equation (1) from the predetermined rotation speed x, or, within ±300 rpm of the rotation speed x defined by Equation (1) from the predetermined concentration y), then a high quality nanosheet monolayer film can be obtained at a high yield. The titanium oxide (titania) nanosheet monolayer film thus obtained has an absorbance of 0.065 to 0.075 at a wavelength of 265 nm, and is extremely uniform and excellent in the visible light transmission.

In another embodiment, when the inorganic layered compound is a layered titanium oxide and its nanosheet size is within the range of 2 μm to 20 μm, the spin coater rotation speed x (rpm) and the organic solvent sol 310 concentration y (% by weight) satisfy Equation (2).

$$y=2\times10^{-8}x^2+2\times10^{-5}x \quad (2)$$

In the aforementioned equation, the value of x satisfying Equation (2) has an allowable range of ±300 rpm, and the value of y has an allowable range of ±10% based on the value of y, and in the case that the values of x and y within these range (thus, within the range of ±10% of the concentration y defined by Equation (2) from the predetermined rotation speed x, or, within ±300 rpm of the rotation speed x defined by Equation (2) from the predetermined concentration y), then a high quality nanosheet monolayer film can be obtained at a high yield. The titanium oxide (titania) nanosheet monolayer film thus obtained has an absorbance of 0.065 to 0.075 at a wavelength of 265 nm, and is extremely uniform and excellent in the visible light transmission.

In further embodiment, when the inorganic layered compound is a layered perovskite oxide which is $M1Ca_2Nb_3O_{10}$ (M1 is at least one alkaline metal element) and its nanosheet size is within the range of 2 μm to 10 μm, the spin coater rotation speed x (rpm) and the organic solvent sol 310 concentration y (% by weight) satisfy Equation (3).

$$y=10^{-8}x^2+0.0002x \quad (3)$$

In the aforementioned equation, the value of x satisfying Equation (3) has an allowable range of ±300 rpm, and the value of y has an allowable range of ±10% based on the value of y, and in the case that the values of x and y within these range (thus, within the range of ±10% of the concentration y defined by Equation (3) from the predetermined rotation speed x, or, within ±300 rpm of the rotation speed x defined by Equation (3) from the predetermined concentration y), then a high quality nanosheet monolayer film can be obtained at a high yield. The niobium oxide nanosheet monolayer film thus obtained has an absorbance of 0.045 to 0.055 at a wavelength of 270 nm, and is extremely uniform and excellent in the visible light transmission.

The types and the sizes of the aforementioned inorganic layered compounds and the relationship between the spin coater rotation speed x and the organic solvent sol concentration y are summarized in Table 1 for convenience.

TABLE 1

Table 1: Preferable spin coat condition of each inorganic layered compound

| Inorganic layered compound | Size | Relationship between the rotation speed x (rpm) and organic solvent sol concentration y (% by wt) |
|---|---|---|
| Layered titanium oxide | 300 nm~500 nm | $y = 9 \times 10^{-9}x^2 + 4 \times 10^{-5}x + 0.082$ |
| Layered titanium oxide | 2 μm~20 μm | $y = 2 \times 10^{-8}x^2 + 2 \times 10^{-5}x$ |
| Layered perovskite oxide ($KCa_2Nb_3O_{10}$) | 2 μm~10 μm | $y = 10^{-8}x^2 + 0.0002x$ |

From Equations (1) to (3), it is understood that in order to obtain a preferred thin film consisting of a nanosheet monolayer film the relationship of a quadratic function should exist between the spin coater rotation speed x and the organic solvent sol concentration y. This quadratic function may vary depending on the type and the size of the nanosheet obtained by exfoliation from the respective inorganic layered compounds, and can be obtained by repetitive experiments of the respective inorganic layered compounds.

As described above, according to the invention, by a spin coat method employing an organic solvent sol in which nanosheets are dispersed in a certain organic solvent, a nanosheet monolayer film can be produced as a thin film conveniently within a short period. In addition, in the cases for example of the inorganic layered compounds which are a layered titanium oxide and a layered perovskite oxide, a high quality nanosheet monolayer film can be obtained surely within a short time period by a simple operation, as a results of complying with a specific concentration and a specific rotation speed on the basis of a specific size.

The nanosheet monolayer film thus obtained can serve as a seed layer for growing the crystal of an oxide. For example, various substrates for growing a crystalline thin film comprising a substrate and a nanosheet monolayer film obtained by the production method of the invention which is positioned on the substrate can be provided. An oxide crystal capable of being grown may vary dependent on the type of the seed layer, and in the case for example that the nanosheet monolayer film as a seed layer is a nanosheet monolayer film obtained by the exfoliation from a layered titanium oxide then a perovskite-based oxide such as $SrTiO_3$ can be (110) oriented. Also in the case that the nanosheet monolayer film as a seed layer is a nanosheet monolayer film obtained by the exfoliation from a layered perovskite oxide then a perovskite-based oxide such as $SrTiO_3$ can be (100) oriented. Also since a high quality nanosheet monolayer film can conveniently be obtained at a high productivity as a result of a spin coat method unlike to a conventional method involving a prolonged film-forming time and a complicated operation such as an alternative adsorption method or an LB method, such a substrate for growing an oxide crystalline thin film can be provided at a low price and can advantageously be brought into practical use.

In addition, the thin film consisting of a nanosheet monolayer film obtained by the method of the invention can serve as a material whose surface is hyperhydrophilized when being irradiated with a UV irradiation. A high quality hyperhydrophilized material useful as an anti-dirt material can be obtained conveniently over a large surface area by a spin coat method.

In addition, the thin film consisting of the nanosheet monolayer film obtained by the production method of the invention can act as a dielectric material since it has a high dielectric constant and is excellent in the insulating property. Also since a dielectric material can readily be produced over a large surface area by a spin coat method, a benefit over existing LB method or alternative adsorption method can be experienced.

Next, a case of producing a nanosheet multilayer film as a thin film is described.

Figure 4:
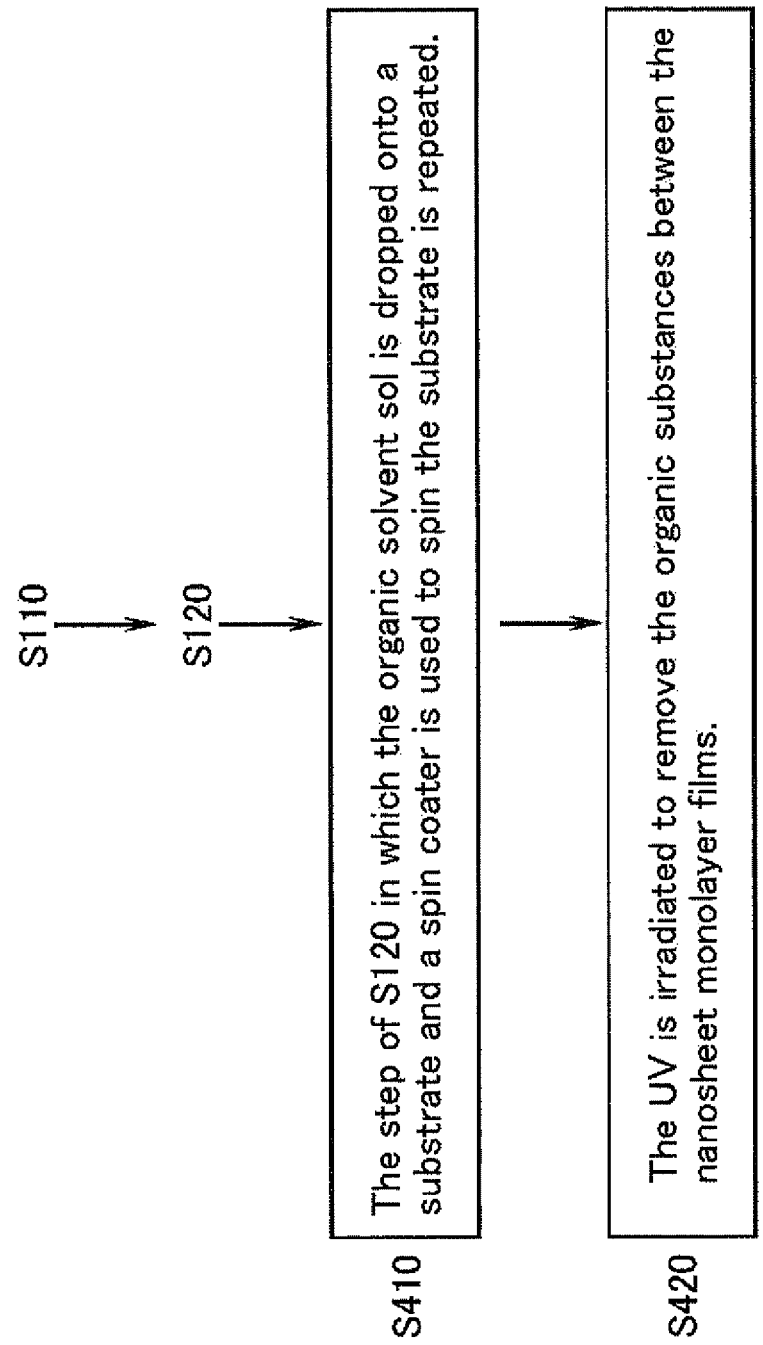
FIG. 4 is a flowchart showing a step for producing a nanosheet multilayer film as a thin film by a spin coat method according to the invention.

FIG. 4 is a flowchart showing a step for producing a nanosheet multilayer film as a thin film by a spin coat method.

Step S410: Following to the step for producing a nanosheet monolayer film as a thin film described with referring to FIG. 1, Step S120 in FIG. 1 is conducted repetitively. As a result, a nanosheet multilayer film formed as a result of multilayering of the nanosheet monolayer films can be obtained.

Figure 5:
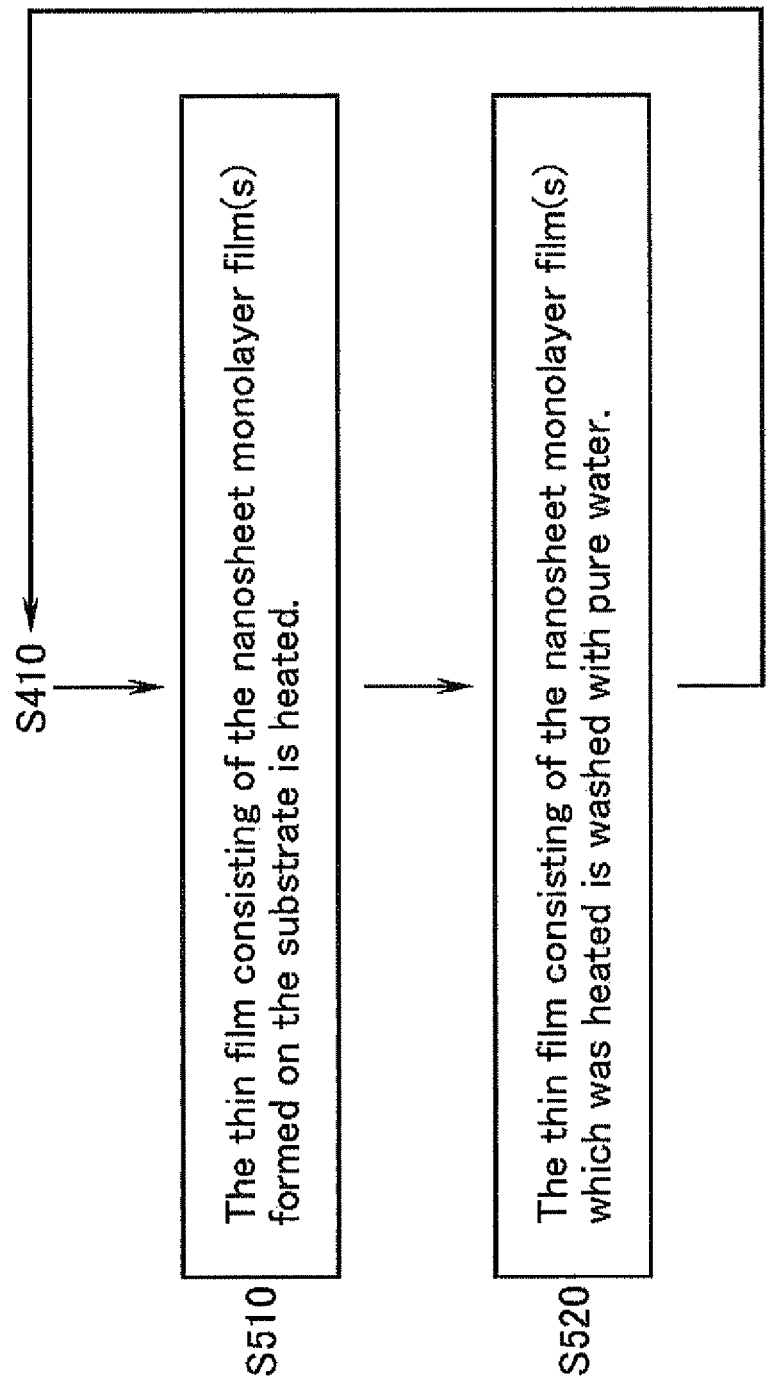
FIG. 5 is a flowchart showing a preferred step of Step S410.

FIG. 5 is a flowchart showing a preferred step of Step S410.

Step S410 in FIG. 4 preferably further includes two steps.

Step S510: Following to Step S120, the thin film consisting of the nanosheet monolayer film(s) formed on the substrate is heated. As a result, the organic solvent remaining in the thin film consisting of the nanosheet monolayer film(s) is removed, thereby obtaining a tough multilayer film having nanosheet monolayer films contacted closely with each other.

The heating temperature is not limited particularly as long as it is a temperature capable of removing the organic solvent selected in Step S110 in FIG. 1, while it is preferably within the range of 150° C. or higher and 250° C. or lower (150° C. to 250° C.). The heating time is not limited particularly and may be at least 10 minutes or longer. For example, when selecting DMSO as an organic solvent, the heating condition of 200° C. for 10 minutes to 20 minutes may be sufficient.

Step S520: The thin film consisting of the nanosheet monolayer film(s) which was heated is washed with pure water. As a result, the surface becomes compatible with the organic solvent.

Figure 6:
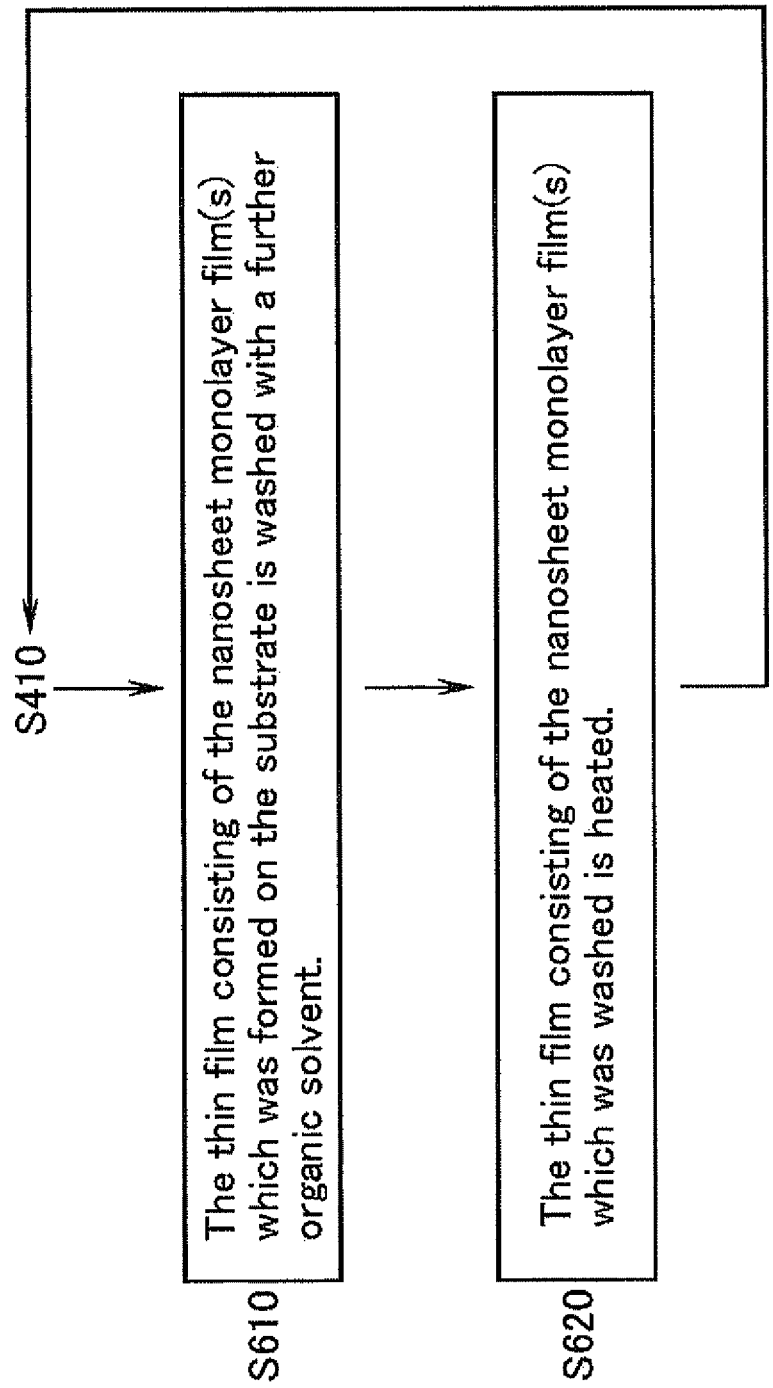
FIG. 6 is a flowchart showing another preferred step of Step S410.

FIG. 6 is a flowchart showing another preferred step of Step S410.

Step S610: Following to Step S120, the thin film consisting of the nanosheet monolayer film(s) which was formed on the substrate is washed with a further organic solvent. As used herein, the further organic solvent has an affinity with the organic solvent employed in Step S110. As a result, the organic solvent remaining in the thin film consisting of the nanosheet monolayer film(s) is readily replaced with the further organic solvent. The boiling point of the further organic solvent is lower than the boiling point of the organic solvent selected from Step S110. As a result, the heating temperature in the Step S620 described below can be lower than that in Step S10 in FIG. 510. Typically, such a further organic solvent is selected preferably from the group consisting of alcohols such as methanol, ethanol and butanol, as well as acetone and acetonitrile. These are readily available and handled conveniently.

Step S620: The thin film consisting of the nanosheet monolayer film(s) which was washed is heated. As a result, the further organic solvent remaining in the thin film consisting of the nanosheet monolayer film(s) is removed, thereby obtaining a tough multilayer film having nanosheet monolayer films contacted closely with each other.

The heating temperature is not limited particularly as long as it is a temperature capable of removing the further organic solvent selected in Step S610, while it is preferably within the range of 50° C. or higher and 150° C. or lower (50° C. to 150° C.). The heating time is not limited particularly and may be at least 10 minutes or longer. For example, when selecting ethanol among alcohols as an organic solvent, the heating condition of 100° C. for 10 minutes to 20 minutes may be sufficient.

Again, reference is made here to FIG. 4. After obtaining the multilayer film formed from the nanosheet monolayer films as a result of multilayering in Step S410, Step S420 may be conducted.

Step S420: Following to Step S410, the resultant nanosheet multilayer film is irradiated with UV to remove the organic substances between the nanosheet monolayer films. The nanosheet monolayer film induce an optical catalyst effect when irradiated with UV. As a result, the organic substances between the nanosheet monolayer films (for example, $TBA^+$ employed during nanosheet production and organic substances in organic solvent sol) are decomposed and removed. Consequently, the nanosheet multilayer film can become a organic-free inorganic thin film.

While the UV irradiation condition may appropriately be modified depending on the number of layers in the nanosheet multilayer film, a nanosheet multilayer film having, for example, 10 layers can sufficiently be free of the organic substances when the UV light is irradiated at 1 $mW/cm^2$ for about 200 hours.

Such a nanosheet multilayer film which has been converted into an inorganic thin film is stable due to the absence of the organic substance. In addition, the a nanosheet multilayer film which has been converted into an inorganic thin film allows the dielectric function, the optical catalyst function and the like to be exerted efficiently, thus being advantageous in allowing the seed layer effect to work stably and effectively.

As described above, according to the invention, since the nanosheet monolayer film can be multilayered into a multilayer only by repeating Step S120 in FIG. 1, a convenient operation and a production within a short time period can be achieved. Also since Step S120 involving the condition complying with a specific concentration and a specific rotation speed on the basis of a specific size of the nanosheet for obtaining a high quality nanosheet monolayer film having an excellent visible light transmittability is repeated, the resultant nanosheet multilayer film can also become a high quality one having an excellent visible light transmittability.

While the invention is further detailed in the following typical Examples, it should be noted that the invention is not limited to these Examples.

Example 1

In Example 1, a monolayer film (nanosheet monolayer film) whose inorganic layered compound is a layered titanium oxide and which consists of nanosheets (a nanosheet size: 300 nm to 500 nm) exfoliated from the layered titanium oxide as a thin film was produced.

Prior to the production of the nanosheet monolayer film, the layered titanium oxide synthesis and the production of the nanosheet exfoliated therefrom were conducted. The layered titanium oxide was synthesized by a solid phase method.

Specifically, the starting powders of $TiO_2$ (manufactured by Rare Metallic Co., Ltd, purity: 99.99%), $K_2CO_3$ (manufactured by Rare Metallic Co., Ltd, purity: 99.99%) and $Li_2CO_3$ (manufactured by Rare Metallic Co., Ltd, purity: 99.99%) were weighed based on a stoichiometric ratio of $TiO_2:K_2CO_3:Li_2CO_3=1:0.23:0.078$. The weighed starting powders were pulverized and mixed for 60 minutes using an alumina mortar. Since $K_2CO_3$ and $Li_2CO_3$ which are alkaline metal carbonates are partly evaporated upon sintering, they were added in amounts in excess by 5% by mole. The pulverized and mixed starting powders were placed in a platinum crucible and sintered preliminarily in an electric furnace for 1 hour at 900° C. Thereafter, the preliminarily sintered starting powders were pulverized and mixed again for 30 minutes using the alumina mortar. Then, the pulverized and mixed starting powders were placed in a platinum crucible and sintered for 20 hours at 1000° C. As a result, $K_{0.8}Ti_{1.73}Li_{0.27}O_4$ was synthesized as a layered titanium oxide.

Next, the layered titanium oxide was exfoliated to obtain nanosheets having a nanosheet size of 300 nm to 500 nm. Specifically, the resultant layered titanium oxide was stirred and reacted at a ratio of 10 $gL^{-1}$ in a 1 $molL^{-1}$ aqueous solution of hydrochloric acid (manufactured by Wako Pure Chemical Industries, LTD, special grade). The hydrochloric acid aqueous solution was exchanged every 24 hours and reacted for 3 days, and then filtered and dried in air to recover the hydrogen ion exchanged form $H_{1.07}Ti_{1.73}O_4 \cdot H_2O$.

The hydrogen ion exchanged form was mixed at a ratio of 4 $gL^{-1}$ with an aqueous solution of tetrabutylammonium hydroxide (manufactured by Wako Pure Chemical Industries, LTD, special grade) whose concentration was adjusted so that the ratio of $TBA^+/H^+$ became 1 and shaken for about 2 weeks using a shaker (180 rpm). As a result, $Ti_{0.87}O_2$ nanosheets having a nanosheet size of 300 nm to 500 nm are obtained.

Figure 7:
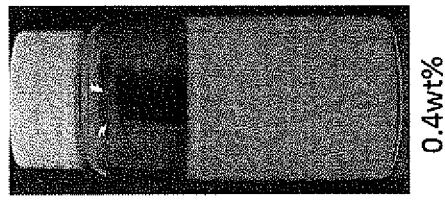
FIG. 7 shows the results of the observation of the organic solvent sol of Example 1.

Then the $Ti_{0.87}O_2$ nanosheets thus produced were employed to prepare an organic solvent sol (Step S110 in FIG. 1). 20 mL of the $Ti_{0.87}O_2$ nanosheet sol (water-based sol) having $Ti_{0.87}O_2$ nanosheets dispersed in water was centrifuged for 30 minutes at 30000 rpm to sediment the $Ti_{0.87}O_2$ nanosheets (Step S210 in FIG. 2). After removing the aqueous phase of the supernatant, 20 mL of dimethyl sulfoxide (DMSO) (manufactured by Wako Pure Chemical Industries, LTD, special grade) was added as an organic solvent to effect re-dispersion to prepare an organic solvent sol having the $Ti_{0.87}O_2$ nanosheets dispersed therein (Step S220 in FIG. 2). The results of the observation of the organic solvent sol are shown in FIG. 7. The centrifugation employed CP100MX ultracentrifuge manufactured by Hitachi Koki Co., Ltd.

The ultraviolet-visible (UV-Vis) absorption spectrometry was employed here to measure the organic solvent sol concentration. The UV-Vis measurement employed a spectrophotometer model U-4000/4100 manufactured by Hitachi, Ltd. Into a square quartz glass cell having an optical path length of 1 cm, each of $Ti_{0.87}O_2$ nanosheet sol and the supernatant aqueous phase was placed and the absorbance was measured. From the difference between these absorbances, the concentration of the organic solvent sol prepared was 0.4% by weight.

The organic solvent sol thus prepared was dropped onto a substrate and a spin coater was employed to rotate the substrate thereby obtaining a nanosheet monolayer film as a thin film (Step S120 in FIG. 1). The substrates employed here were a quartz glass substrate and a silicon (Si) wafer (30 mmφ). The surfaces of these substrates were wiped with acetone to remove organic substances and the like. Then, each substrate was immersed for 30 minutes in a solution mixture (1:1 in v/v) of methanol (manufactured by Wako Pure Chemical Industries, LTD, special grade) and a concentrated hydrochloric acid (manufactured by Wako Pure Chemical Industries, LTD, special grade) and then washed with an ultra pure water (Ultra pure water device Milli-Q Element manufactured by Millipore Japan Corporation). Thereafter, each substrate was immersed for 30 minutes in the concentrated hydrochloric acid, and washed with the ultra pure water. As a result, a hydrophilically treated substrate was obtained.

Each hydrophilically treated substrate was placed on the spin coater, and the organic solvent sol was dropped, and then after waiting until the organic solvent sol was spread to the edge of the substrate, the substrate was spun until a complete drying was achieved. The rotation speed of the spin coater here was 4500 rpm. The film forming time was 1 to 2 minutes. The spin coat employed a spin coater model MS-A200 manufactured by MIKASA CO., LTD. By aspirating the substrate using a diaphragm type dry vacuum pump DA-60S, the substrate was immobilized. Thus the nanosheet monolayer films were obtained on the quartz glass substrate and the silicon wafer.

Figure 8:
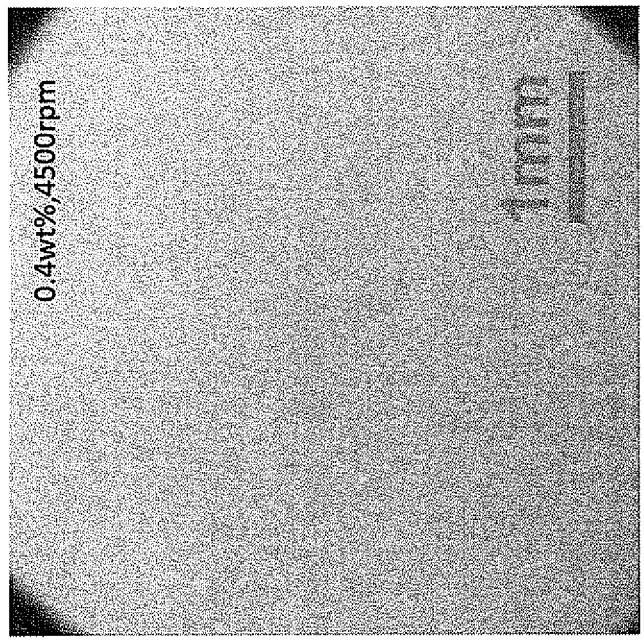
FIG. 8 shows the SEM image of the $Ti_{0.87}O_2$ nanosheet monolayer film of Example 1.

The nanosheet monolayer film on the Si wafer obtained in Example 1 was subjected to a surface observation using a scanning electron microscope (SEM). The SEM observation employed a scanning electron microscope model VE-8800 manufactured by KEYENCE CORPORATION. The Si wafer having the nanosheet monolayer film formed thereon was fixed on the sample stage using a Carbon Tape, and observed at an acceleration voltage of 1 kV. The results of the observation are shown in FIG. 8.

Figure 9:
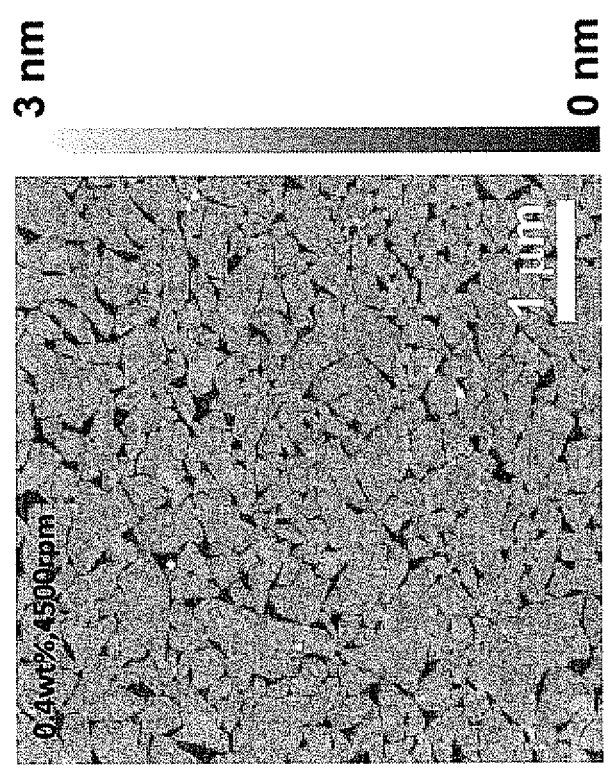
FIG. 9 shows the AFM image of the $Ti_{0.87}O_2$ nanosheet monolayer film of Example 1.

The nanosheet monolayer film on the Si wafer obtained in Example 1 was subjected to a surface observation using an atomic force microscope (AFM). The AFM observation employed a scanning probe microscope system model SPI-3800N/SPA-400 manufactured by SII Nano Technology Inc. Scanners of 2 types having maximum scanning ranges in the XY direction of 20 μm(SPA 400-PZA FS20A) and 150 μm(SPA 400-PZA FS150N) were employed. The probe employed was a silicon cantilever (spring constant k=20 Nm$^{-1}$) and the observation was made in a tapping mode. The results of the observation are shown in FIG. 9.

Figure 11:
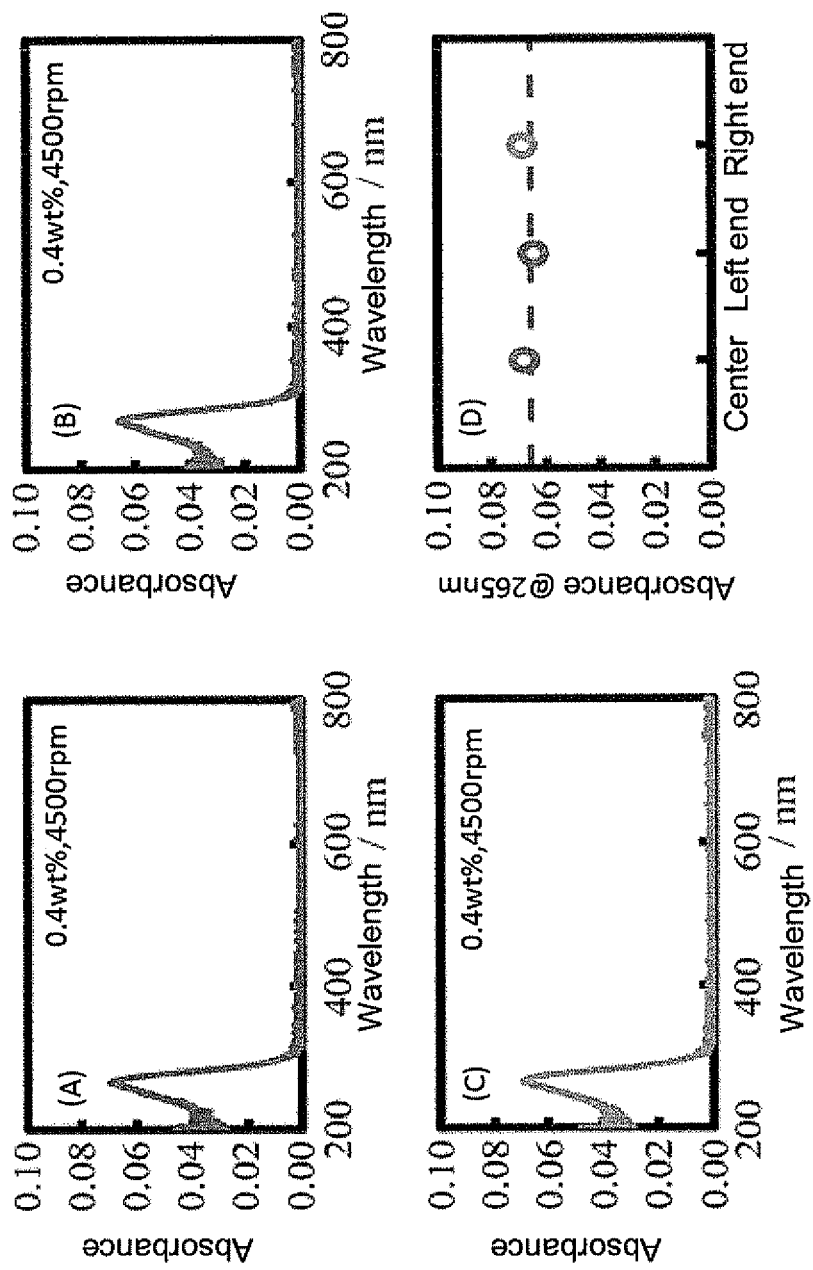
FIG. 11 shows the absorption spectrum of the $Ti_{0.87}O_2$ nanosheet monolayer film of Example 1.
Figure 14:
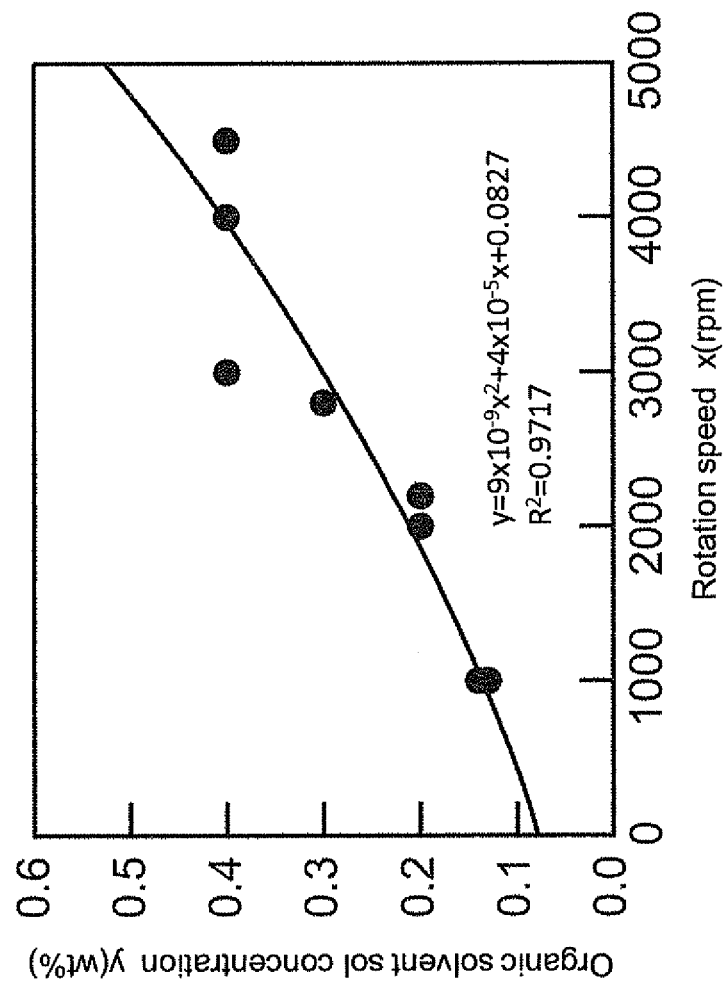
FIG. 14 shows the relationship between the spin coater rotation speed and the organic solvent sol concentration in Example 1 to Example 8.

The nanosheet monolayer film on the quartz glass substrate obtained in Example 1 was subjected to measurement of UV-Vis absorption spectrum using the aforementioned spectrophotometer. The sample was placed in such a manner that the incidence came at right angles into the quartz glass substrate. The measurement range is a rectangle of 5×8 mm, and three positions of the sample, namely, the center and the right and left, were measured. The results are shown in FIG. 11. Based on the absorbance obtained in FIG. 11, the relationship between the spin coater rotation speed and the organic solvent sol concentration was investigated. The results are shown in FIG. 14.

Figure 15:
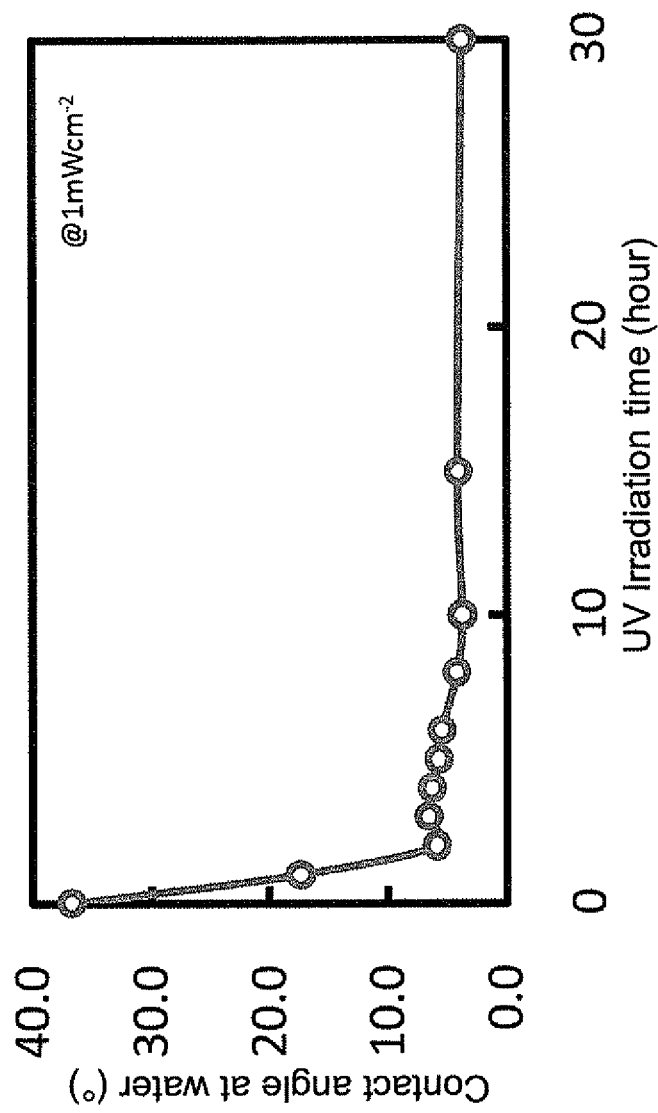
FIG. 15 shows the light-induced hydrophilization property of the $Ti_{0.87}O_2$ nanosheet monolayer film of Example 1.

The nanosheet monolayer film on the Si wafer obtained in Example 1 was evaluated for the light-induced hydrophilization property by the UV irradiation. First, the nanosheet monolayer film on the Si wafer was irradiated with UV (1 mWcm$^{-2}$) for 24 hours to remove the organic substance (TBA$^+$ and the like) on the surface utilizing the light catalyst effect of the nanosheet ($Ti_{0.87}O_2$). Then, it was stored in a dark place for 1 month, and after the contact angle at water became constant (about 40°), the UV (1 mWcm$^{-2}$) was irradiated and the dependency of the contact angle at water on the UV irradiation time period was investigated again. The results are shown in FIG. 15. The contact angle measurement employed a contact angle meter model CA-XP manufactured by Kyowa Interface Science Co., Ltd. The measurement was conducted at 5 points on the sample, and the mean value was regarded as the contact angle.

On the nanosheet monolayer film on the Si wafer obtained in Example 1, $SrTiO_3$(STO) crystal thin film as an oxide was grown as being oriented by a pulse laser deposition (PLD) method. Specifically, the laser employed was KrF excimer laser (wavelength 248 nm, Compex102) and the target employed was the single crystal of $SrTiO_3$(100) surface. The laser was introduced into the chamber through a quartz glass window placed in the vacuum chamber. The growing condition is shown below.

Figure 45:
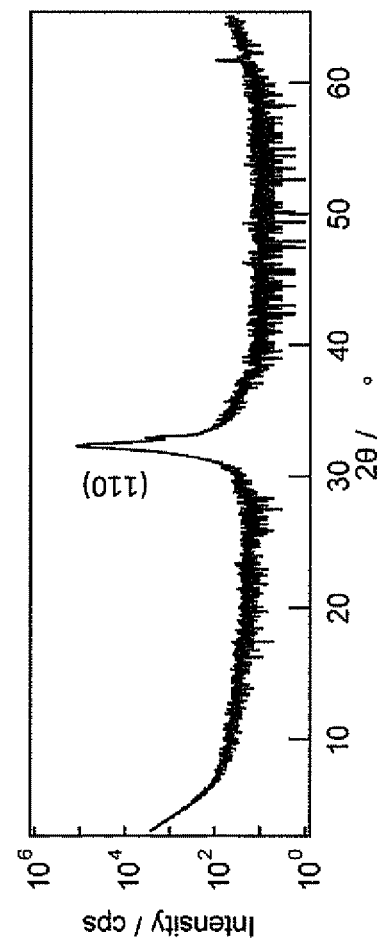
FIG. 45 shows the XRD pattern of SrTiO$_3$ thin film on the $Ti_{0.87}O_2$ nanosheet monolayer film of Example 1.

Laser intensity: about 3 J/cm$^2$
Distance between target and substrate: 50 mm
Partial oxygen pressure: 0.12 Pa
Substrate temperature: 550° C.
Film forming time period: 60 minutes
The STO thin film thus obtained was subjected to an XRD measurement.
The results are shown in FIG. 45.

Examples 2 TO 8 and Comparatives 1 to 23

In Examples 2 to 8 and Comparatives 1 to 23, a monolayer film (nanosheet monolayer film) whose inorganic layered compound is a layered titanium oxide and which consists of nanosheets (a nanosheet size: 300 nm to 500 nm) exfoliated from the layered titanium oxide as a thin film was produced similarly to Example 1, except that the organic solvent sol concentration and the rotation speed were changed.

Figure 10:
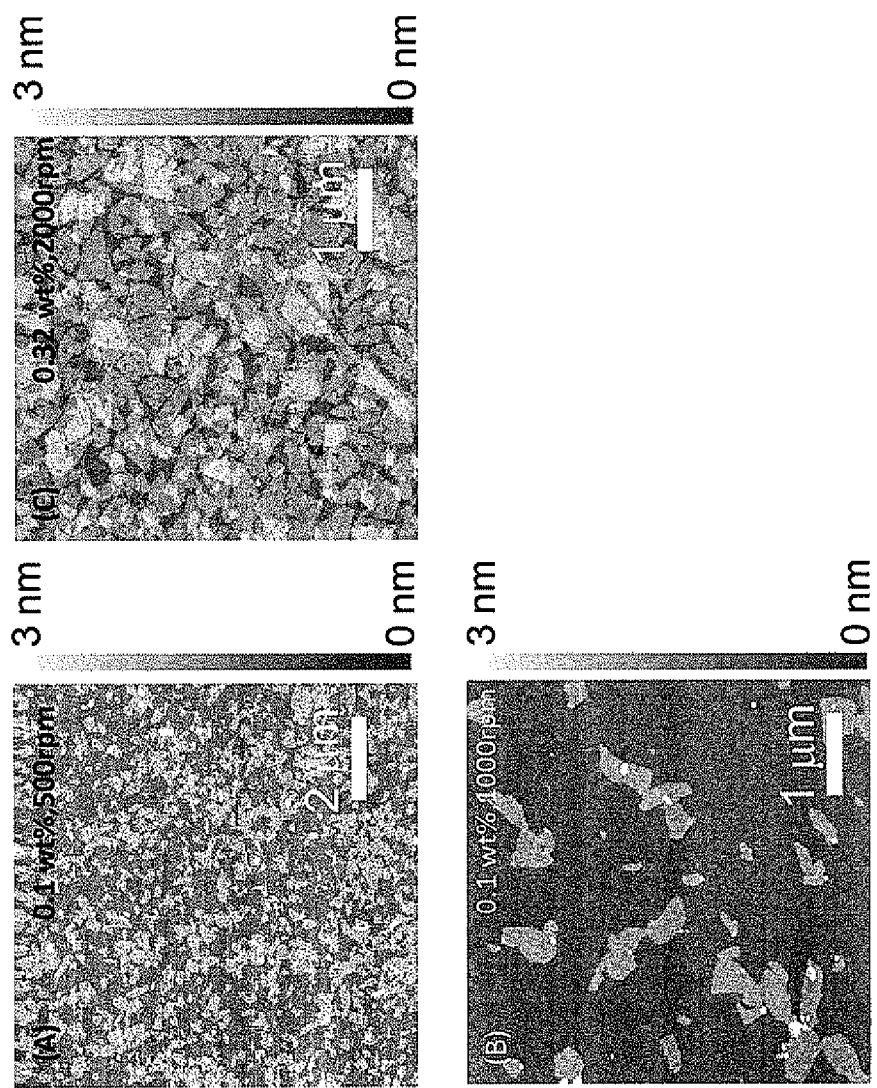
FIG. 10 shows the AFM images of the $Ti_{0.87}O_2$ nanosheet monolayer films of Comparative 1 (A), Comparative 2 (B) and Comparative 18 (C).
Figure 12:
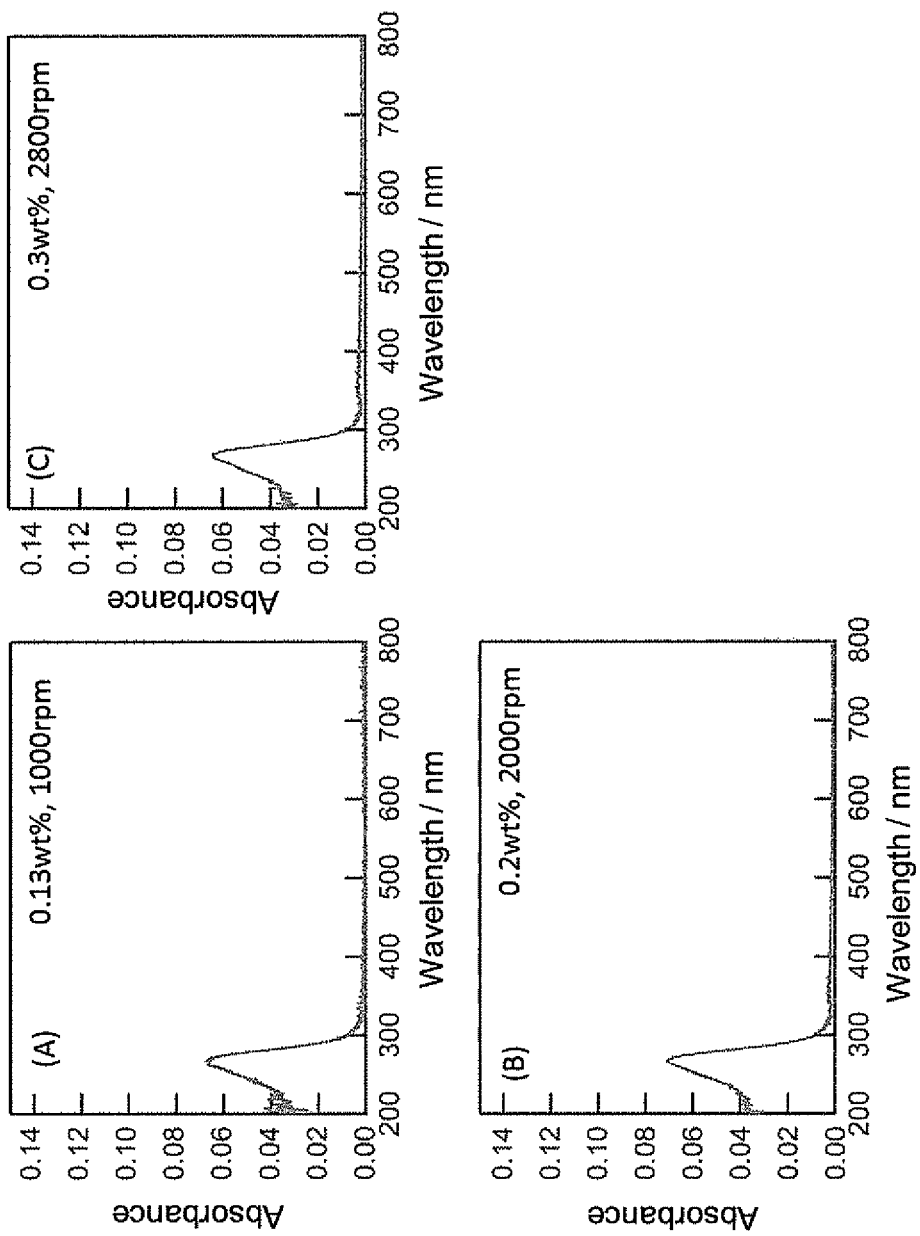
FIG. 12 shows the absorption spectra of the $Ti_{0.87}O_2$ nanosheet monolayer films of Example 2 (A), Example 4 (B) and Example 6 (C).
Figure 13:
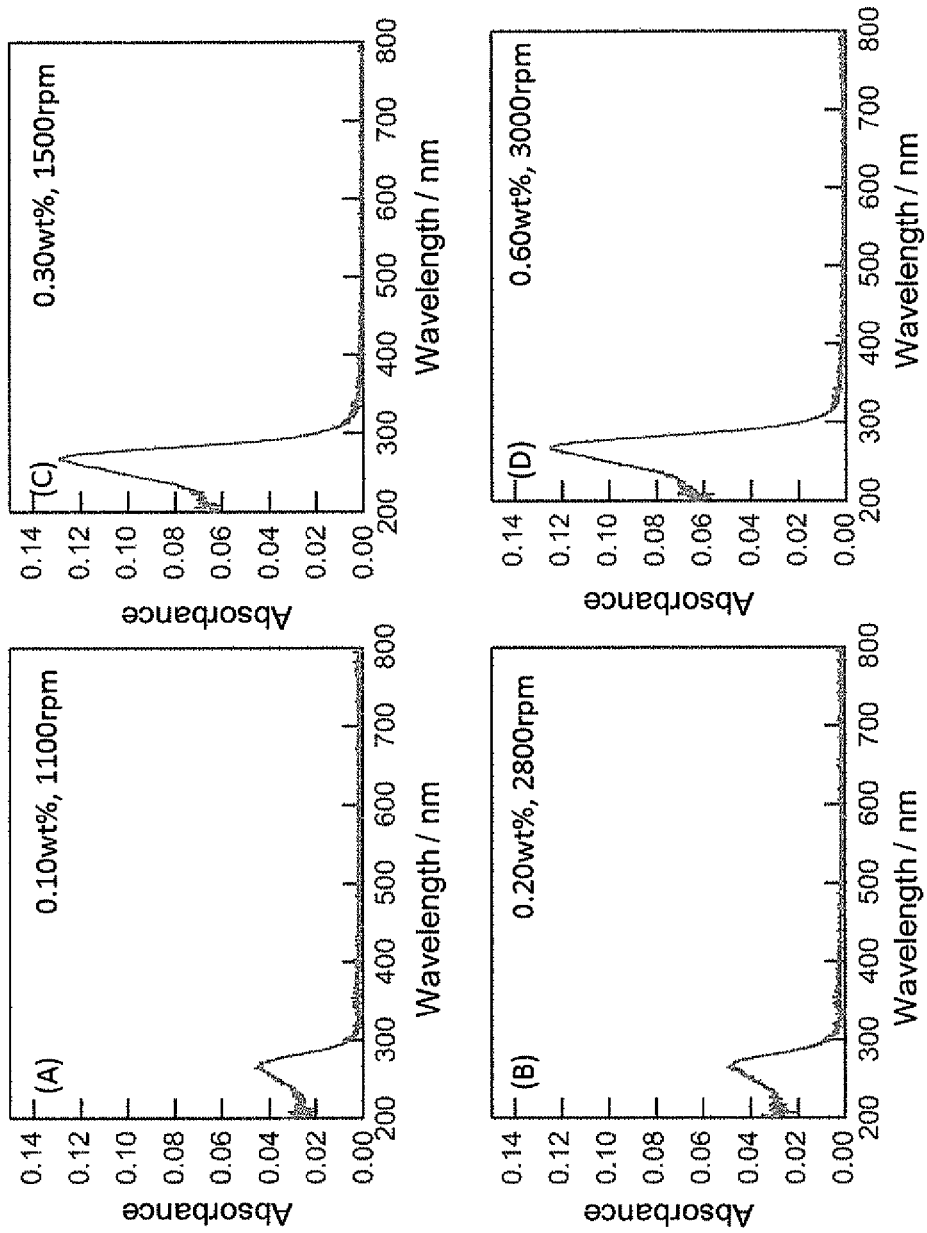
FIG. 13 shows the absorption spectra of the $Ti_{0.87}O_2$ nanosheet monolayer films of Comparative 3 (A), Comparative 10 (B), Comparative 13 (C) and Comparative 23 (D).

The resultant nanosheet monolayer film was subjected similarly to Example 1 to the AFM observation and the absorption spectrometry. The results of the AFM observation of Comparative 1, Comparative 2 and Comparative 18 are shown in FIG. 10. The absorption spectra of Example 2, Example 4 and Example 6 are shown in FIG. 12. The absorption spectra of Comparative 3, Comparative 10, Comparative 13 and Comparative 23 are shown in FIG. 13. Based on the measured absorbance, the relationship between the spin coater rotation speed and the organic solvent sol concentration in Examples 2 to 8 was investigated. The results are shown in FIG. 14.

For simplification, the organic solvent sol concentration, the rotation speed and the absorbance in Examples 1 to 8 and Comparatives 1 to 23 are shown in Table 2.

TABLE 2

Table 2: Listing of experimental conditions of titania (size: 300 nm to 500 nm) and absorbance in Examples 1 to 8 and Comparative 1 to 23

| Example/Comparative | Organic solvent sol concentration (% by wt) | Rotation speed (rpm) | Absorbance |
|---|---|---|---|
| Comparative 1 | 0.100 | 500 | — |
| Comparative 2 | 0.100 | 1000 | — |
| Comparative 3 | 0.100 | 1100 | 0.044 |
| Comparative 4 | 0.100 | 2000 | 0.013 |
| Example 2 | 0.130 | 1000 | 0.066 |
| Comparative 5 | 0.130 | 2000 | 0.020 |
| Example 3 | 0.140 | 1000 | 0.072 |
| Comparative 6 | 0.150 | 2000 | 0.043 |
| Comparative 7 | 0.200 | 1000 | 0.139 |
| Example 4 | 0.200 | 2000 | 0.069 |
| Example 5 | 0.200 | 2200 | 0.070 |
| Comparative 8 | 0.200 | 2600 | 0.048 |
| Comparative 9 | 0.200 | 2700 | 0.047 |
| Comparative 10 | 0.200 | 2800 | 0.052 |
| Comparative 11 | 0.200 | 2900 | 0.047 |
| Comparative 12 | 0.300 | 1000 | 0.186 |
| Comparative 13 | 0.300 | 1500 | 0.126 |
| Comparative 14 | 0.300 | 2000 | 0.101 |
| Comparative 15 | 0.300 | 2500 | 0.093 |
| Example 6 | 0.300 | 2800 | 0.070 |
| Comparative 16 | 0.300 | 3000 | 0.064 |
| Comparative 17 | 0.300 | 4000 | 0.042 |
| Comparative 18 | 0.320 | 2000 | — |
| Comparative 19 | 0.400 | 1000 | 0.245 |
| Comparative 20 | 0.400 | 2000 | 0.137 |
| Example 7 | 0.400 | 3000 | 0.075 |
| Example 8 | 0.400 | 4000 | 0.072 |
| Example 1 | 0.400 | 4500 | 0.067 |
| Comparative 21 | 0.600 | 1000 | 0.380 |
| Comparative 22 | 0.600 | 2000 | 0.236 |
| Comparative 23 | 0.600 | 3000 | 0.125 |

Example 9

In Example 9, a monolayer film (nanosheet monolayer film) whose inorganic layered compound is a layered titanium oxide and which consists of nanosheets (a nanosheet size: 2 μm to 20 μm) exfoliated from the layered titanium oxide as a thin film was produced.

Figure 16:
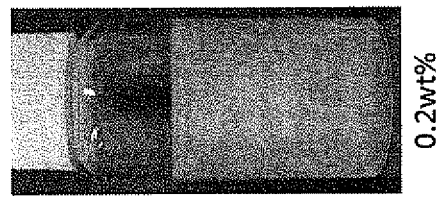
FIG. 16 shows the results of the observation of the organic solvent sol of Example 9.

The hydrogen ion exchanged form $H_{1.07}Ti_{1.73}O_4 \cdot H_2O$ was mixed at a ratio of 4 gL$^{-1}$ with an aqueous solution of tetrabutylammonium hydroxide (manufactured by Wako Pure Chemical Industries, LTD, special grade) whose concentration was adjusted so that the ratio of TBA$^+$/H$^+$ became 1 and shaken gently several times a day for 45 days to obtain an organic solvent sol (concentration of 0.2% by weight) having $Ti_{0.87}O_2$ nanosheets having a nanosheet size of 2 μm to 20 μm, which was then used similarly to Example 1 except for using a spin coater rotation speed of 2850 rpm and a film forming time of 2 to 3 minutes to produce a monolayer film as a thin film consisting of $Ti_{0.87}O_2$ nanosheets on each of the quartz glass substrate and the Si wafer. The prepared organic solvent sol was observed. The results of the observation are shown in FIG. 16.

Figure 17:
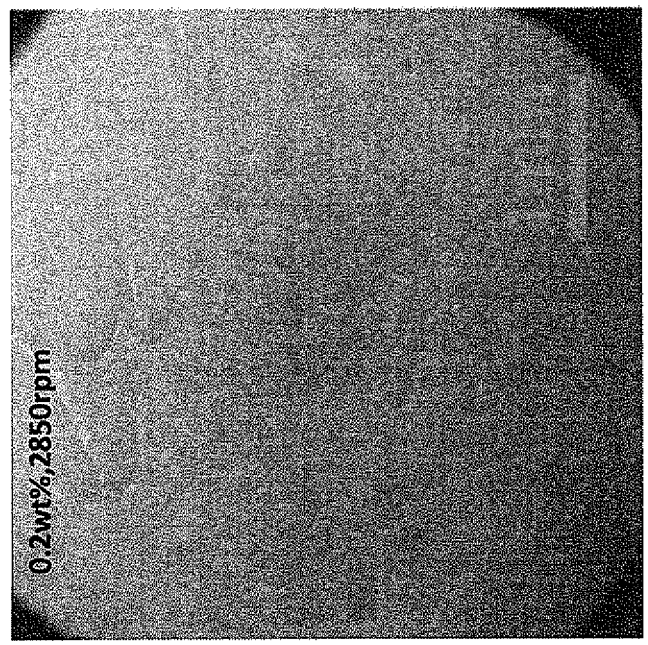
FIG. 17 shows the SEM image of the $Ti_{0.87}O_2$ nanosheet monolayer film of Example 9.
Figure 18:
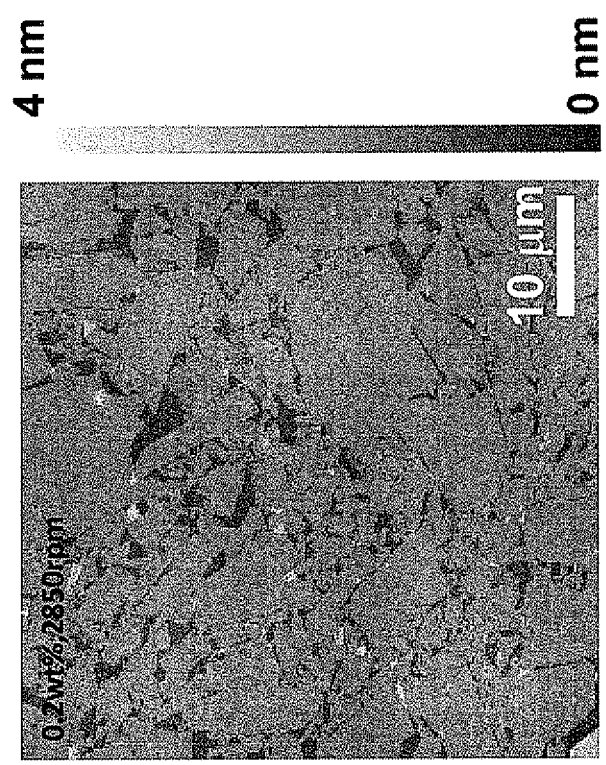
FIG. 18 shows the AFM image of the $Ti_{0.87}O_2$ nanosheet monolayer film of Example 9.
Figure 20:
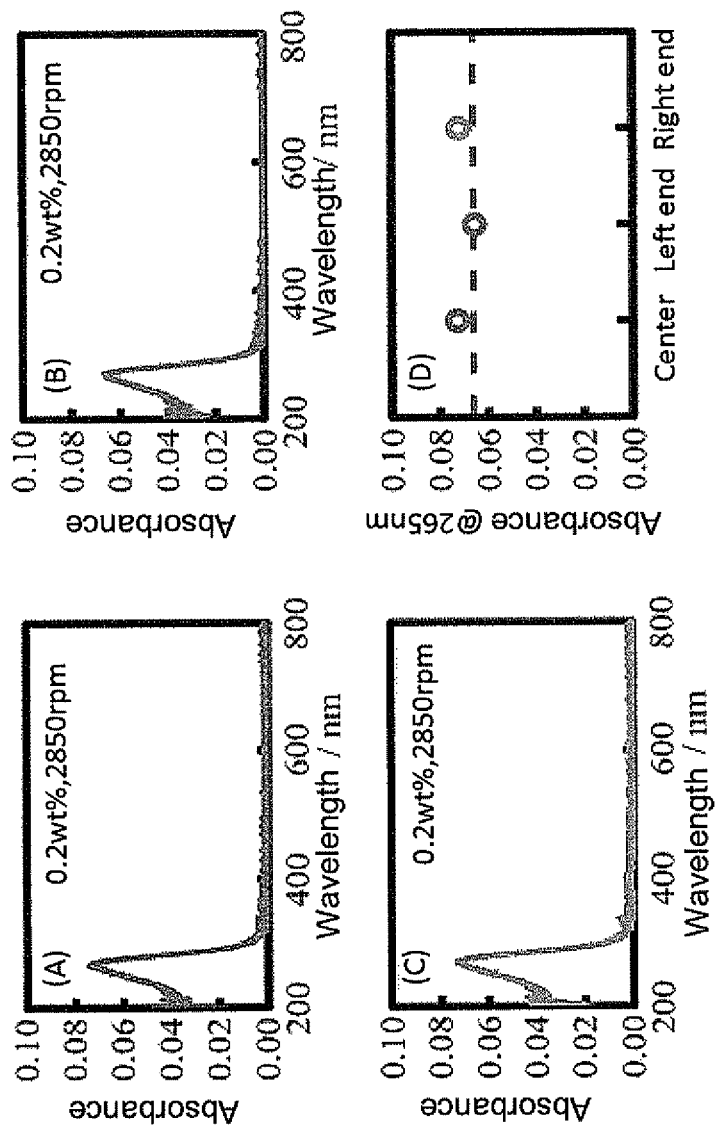
FIG. 20 shows the absorption spectrum of the $Ti_{0.87}O_2$ nanosheet monolayer film of Example 9.
Figure 23:
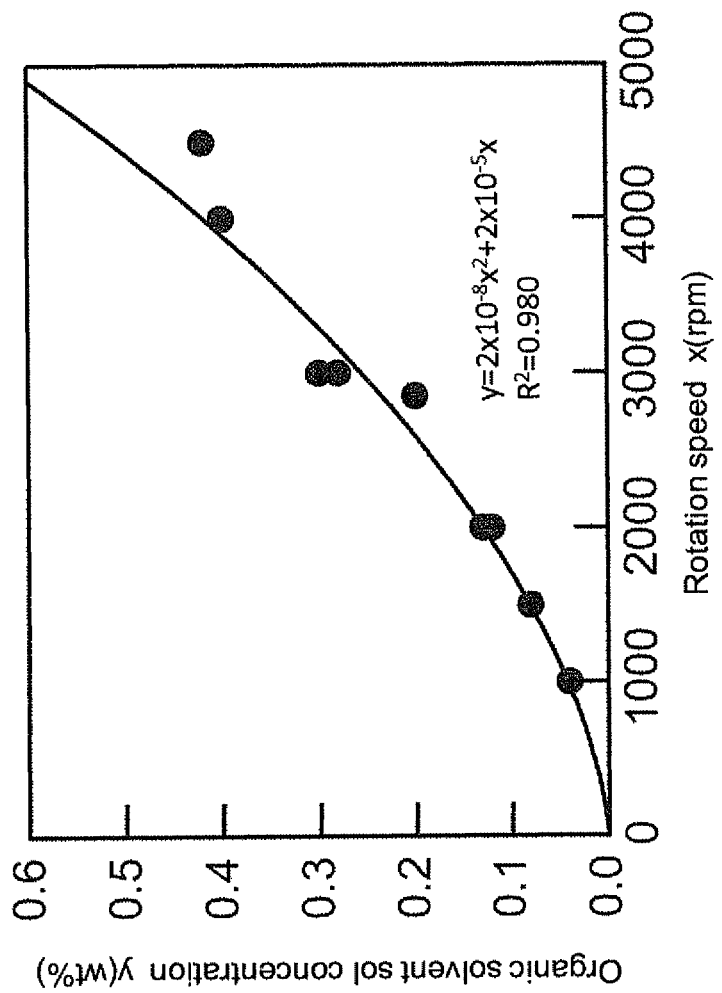
FIG. 23 shows the relationship between the spin coater rotation speed and the organic solvent sol concentration in Example 9 to Example 17.

Similarly to Example 1, the nanosheet monolayer film on the Si wafer was subjected to the SEM observation and the AFM observation. The results of the observation are shown in FIG. 17 and FIG. 18, respectively. The nanosheet monolayer film on the quartz glass substrate was subjected to the measurement of the absorption spectrum. The results of the measurement are shown in FIG. 20. Using the absorbance obtained from the absorption spectrum, the relationship between the spin coater rotation speed and the organic solvent sol concentration was investigated. The results are shown in FIG. 23.

Figure 46:
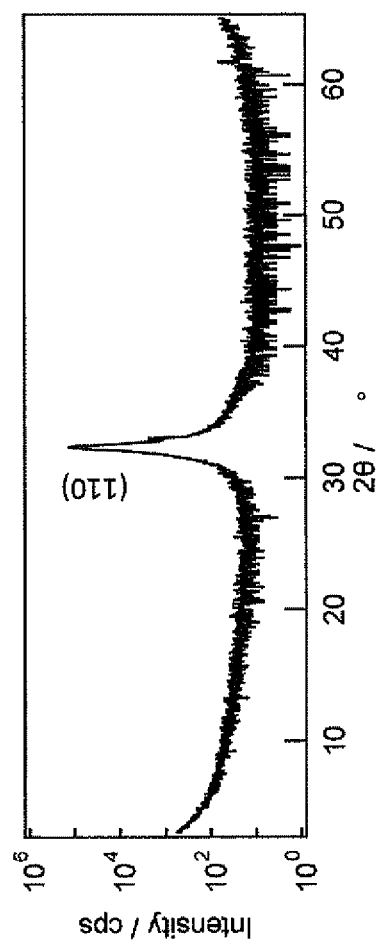
FIG. 46 shows the XRD pattern of SrTiO$_3$ thin film on the $Ti_{0.87}O_2$ nanosheet monolayer film of Example 9.

Similarly to Example 1, $SrTiO_3$(STO) crystal thin film as an oxide was grown as being oriented by a pulse laser deposition (PLD) method on the nanosheet monolayer film on the Si wafer. The resultant STO thin film was subjected to an XRD measurement. The results are shown in FIG. 46.

Examples 10 TO 17 and Comparatives 24 to 46

In Examples 10 to 17 and Comparatives 24 to 46, a monolayer film (nanosheet monolayer film) whose inorganic layered compound is a layered titanium oxide and which consists of nanosheets (a nanosheet size: 2 μm to 20 μm) exfoliated from the layered titanium oxide as a thin film was produced similarly to Example 9, except that the organic solvent sol concentration and the rotation speed were changed.

Figure 19:
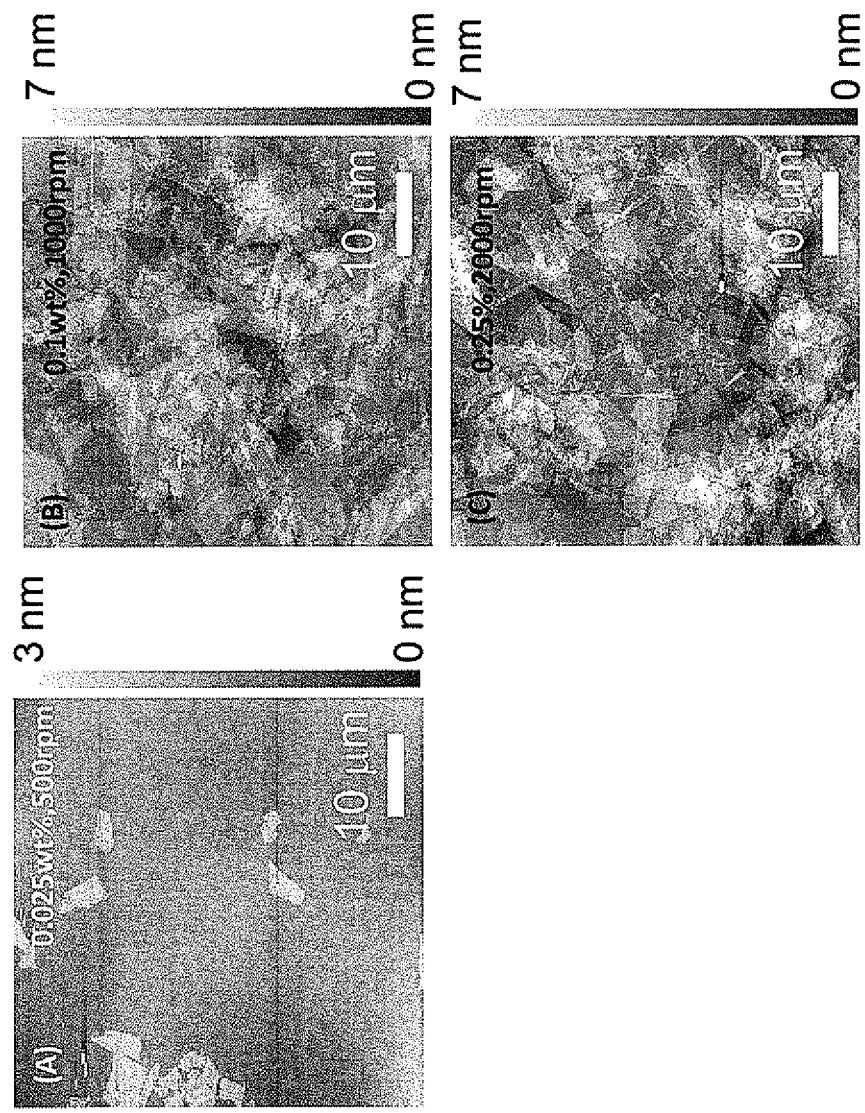
FIG. 19 shows the AFM images of the $Ti_{0.87}O_2$ nanosheet monolayer films of Comparative 24 (A), Comparative 27 (B) and Comparative 34 (C).
Figure 21:
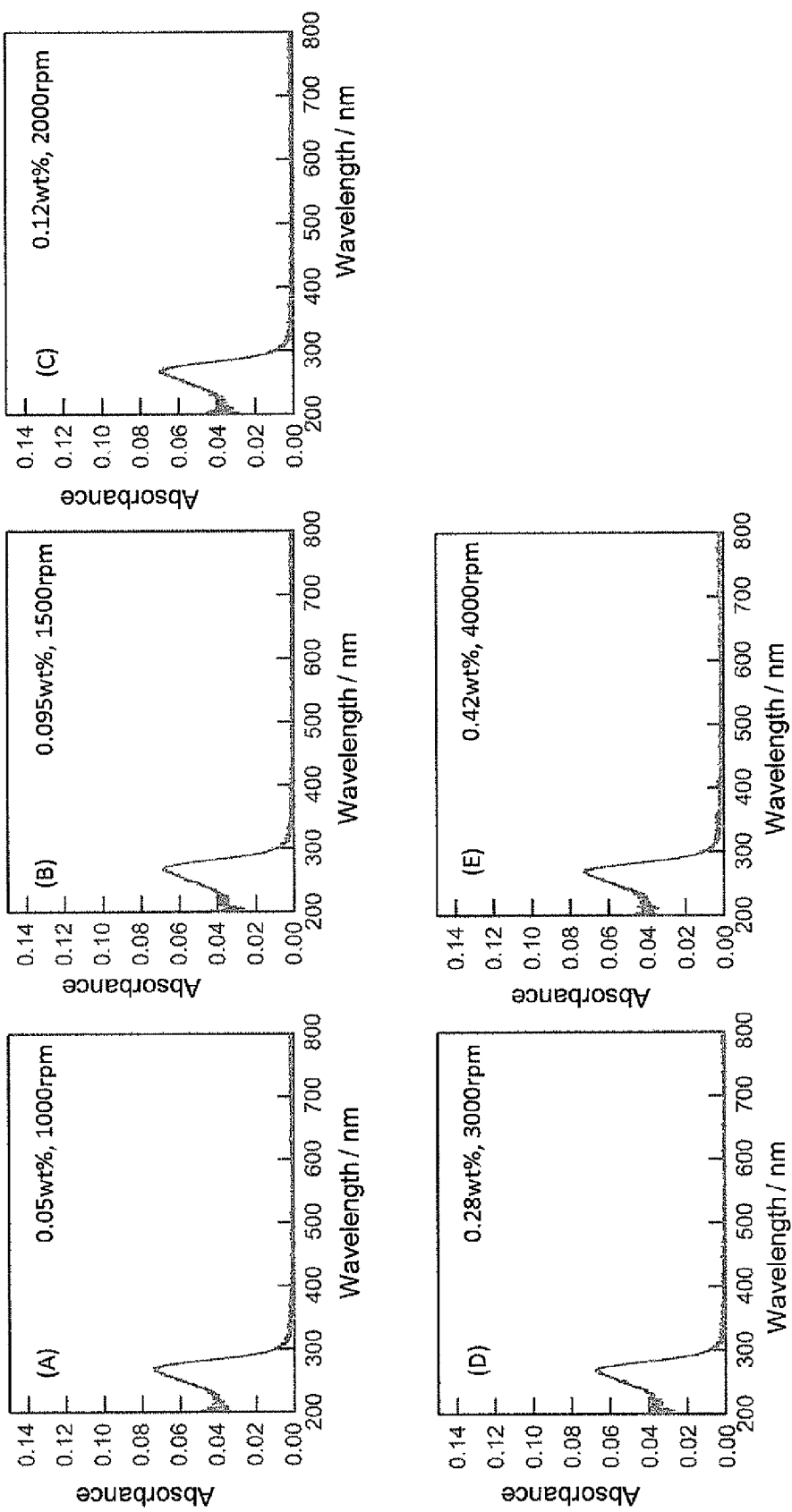
FIG. 21 shows the absorption spectra of the $Ti_{0.87}O_2$ nanosheet monolayer films of Examples 10 to 12 (A) to (C), Example 14 (D) and Example 16 (E).
Figure 22:
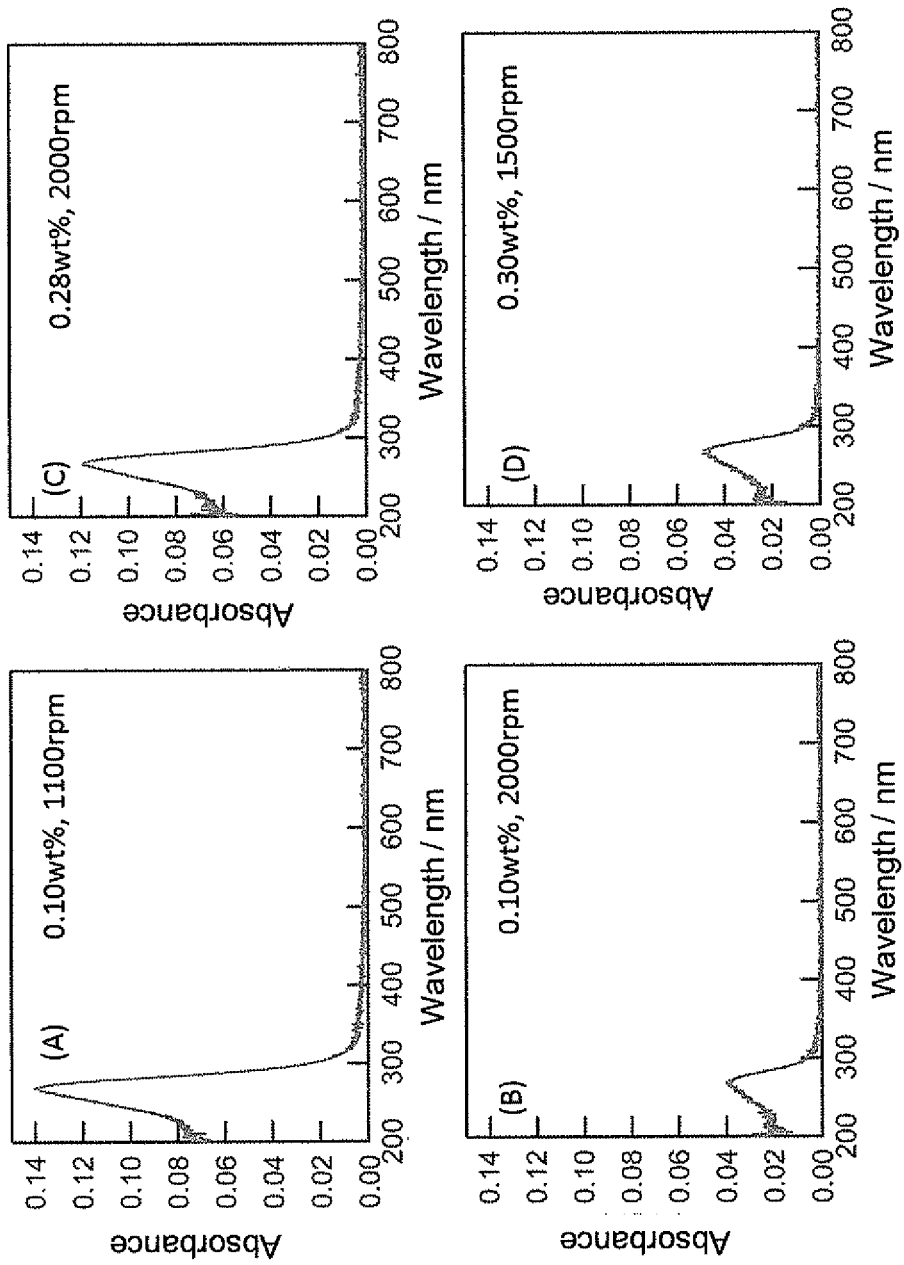
FIG. 22 shows the absorption spectra of the $Ti_{0.87}O_2$ nanosheet monolayer films of Comparative 28 (A), Comparative 29 (B), Comparative 37 (C) and Comparative 38 (D).

The resultant nanosheet monolayer film was subjected similarly to Example 1 to the AFM observation and the absorption spectrometry. The results of the AFM observation of Comparative 24, Comparative 27 and Comparative 34 are shown in FIG. 19. The absorption spectra of Example 10, Example 11, Example 12, Example 14 and Example 16 are shown in FIG. 21. The absorption spectra of Comparative 28, Comparative 29, Comparative 37 and Comparative 38 are shown in FIG. 22. Based on the measured absorbance, the relationship between the spin coater rotation speed and the organic solvent sol concentration in Examples 10 to 17 was investigated. The results are shown in FIG. 23.

For simplification, the organic solvent sol concentration, the rotation speed and the absorbance in Examples 9 to 17 and Comparatives 24 to 46 are shown in Table 3.

TABLE 3

Table 3: Listing of experimental conditions of titania (size: 2 μm to 20 μm) and absorbance in Examples 9 to 17 and Comparatives 24 to 46

| Example/Comparative | Organic solvent sol concentration (% by wt) | Rotation speed (rpm) | Absorbance |
|---|---|---|---|
| Comparative 24 | 0.025 | 500 | — |
| Example 10 | 0.050 | 1000 | 0.074 |
| Comparative 25 | 0.075 | 1000 | 0.100 |
| Comparative 26 | 0.075 | 1400 | 0.044 |
| Example 11 | 0.095 | 1500 | 0.071 |
| Comparative 27 | 0.100 | 1000 | — |
| Comparative 28 | 0.100 | 1100 | 0.136 |
| Comparative 29 | 0.100 | 2000 | 0.038 |
| Comparative 30 | 0.120 | 1000 | 0.137 |
| Example 12 | 0.120 | 2000 | 0.068 |
| Example 13 | 0.130 | 2000 | 0.073 |
| Example 9 | 0.200 | 2850 | 0.069 |
| Comparative 31 | 0.200 | 3000 | 0.049 |
| Comparative 32 | 0.200 | 4600 | 0.026 |
| Comparative 33 | 0.220 | 3000 | 0.035 |
| Comparative 34 | 0.250 | 2000 | — |
| Comparative 35 | 0.250 | 3000 | 0.044 |
| Comparative 36 | 0.280 | 1000 | 0.258 |
| Comparative 37 | 0.280 | 2000 | 0.117 |
| Example 14 | 0.280 | 3000 | 0.065 |
| Comparative 38 | 0.300 | 1500 | 0.049 |
| Example 15 | 0.300 | 3000 | 0.071 |
| Comparative 39 | 0.300 | 4000 | 0.029 |
| Example 16 | 0.420 | 4000 | 0.071 |
| Comparative 40 | 0.420 | 1000 | 0.379 |
| Comparative 41 | 0.420 | 2000 | 0.204 |
| Comparative 42 | 0.420 | 3000 | 0.151 |
| Example 17 | 0.420 | 4500 | 0.071 |
| Comparative 43 | 0.600 | 1000 | 0.545 |
| Comparative 44 | 0.600 | 2000 | 0.343 |
| Comparative 45 | 0.600 | 3000 | 0.262 |
| Comparative 46 | 0.600 | 4500 | 0.190 |

Example 18

In Example 18, a monolayer film (nanosheet monolayer film) whose inorganic layered compound is a layered perovskite oxide which is $M1Ca_2Nb_3O_{10}$ (in which M1 is K as at least one alkaline metal element. Hereinafter designated as $KCa_2Nb_3O_{10}$) and which consists of nanosheets (a nanosheet size: 2 μm to 10 μm) exfoliated from $KCa_2Nb_3O_{10}$ as a thin film was produced.

Prior to the production of the nanosheet monolayer film, the synthesis of $KCa_2Nb_3O_{10}$ as a layered perovskite oxide and the production of the nanosheet exfoliated therefrom were conducted. $KCa_2Nb_3O_{10}$ was synthesized by a solid phase method.

Specifically, the starting powders of $K_2CO_3$ (manufactured by Rare Metallic Co., Ltd, purity: 99.99%), $CaCO_3$ (manufactured by Rare Metallic Co., Ltd, purity: 99.99%) and $Nb_2O_5$ (manufactured by Rare Metallic Co., Ltd, purity: 99.99%) were weighed based on a stoichiometric ratio of $K_2CO_3:CaCO_3:Nb_2O_5=1:4:3$. The weighed starting powders were pulverized and mixed for 60 minutes using an alumina mortar. Since $K_2CO_3$ which was an alkaline metal carbonate is partly evaporated upon sintering, it was added in an amount in excess by 10% by mole. The pulverized and mixed starting powders were placed in a platinum crucible and sintered preliminarily in an electric furnace for 1 hour at 900° C. Thereafter, the temperature was elevated over 3 hours from 900° C. to 1200° C., and after sintering at 1200° C. for 12 hours, the platinum crucible was taken out of the electric furnace. As a result, $KCa_2Nb_3O_{10}$ was synthesized as a layered perovskite oxide.

Next, the layered perovskite oxide was exfoliated to obtain nanosheets having a nanosheet size of 2 μm to 10 μm. Specifically, the resultant layered perovskite oxide (5 g) and an aqueous solution of nitric acid (200 mL) were stirred in a beaker and allowed to react for 72 hours. After completion of the reaction, the product is filtered using an ultra pure water, and dried in air to recover the hydrogen ion exchanged form $HCa_2Nb_3O_{10} \cdot 1.5H_2O$.

0.4 Gram of the hydrogen ion exchanged form and 100 mL of the aqueous solution diluted from tetrabutylammonium hydroxide (TBAOHaq 10%) (manufactured by Wako Pure Chemical Industries, LTD, special grade) were reacted to exfoliate the hydrogen ion exchanged form. Specifically, the molar ratio of $TBA^+$ in TBAOHaq. and the $H^+$ of the hydrogen ion exchanged form was adjusted to 2:1. To a 200 mL conical flask, 96.2 mL of the ultra pure water was added, followed by 3.8 mL of TBAOHaq. to obtain 100 mL in total of a solution. To this solution, 0.4 g of the hydrogen ion exchanged form was added and shaken gently several time a day for 45 days. As a result, $Ca_2Nb_3O_{10}$ nanosheets having a nanosheet of 2 μm to 10 μm are obtained.

Then the $Ca_2Nb_3O_{10}$ nanosheets thus produced were employed to prepare an organic solvent sol (Step S110 in FIG. 1). 30 mL of the $Ca_2Nb_3O_{10}$ nanosheet sol (water-based sol) having $Ca_2Nb_3O_{10}$ nanosheets dispersed in water was centrifuged for 30 minutes at 15000 rpm to sediment the $Ca_2Nb_3O_{10}$ nanosheets (Step S210 in FIG. 2). Subsequently the aqueous phase of the supernatant was removed, and then 20 mL of dimethyl sulfoxide (DMSO) (manufactured by Wako Pure Chemical Industries, LTD, special grade) was added as an organic solvent to effect re-dispersion, and then centrifuged for 30 minutes at 15000 rpm to re-sediment the $Ca_2Nb_3O_{10}$ nanosheets. This process was repeated 2 times. The DMSO phase in the supernatant was removed, and 5 ml of the DMSO phase was added to obtain an organic solvent sol having the $Ca_2Nb_3O_{10}$ nanosheets dispersed therein (Step S220 in FIG. 2).

Using the UV-Vis absorption spectrometry here similarly to Example 1, the organic solvent sol concentration was measured. The organic solvent sol concentration was 0.25% by weight.

The prepared organic solvent sol was dropped onto a substrate (amount dropped: 20 μL) and the spin coater was employed to spin the substrate to obtain a monolayer film as a thin film consisting of a nanosheet monolayer film (Step S120 in FIG. 1). Similarly to Example 1, washed and hydrophilically treated quartz glass substrate and silicon (Si) wafer (30 mmϕ) substrate were employed.

Each hydrophilically treated substrate was placed on the spin coater, and the organic solvent sol was dropped, and then after waiting until the organic solvent sol was spread to the edge of the substrate, the substrate was spun until a complete drying was achieved. The rotation speed of the spin coater here was 1000 rpm. Thus the monolayer films were obtained on the quartz glass substrate and the silicon wafer. The film forming time was 2 to 3 minutes.

Figure 24:
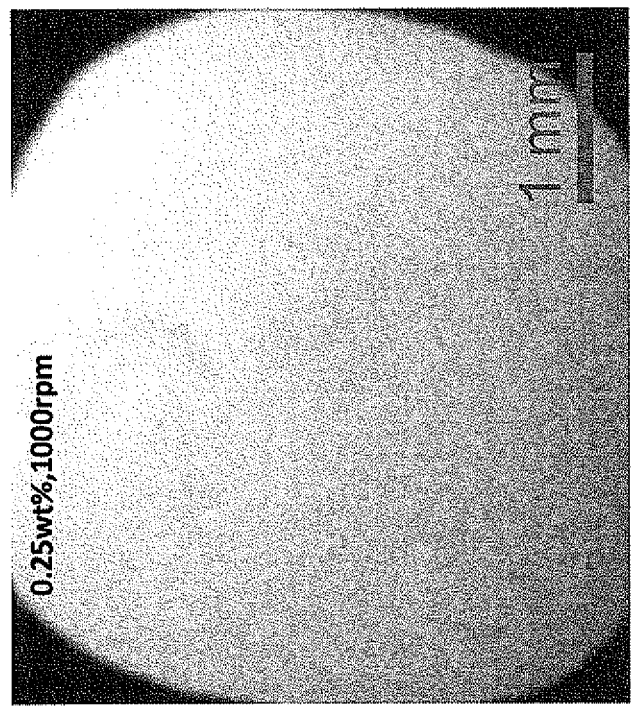
FIG. 24 shows the SEM image of the $Ca_2Nb_3O_{10}$ nanosheet monolayer film of Example 18.
Figure 25:
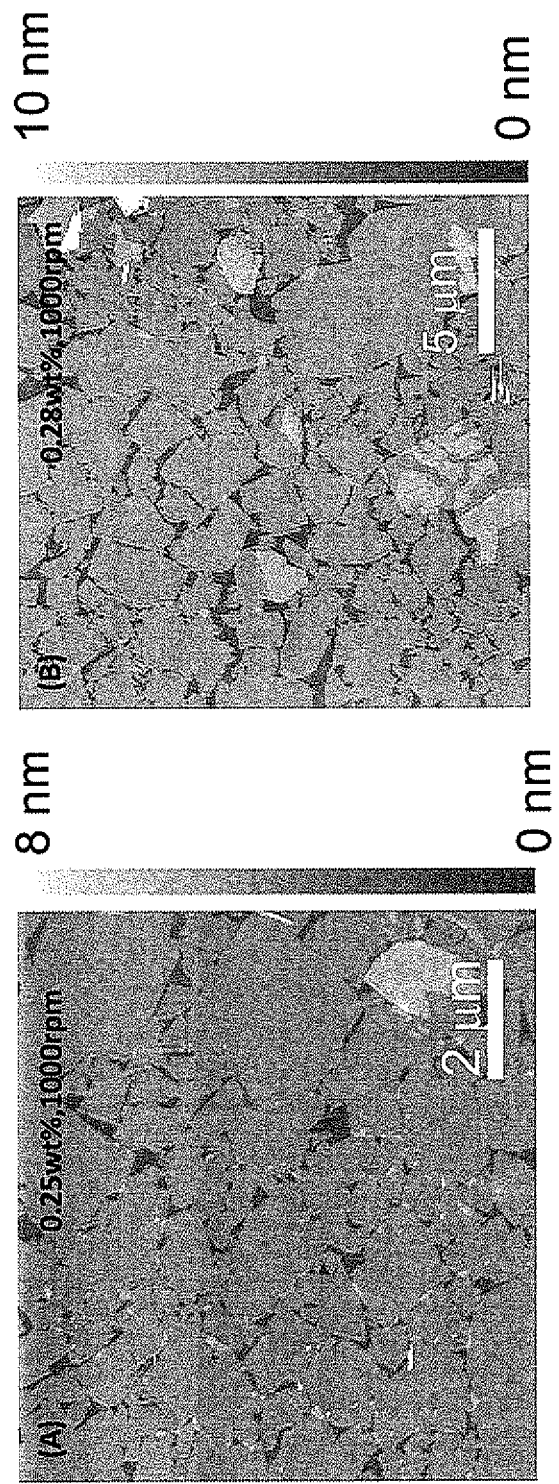
FIG. 25 shows the AFM images of the $Ca_2Nb_3O_{10}$ nanosheet monolayer films of Example 18 (A) and Example 19 (B).
Figure 27:
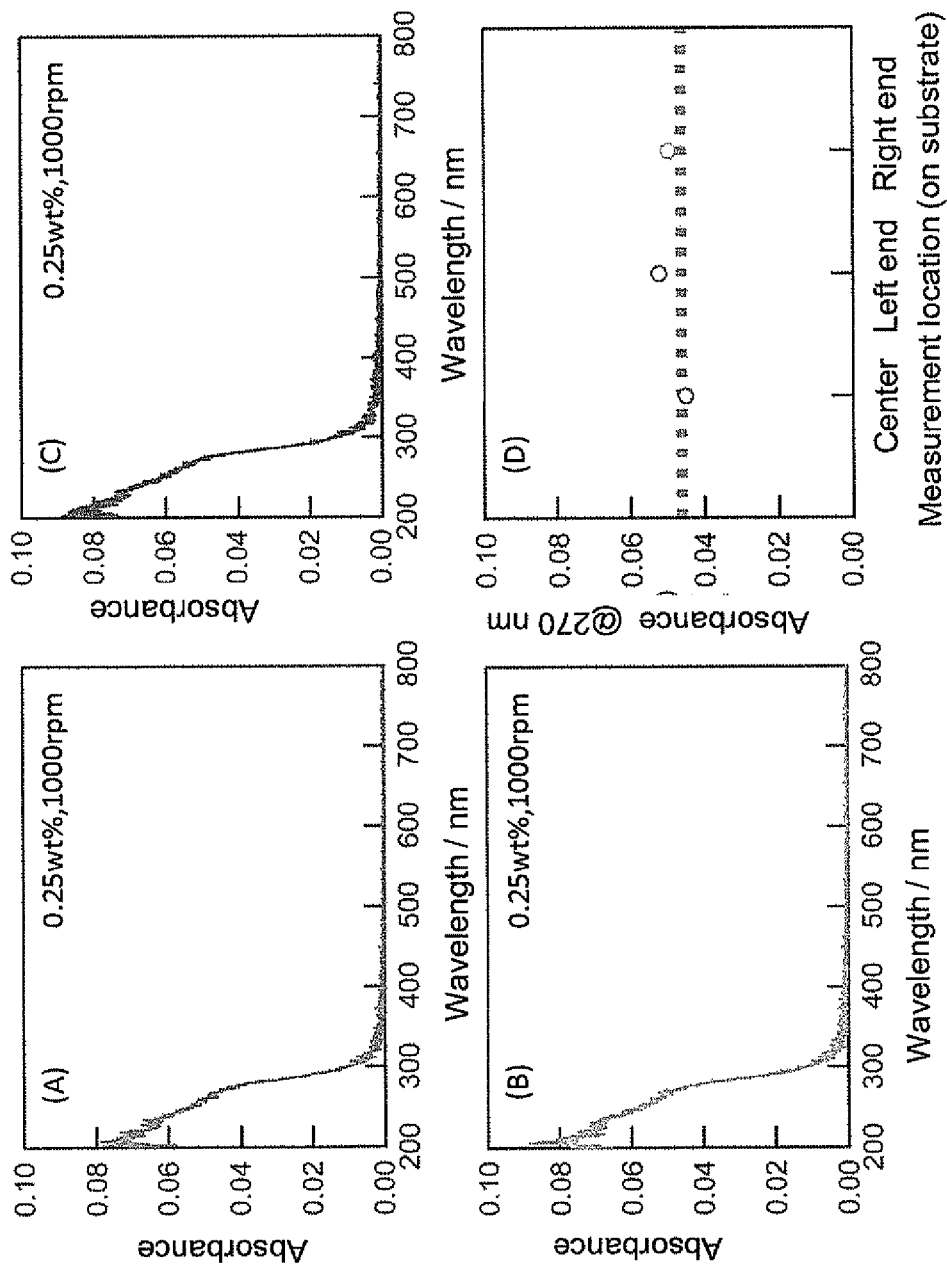
FIG. 27 shows the absorption spectrum of the $Ca_2Nb_3O_{10}$ nanosheet monolayer film of Example 18.
Figure 30:
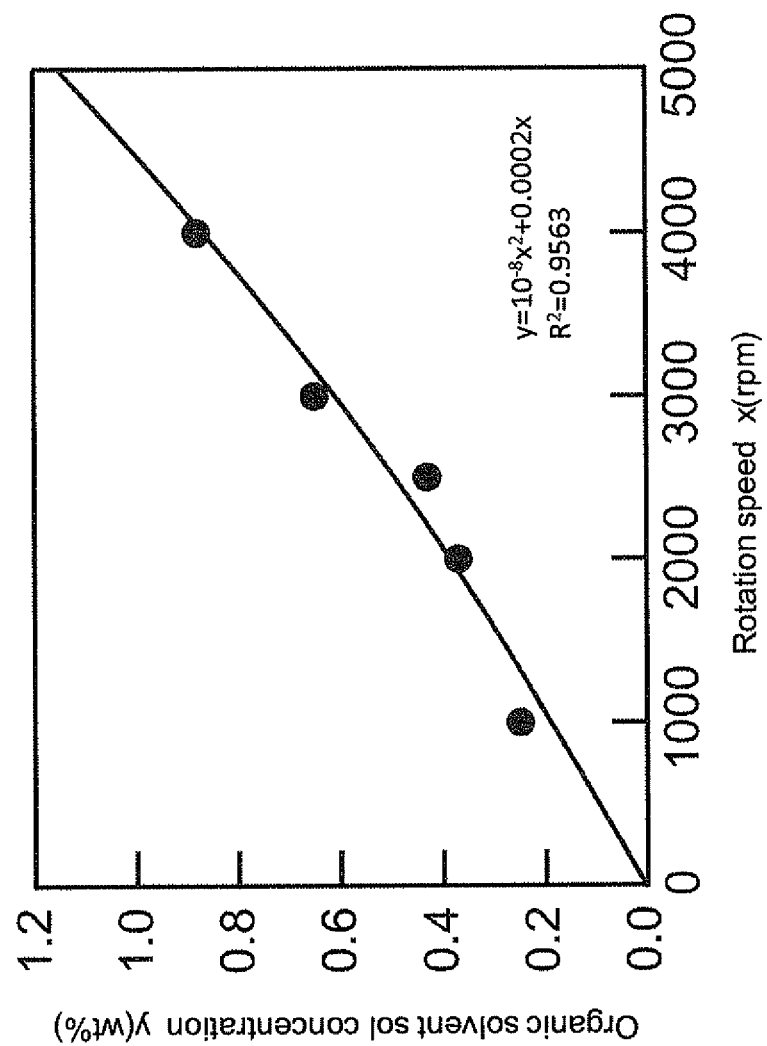
FIG. 30 shows the relationship between the spin coater rotation speed and the organic solvent sol concentration in Examples 18 and 20 to 23.

Similarly to Example 1, the nanosheet monolayer film on the Si wafer was subjected to the SEM observation and the AFM observation. The results of the observation are shown in FIG. 24 and FIG. 25, respectively. The nanosheet monolayer film on the quartz glass substrate was subjected to the measurement of the absorption spectrum. The results of the measurement are shown in FIG. 27. Using the absorbance obtained from the absorption spectrum, the relationship between the spin coater rotation speed and the organic solvent sol concentration was investigated. The results are shown in FIG. 30.

Figure 47:
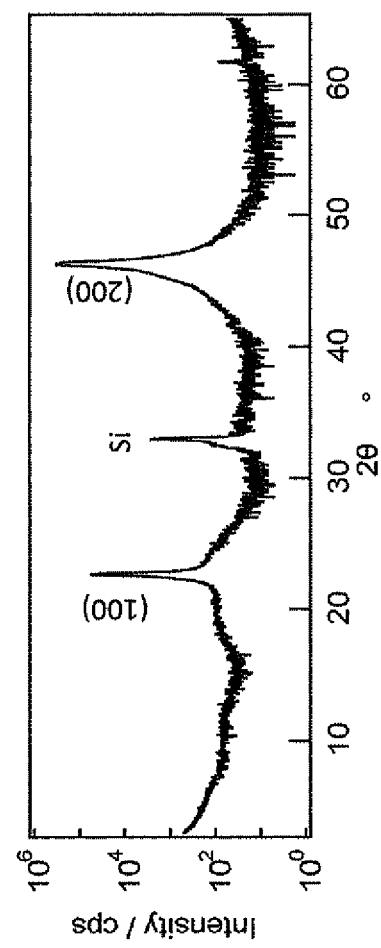
FIG. 47 shows the XRD pattern of SrTiO$_3$ thin film on the $Ca_2Nb_3O_{10}$ nanosheet monolayer film of Example 18.

Similarly to Example 1, $SrTiO_3$(STO) crystal thin film as an oxide was grown as being oriented by a pulse laser deposition (PLD) method on the nanosheet monolayer film on the Si wafer. The resultant STO thin film was subjected to an XRD measurement. The results are shown in FIG. 47.

Examples 19 TO 23 and Comparatives 47 to 52

In Examples 19 to 23 and Comparatives 47 to 52, a monolayer film (nanosheet monolayer film) whose inorganic layered compound is a layered perovskite oxide which is $M1Ca_2Nb_3O_{10}$ (in which M1 is K as at least one alkaline metal element. Hereinafter designated as $KCa_2Nb_3O_{10}$) and which consists of nanosheets (a nanosheet size: 2 μm to 10 μm) exfoliated from $KCa_2Nb_3O_{10}$ as a thin film was produced similarly to Example 18, except that the organic solvent sol concentration and the rotation speed were changed.

Figure 26:
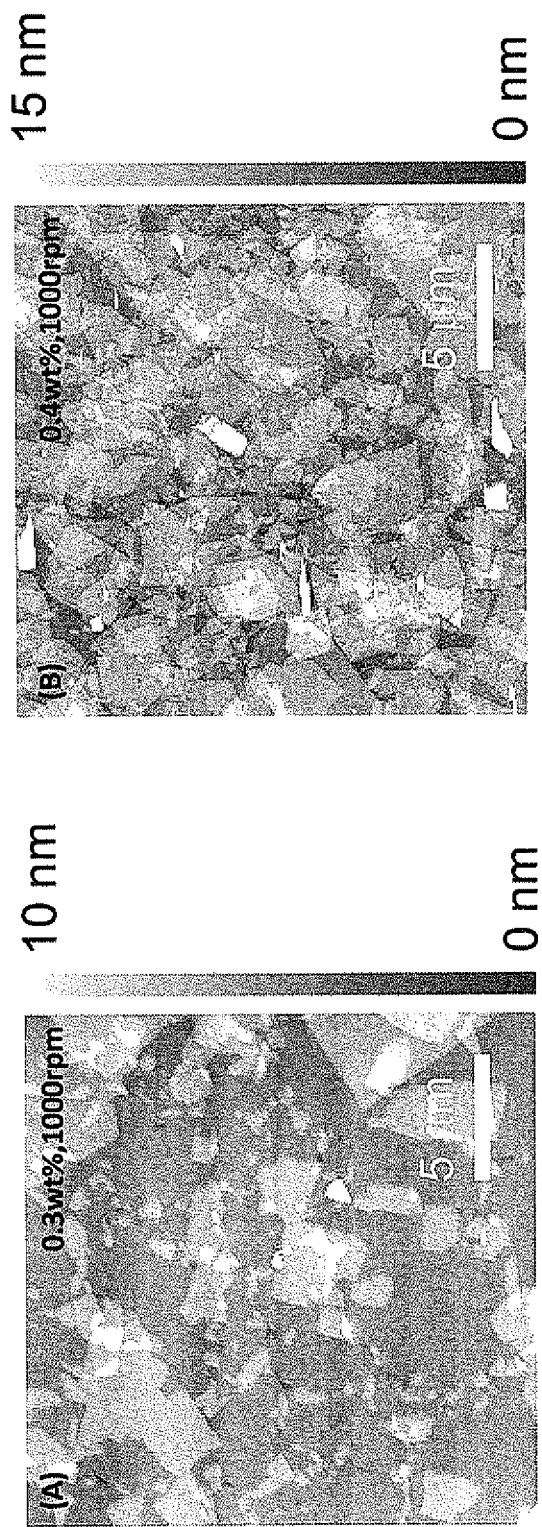
FIG. 26 shows the AFM images of the $Ca_2Nb_3O_{10}$ nanosheet monolayer films of Comparative 49 (A) and Comparative 50 (B).
Figure 28:
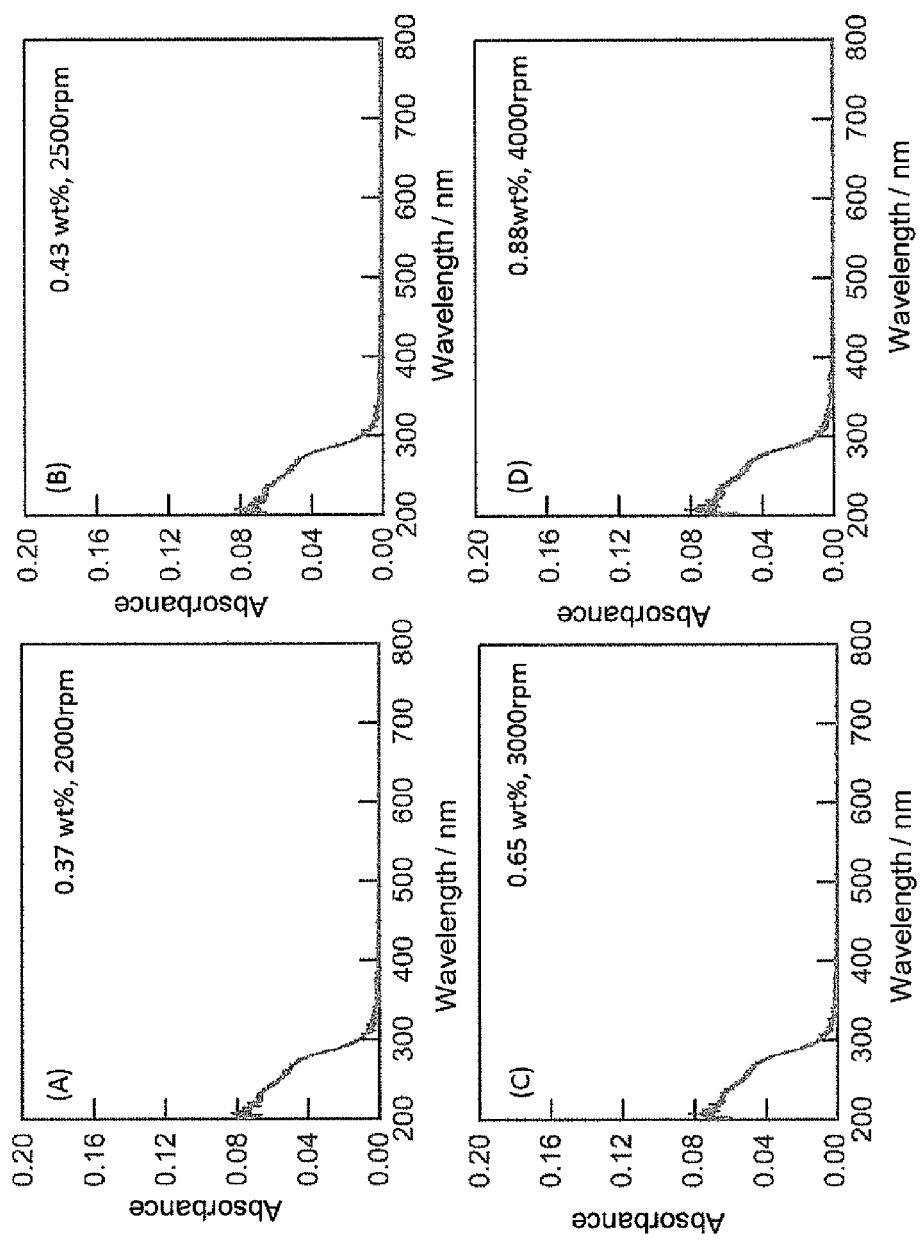
FIG. 28 shows the absorption spectra of the $Ca_2Nb_3O_{10}$ nanosheet monolayer films of Examples 20 to 23 (A) to (D).
Figure 29:
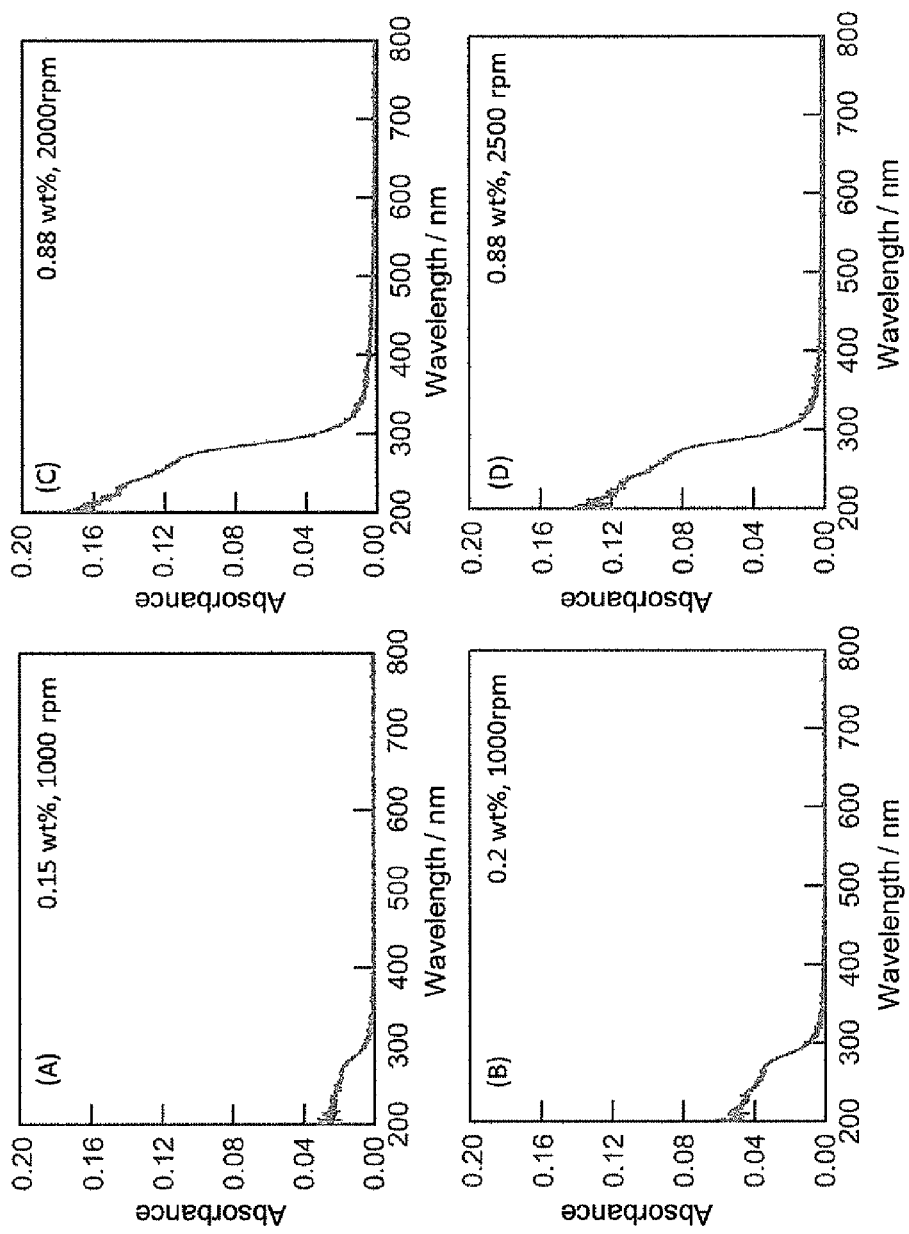
FIG. 29 shows the absorption spectra of the $Ca_2Nb_3O_{10}$ nanosheet monolayer films of Comparative 47 (A), Comparative 48 (B), Comparative 51 (C) and Comparative 52 (D).

The resultant nanosheet monolayer film was subjected similarly to Example 1 to the AFM observation and the absorption spectrometry. The results of the AFM observation of Example 19 and the results of the AFM observation of Comparative 49 and Comparative 50 are shown in FIGS. 25 and 26, respectively. The absorption spectra of Example 20 to Example 23 are shown in FIG. 28. The absorption spectra of Comparative 47, Comparative 48, Comparative 51 and Comparative 52 are shown in FIG. 29. Based on the measured absorbance, the relationship between the spin coater rotation speed and the organic solvent sol concentration in Examples 19 to 23 was investigated. The results are shown in FIG. 30.

For simplification, the organic solvent sol concentration, the rotation speed and the absorbance in Examples 18 to 23 and Comparatives 47 to 52 are shown in Table 4.

TABLE 4

Table 4: Listing of experimental conditions of $KCa_2Nb_3O_{10}$ (size: 2 μm to 10 μm) and absorbance in Examples 18 to 23 and Comparative 47 to 52

| Example/Comparative | Organic solvent sol concentration (% by wt) | Rotation speed (rpm) | Absorbance |
|---|---|---|---|
| Comparative 47 | 0.15 | 1000 | 0.0208 |
| Comparative 48 | 0.2 | 1000 | 0.0334 |
| Example 18 | 0.25 | 1000 | 0.045 |
| Example 19 | 0.28 | 1000 | — |
| Comparative 49 | 0.30 | 1000 | — |
| Example 20 | 0.37 | 2000 | 0.047 |
| Comparative 50 | 0.40 | 1000 | — |
| Example 21 | 0.43 | 2500 | 0.047 |
| Example 22 | 0.65 | 3000 | 0.045 |
| Comparative 51 | 0.88 | 2000 | 0.11 |
| Comparative 52 | 0.88 | 2500 | 0.085 |
| Example 23 | 0.88 | 4000 | 0.045 |

Example 24

In Example 24, using the experiment condition in Example 3, and by the processes in FIG. 4 and FIG. 5, a multilayer film (nanosheet multilayer film) consisting of $Ti_{0.87}O_2$ nanosheets (a nanosheet size: 300 nm to 500 nm) as a thin film was produced on the quartz glass substrate and the Si wafer.

$Ti_{0.87}O_2$ nanosheet monolayer film (n=1, n is the number of layers of nanosheets aligned densely) on the quartz glass substrate and the Si wafer obtained in Example 3 was the starting material. The step in which the organic solvent sol prepared in Example 3 was dropped onto the nanosheet monolayer film and the spin coater was employed to spin the substrate was repeated 9 times (Step S410 in FIG. 4).

Specifically, the nanosheet monolayer film obtained in Example 3 was heated (Step S510 in FIG. 5). The heating was conducted at 200° C. for 10 minutes. As a result, DMSO in the organic solvent sol remaining in the nanosheet monolayer film was removed. Then the heated nanosheet monolayer film was washed with pure water (Step S520 in FIG. 5). As a result, the organic solvent sol was imparted with compatibility. Thereafter, the organic solvent sol prepared in Example 3 was dropped onto the substrate similarly to Example 3, and the spin coater was used for spinning.

Figure 31:
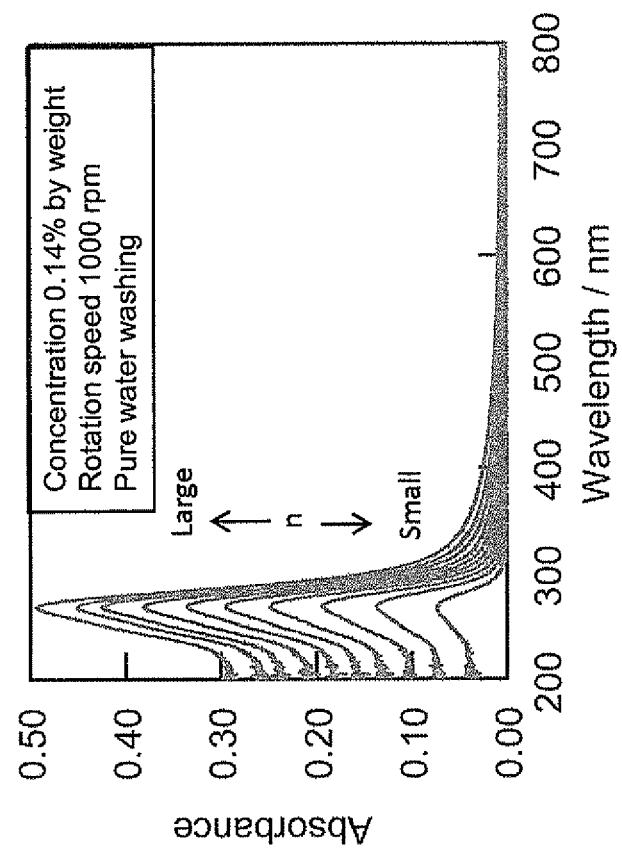
FIG. 31 shows the absorption spectrum of the $Ti_{0.87}O_2$ nanosheet multilayer film (n=1 to 10) of Example 24.
Figure 33:
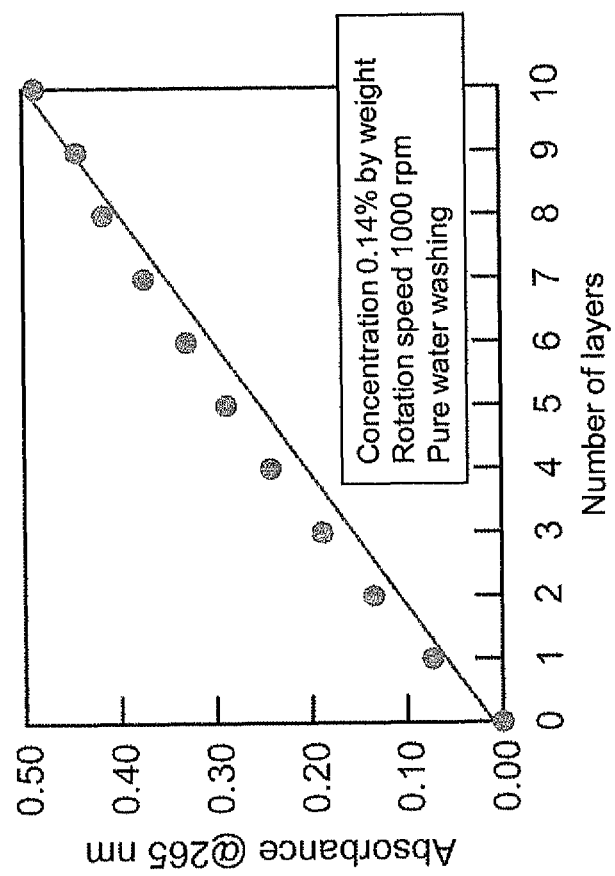
FIG. 33 shows the relationship between the number of layers and the absorbance at a wavelength of 265 nm in Example 24.
Figure 35:
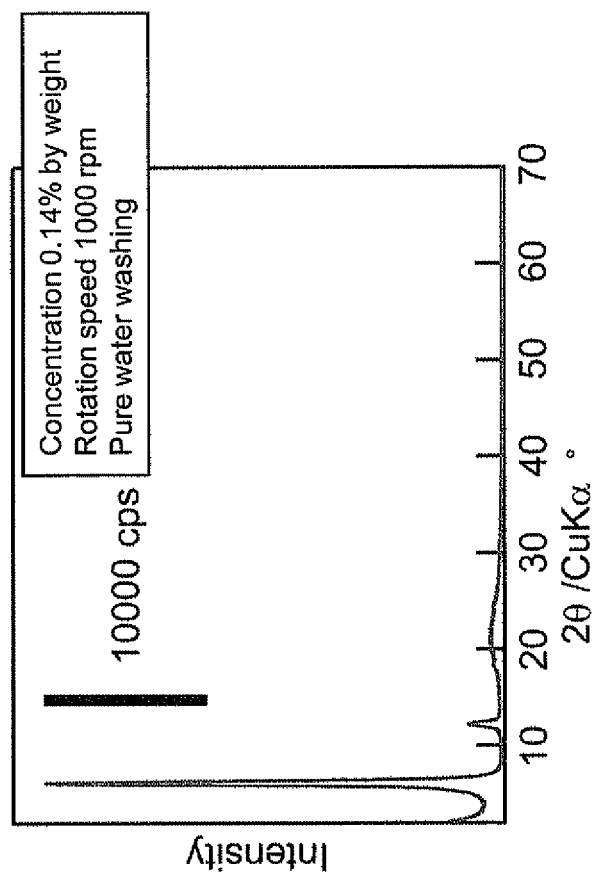
FIG. 35 shows the XRD pattern of the $Ti_{0.87}O_2$ nanosheet multilayer film (n=10) of Example 24.

The aforementioned procedure was repeated 9 times and a multilayer film consisting of $Ti_{0.87}O_2$ nanosheets (nanosheet multilayer film of 10 layers in total (n=10)) as a thin film was produced. The thin film obtained in each procedure was subjected to the absorption spectrum measurement similarly to Example 1 and the absorbance was obtained. The results are shown in FIG. 31 and FIG. 33. The nanosheet multilayer film consisting of 10 layers was also subjected to the powder X ray diffraction (XRD) using a CuKα beam. The XRD measurement employed Rint-2100 manufactured by Rigaku Corporation. The measurement condition involved a tube voltage of 40 kV, a tube current of 40 kA, a divergence slit of ⅔°, a scattering slit of ⅔°, a receiving slit of 0.3 mm and a scanning speed of 1.0°/minute. The results of the measurement are shown in FIG. 35.

Example 25

In Example 25, using the experiment condition in Example 3, and by the processes in FIG. 4 and FIG. 6, a multilayer film (nanosheet multilayer film) consisting of $Ti_{0.87}O_2$ nanosheets (a nanosheet size: 300 nm to 500 nm) as a thin film was produced on the quartz glass substrate and the Si wafer.

$Ti_{0.87}O_2$ nanosheet monolayer film (n=1, n is the number of layers of nanosheets aligned densely) on the quartz glass substrate and the Si wafer obtained in Example 3 was the starting material. The step in which the organic solvent sol prepared in Example 3 was dropped onto the nanosheet monolayer film and the spin coater was employed to spin the substrate was repeated 9 times (Step S410 in FIG. 4).

Specifically, the nanosheet monolayer film obtained in Example 3 was washed with ethanol as a further organic solvent (Step S610 in FIG. 6). As a result, DMSO in the organic solvent sol remaining in the nanosheet monolayer film was replaced with ethanol. Then, the washed nanosheet monolayer film was heated (Step S620 in FIG. 6). The heating was at 100° C. for 10 minutes. As a result, the replacing ethanol was removed. Thereafter, the organic solvent sol prepared in Example 3 was dropped onto the substrate similarly to Example 3, and the spin coater was used for spinning.

Figure 32:
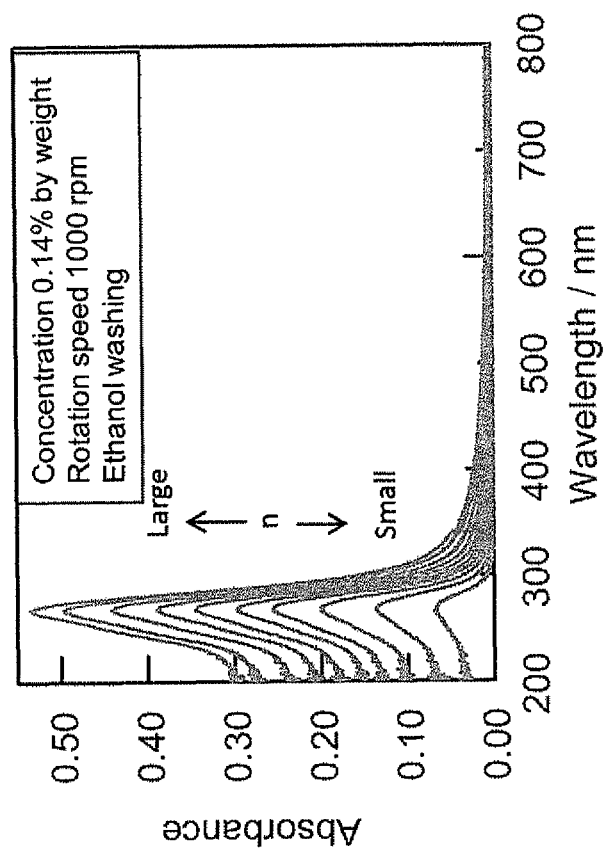
FIG. 32 shows the absorption spectrum of the $Ti_{0.87}O_2$ nanosheet multilayer film (n=1 to 10) of Example 25.
Figure 34:
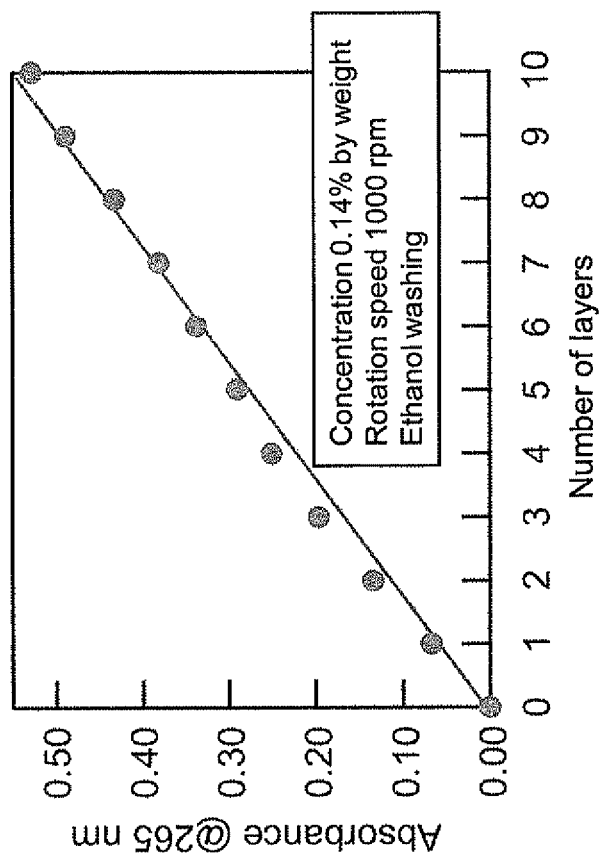
FIG. 34 shows the relationship between the number of layers and the absorbance at a wavelength of 265 nm in Example 25.
Figure 36:
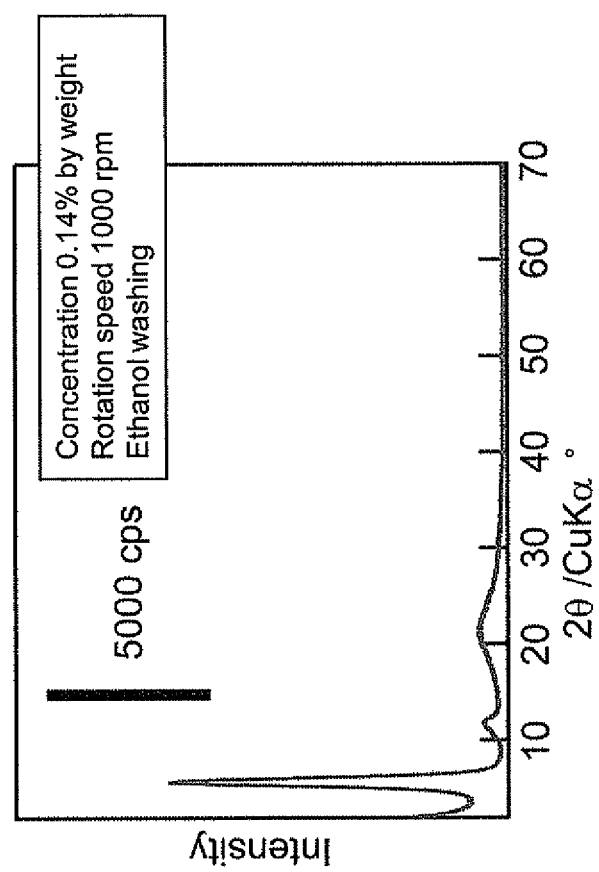
FIG. 36 shows the XRD pattern of the $Ti_{0.87}O_2$ nanosheet multilayer film (n=10) of Example 25.

The aforementioned procedure was repeated 9 times and a multilayer film consisting of $Ti_{0.87}O_2$ nanosheets (nanosheet multilayer film of 10 layers in total (n=10)) as a thin film was produced. The thin film obtained in each procedure was subjected to the absorption spectrum measurement similarly to Example 1 and the absorbance was obtained. The results are shown in FIG. 32 and FIG. 34. The nanosheet multilayer film consisting of 10 layers was also subjected to XRD measurement similarly to Example 24. The results are shown in FIG. 36.

Example 26

In Example 26, using the experiment condition in Example 11, and by the processes in FIG. 4 and FIG. 5, a multilayer film (nanosheet multilayer film) consisting of $Ti_{0.87}O_2$ nanosheets (a nanosheet size: 2 μm to 20 μm) as a thin film was produced on the quartz glass substrate and the Si wafer.

Figure 37:
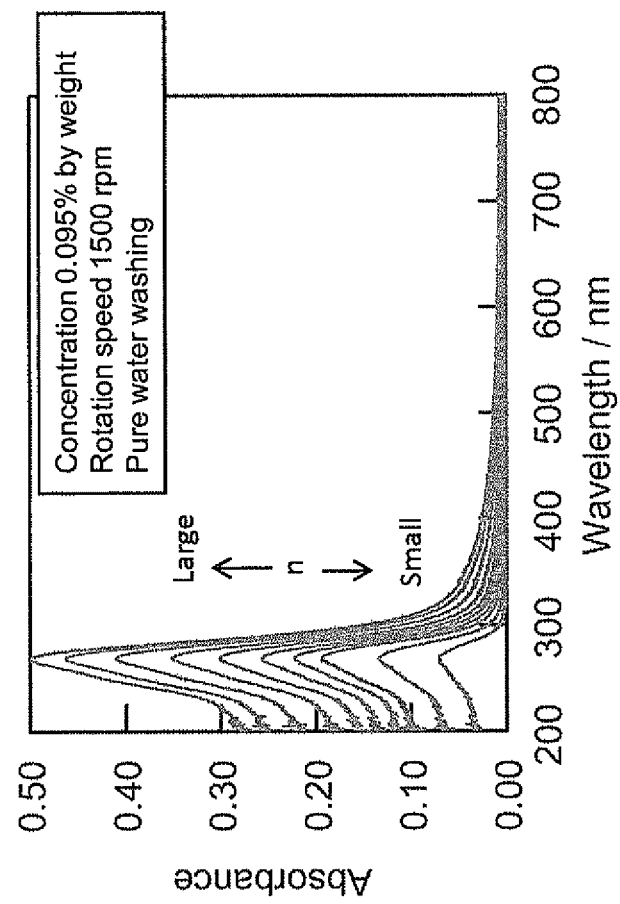
FIG. 37 shows the absorption spectrum of the $Ti_{0.87}O_2$ nanosheet multilayer film (n=1 to 10) of Example 26.
Figure 39:
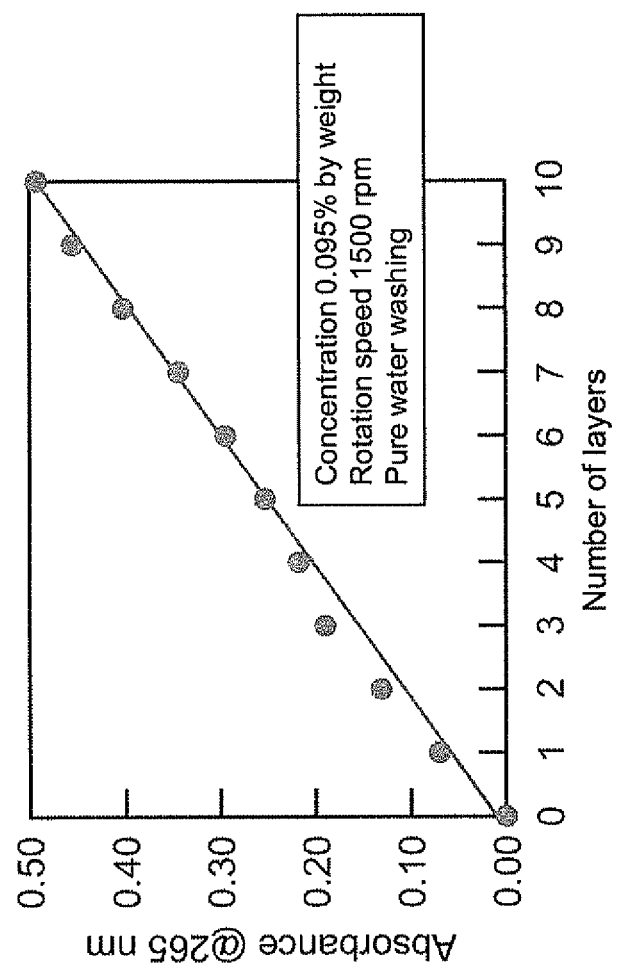
FIG. 39 shows the relationship between the number of layers and the absorbance at a wavelength of 265 nm in Example 26.
Figure 41:
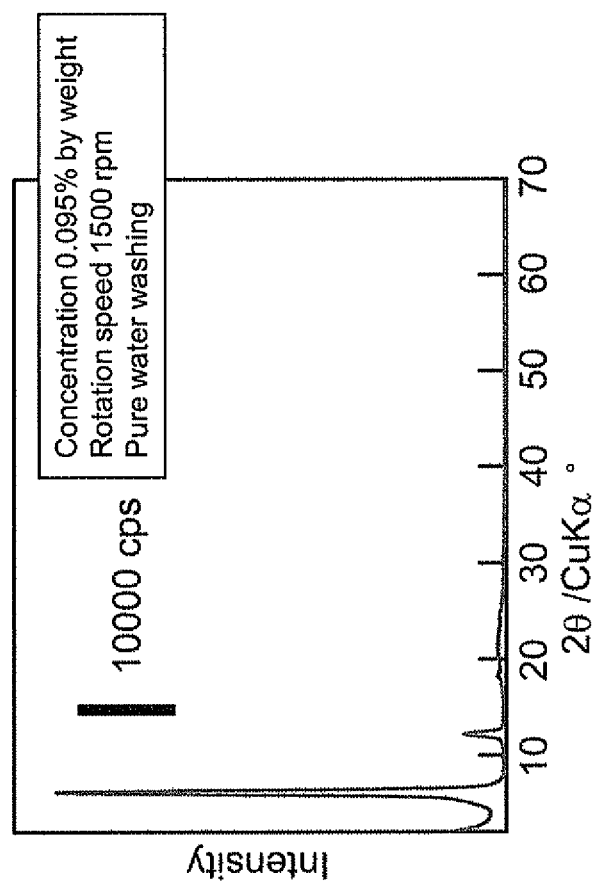
FIG. 41 shows the XRD pattern of the $Ti_{0.87}O_2$ nanosheet multilayer film (n=10) of Example 26.

Similarly to Example 24 except that the organic solvent sol prepared in Example 11 and the experiment condition were employed and the heating time period was 20 minutes, a multilayer film consisting of $Ti_{0.87}O_2$ nanosheets (nanosheet multilayer film of 10 layers in total (n=10)) as a thin film was produced. The thin film obtained in each procedure was subjected to the absorption spectrum measurement similarly to Example 1 and the absorbance was obtained. The results are shown in FIG. 37 and FIG. 39. The XRD measurement was also conducted similarly to Example 24. The results are shown in FIG. 41.

Figure 43:
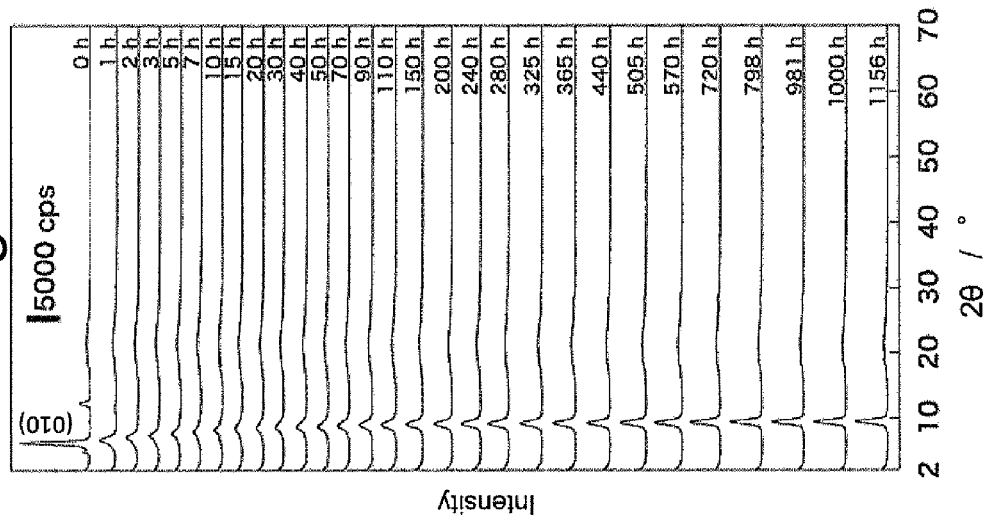
FIG. 43 shows the UV irradiation-induced change in the XRD pattern of the $Ti_{0.87}O_2$ nanosheet multilayer film (n=10) of Example 26.
Figure 44:
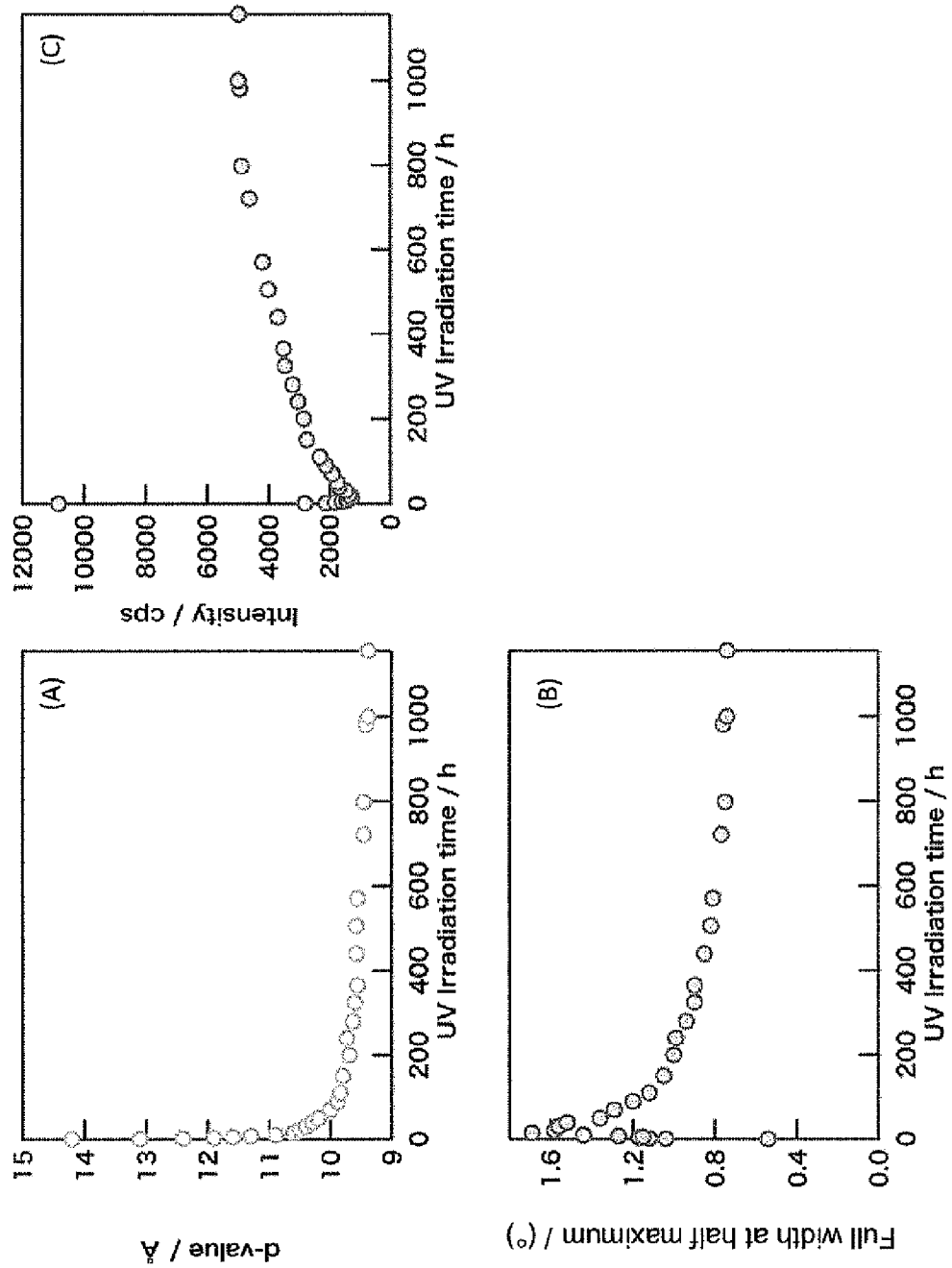
FIG. 44 shows the UV irradiation time period dependency of the d value, the full width at half maximum and the peak intensity of the diffraction peak (010) of the $Ti_{0.87}O_2$ nanosheet multilayer film (n=10) of Example 26.

The nanosheet multilayer film on the quartz glass substrate was irradiated with UV (wavelength: 200 to 300 nm, intensity: 1 mW/cm²) for a period of 1 hour to 1156 hours to remove the organic substances between the nanosheet monolayer films (Step S420 in FIG. 4). The XRD measurement was conducted at every predetermined irradiation time to verify the degree of removal of the organic substances. The results are shown in FIG. 43, FIG. 44 and Table 5.

Example 27

In Example 27, using the experiment condition in Example 11, and by the processes in FIG. 4 and FIG. 6, a multilayer film (nanosheet multilayer film) consisting of $Ti_{0.87}O_2$ nanosheets (a nanosheet size: 2 μm to 20 μm) as a thin film was produced on the quartz glass substrate and the Si wafer.

Figure 38:
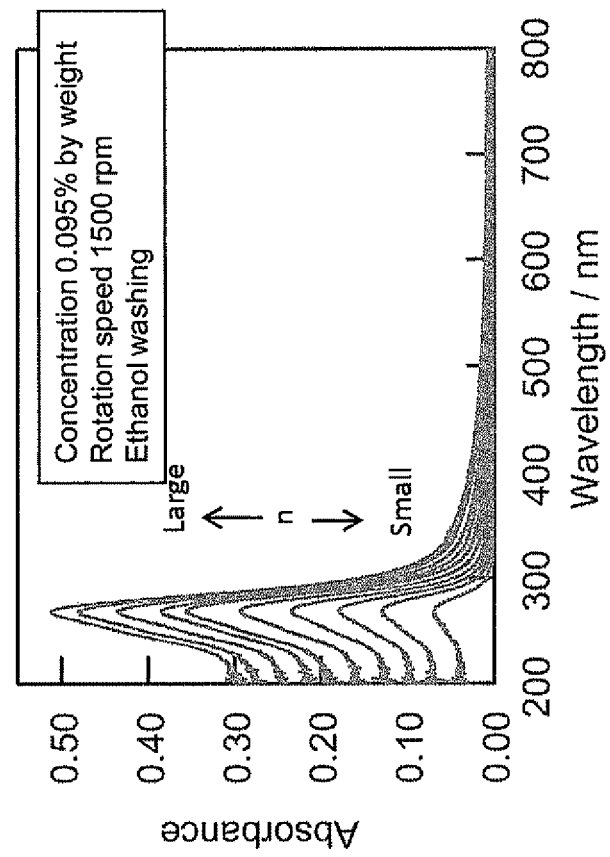
FIG. 38 shows the absorption spectrum of the $Ti_{0.87}O_2$ nanosheet multilayer film (n=1 to 10) of Example 27.
Figure 40:
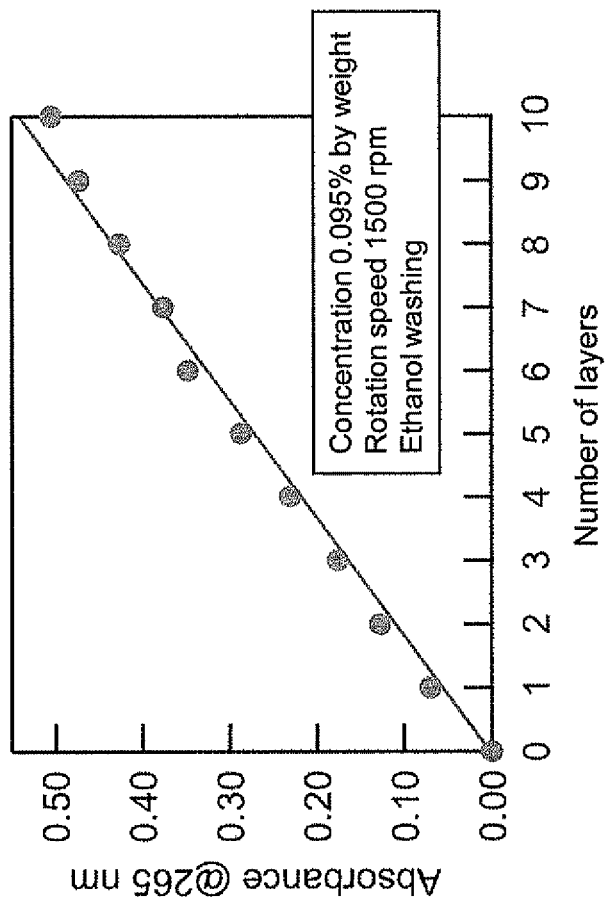
FIG. 40 shows the relationship between the number of layers and the absorbance at a wavelength of 265 nm in Example 27.
Figure 42:
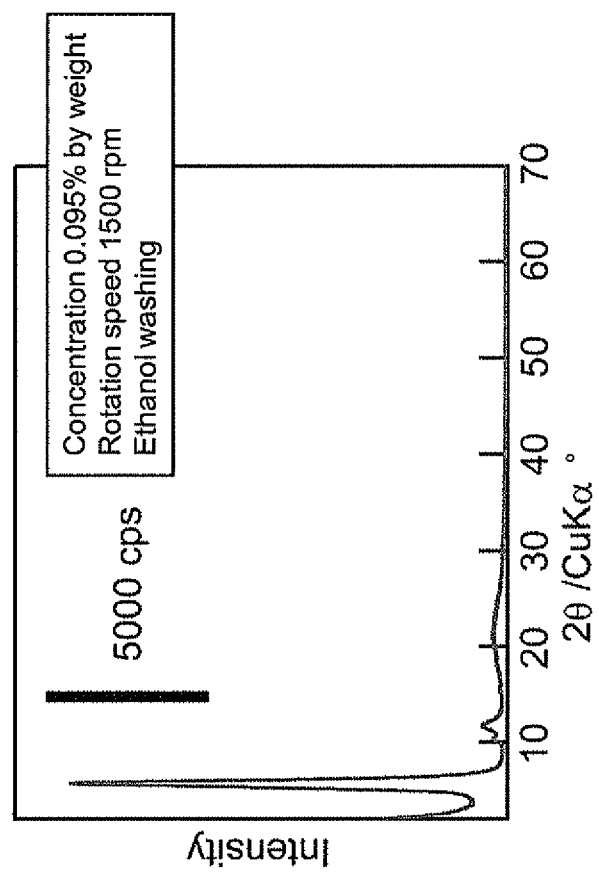
FIG. 42 shows the XRD pattern of the $Ti_{0.87}O_2$ nanosheet multilayer film (n=10) of Example 27.

Similarly to Example 25 except that the organic solvent sol prepared in Example 11 and the experiment condition were employed, a multilayer film consisting of $Ti_{0.87}O_2$ nanosheets (nanosheet multilayer film of 10 layers in total (n=10)) as a thin film was produced. The thin film obtained in each procedure was subjected to the absorption spectrum measurement similarly to Example 1 and the absorbance was obtained. The results are shown in FIG. 38 and FIG. 40. The XRD measurement was also conducted similarly to Example 24. The results are shown in FIG. 42.

Example 28

In Example 28, using an organic solvent sol concentration and a rotation speed of 0.060% by weight and 1500 rpm, respectively, and by the processes shown in FIG. 4 and FIG. 5, a multilayer film (nanosheet multilayer film) consisting of $Ti_{0.87}O_2$ nanosheets (a nanosheet size: 2 μm to 20 μm) as a thin film was produced on Nb-doped (0.5% by weight) $SrTiO_3$ Substrate (22 mmφ). The aforementioned organic solvent sol concentration and the rotation speed were confirmed to satisfy the relationship given by Equation (2).

Figure 48:
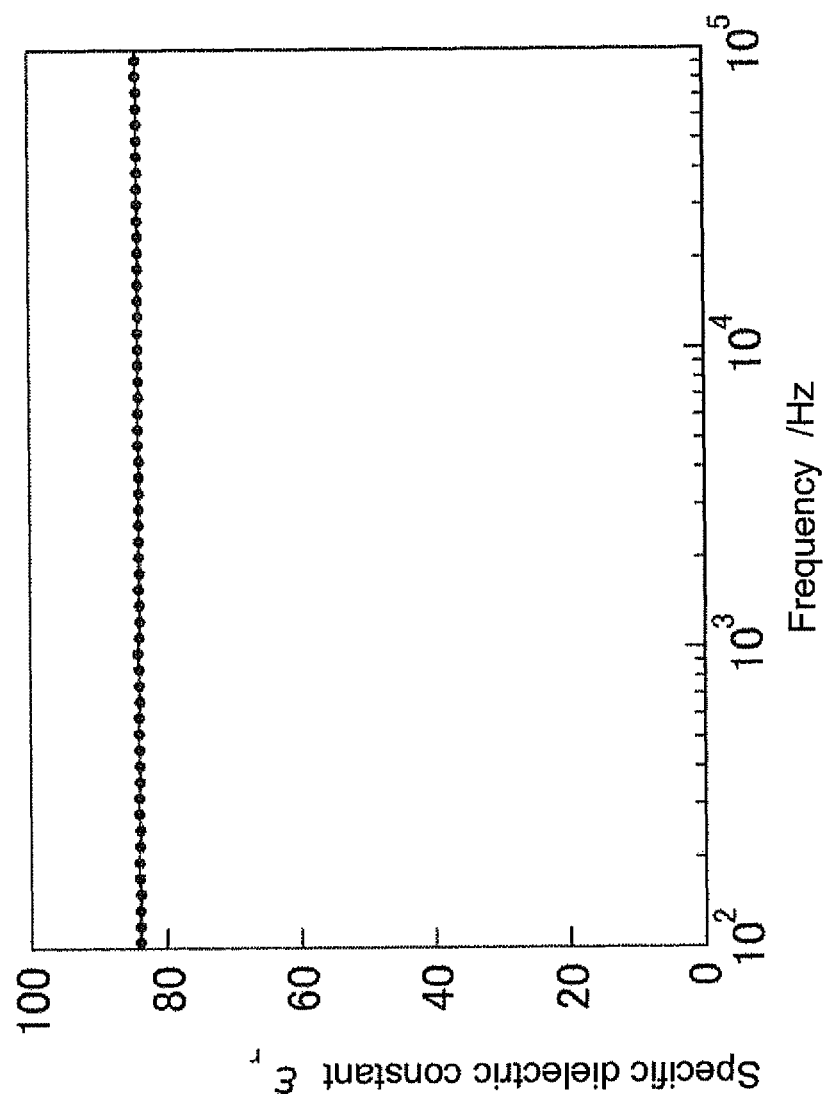
FIG. 48 shows the frequency dependency of the dielectric constant of $Ti_{0.87}O_2$ nanosheet multilayer film (n=10) of Example 28.
Figure 49:
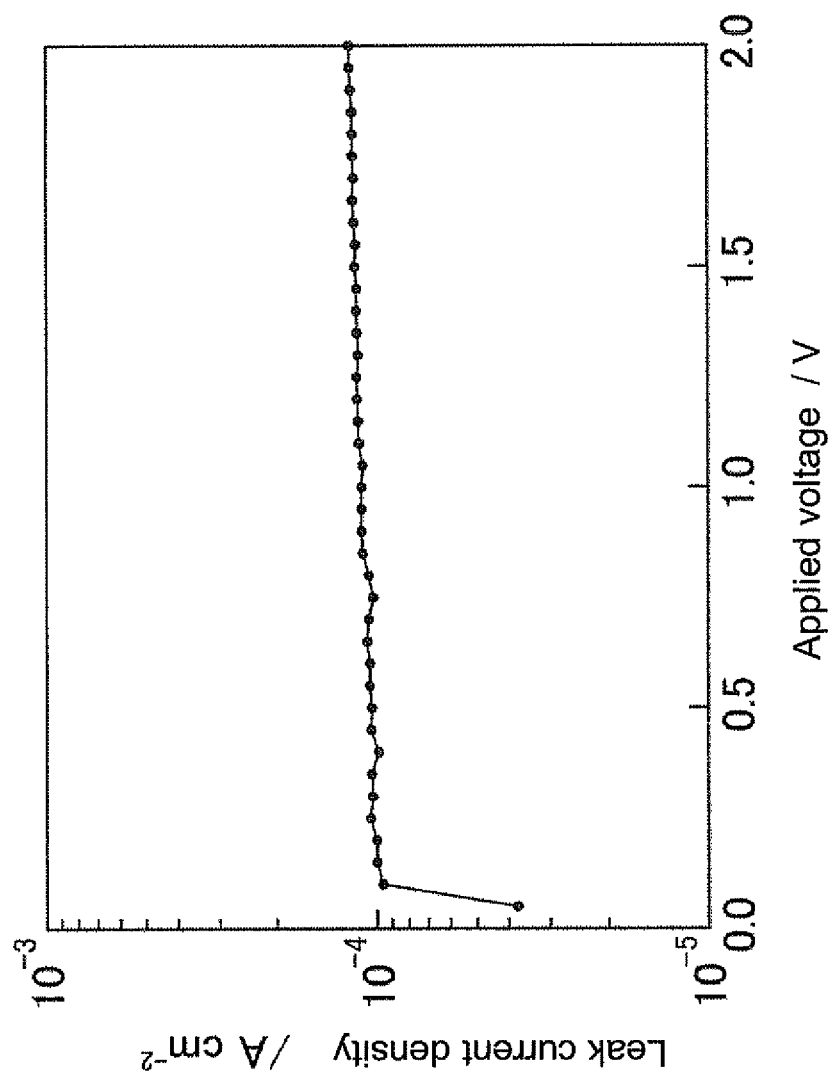
FIG. 49 shows the applied voltage dependency of the leak current density of $Ti_{0.87}O_2$ nanosheet multilayer film (n=10) of Example 28.

Similarly to Example 24 except for using the aforementioned organic solvent sol concentration and rotation speed, a multilayer film consisting of $Ti_{0.87}O_2$ nanosheets (nanosheet multilayer film of 10 layers in total (n=10)) as a thin film was produced. The nanosheet multilayer film was irradiated with UV (wavelength: 200 to 300 nm, intensity: 1 mW/cm²) for 1000 hours to remove the organic substance positioned between the nanosheet monolayer films (Step S420 in FIG. 4). Then the vapor deposition of a gold (100 μmφ) as an upper electrode was conducted over the nanosheet multilayer film. A probe was applied to each of the $SrTiO_3$ substrate and the upper electrode to measure the dielectric function. The results are shown in FIG. 48 and FIG. 49.

The results are described with regard to the aforementioned Examples and Comparatives.

FIG. 7 shows the results of the observation of the organic solvent sol of Example 1.

Based on FIG. 7, the organic solvent sol had a milky white color, and had the $Ti_{0.87}O_2$ nanosheets dispersed uniformly therein.

FIG. 8 shows the SEM image of the $Ti_{0.87}O_2$ nanosheet monolayer film of Example 1.

Based on FIG. 8, a white region attributable to the Si wafer was not observed, indicating that the Si wafer was covered entirely with the $Ti_{0.87}O_2$ nanosheets. From this, it is indicated that, according to the method of the invention, the $Ti_{0.87}O_2$ nanosheets having a nanosheet size within the range of 300 nm to 500 nm can be used to obtain a uniform $Ti_{0.87}O_2$ nanosheet monolayer film within a short time period over the entire substrate having a large surface area.

FIG. 9 shows the AFM image of the $Ti_{0.87}O_2$ nanosheet monolayer film of Example 1.

According to FIG. 9, it was revealed that a $Ti_{0.87}O_2$ nanosheet monolayer film exhibiting a dense alignment with no overlapping of or gap between the $Ti_{0.87}O_2$ nanosheets was obtained. A detailed image analysis was conducted to obtain a % coverage. Based on the histogram (not shown), the overlapping was 0%, and the gap was as small as 7%, indicating a dense alignment of the $Ti_{0.87}O_2$ nanosheets.

FIG. 10 shows the AFM images of the $Ti_{0.87}O_2$ nanosheet monolayer films of Comparative 1 (A), Comparative 2 (B) and Comparative 18 (C).

According to FIGS. 10 (A) and (C), it was revealed that a large number of the $Ti_{0.87}O_2$ nanosheets were overlapped with each other. On the other hand, according to FIG. 10 (B), it was revealed that the $Ti_{0.87}O_2$ nanosheets were located sparsely and there were a lot of gaps. Under the production condition in Comparatives, no $Ti_{0.87}O_2$ nanosheet monolayer film can be obtained at all.

FIG. 11 shows the absorption spectrum of the $Ti_{0.87}O_2$ nanosheet monolayer film of Example 1.

FIGS. 11 (A) to (C) are the absorption spectra of the center, the left end relative to the center and the right end relative to the center, respectively, of the quartz glass substrate. FIG. 11 (D) shows the position dependency of the absorbance at a wavelength of 265 nm obtained from FIGS. 11 (A) to (C).

According to FIGS. 11 (A) to (C), the absorption band attributable to the $Ti_{0.87}O_2$ nanosheet was observed each at a wavelength of 265 nm. Also according to FIG. 11 (D), the absorbance at a wavelength of 265 nm was about 0.065 at any location with no dependency on the position on the quartz glass substrate. This value was within the absorbance corresponding to the $Ti_{0.87}O_2$ nanosheet monolayer film.

FIG. 12 shows the absorption spectra of the $Ti_{0.87}O_2$ nanosheet monolayer films of Example 2 (A), Example 4 (B) and Example 6 (C).

FIG. 13 shows the absorption spectra of the $Ti_{0.87}O_2$ nanosheet monolayer films of Comparative 3 (A), Comparative 10 (B), Comparative 13 (C) and Comparative 23 (D).

According to FIG. 12 and FIG. 13, every absorption spectrum exhibited the absorption band attributable to the $Ti_{0.87}O_2$ nanosheet at a wavelength of 265 nm, but the absorbance varied greatly depending on the spin coat rotation speed and the organic solvent sol concentration.

As described above, FIG. 8 to FIG. 13 indicated that according to the method of the invention, for a specific nanosheet size (300 nm to 500 nm), a nanosheet monolayer film can surely be obtained by a simple operation within a short time period over the entire substrate having a large surface area by complying with a specific organic solvent sol concentration and a specific spin coat rotation speed.

FIG. 14 shows the relationship between the spin coater rotation speed and the organic solvent sol concentration in Example 1 to Example 8.

FIG. 14 shows the results of plotting the spin coater rotation speed and the organic solvent sol concentration as x (rpm) and y (% by weight) respectively with regard to Examples 1 to 8 having the absorbance (0.065 to 0.075) corresponding to the $Ti_{0.87}O_2$ nanosheet monolayer film. When calculating the approximation from the plots, Equation (1) was obtained.

$$y = 9 \times 10^{-9} x^2 + 4 \times 10^{-5} x + 0.0827 \quad (1)$$

The $R^2$ value (correlation coefficient) of Equation (1) was 0.9717, revealing an extremely high confidence. Since there are plots which are not necessarily positioned on Equation (1) in Examples 1 to 8, it was understood that the x value may include a range of ±300 rpm, and the value of y includes a range of ±10% based on the value of y.

As described above, FIG. 14 indicated that according to the method of the invention, for a $Ti_{0.87}O_2$ nanosheet having a size within the range of 300 nm to 500 nm, a nanosheet monolayer film can surely be obtained, as a result of an organic solvent sol concentration and a spin coater rotation speed which satisfy Equation (1), through a simple operation within a short time period over the entire substrate having a large surface area.

FIG. 15 shows the light-induced hydrophilization property of the $Ti_{0.87}O_2$ nanosheet monolayer film of Example 1.

It was confirmed that by irradiation UV for 24 hours as a pretreatment the contact angle of the nanosheet monolayer film becomes almost 0° as a result of the light-induced hydrophilization property of the $Ti_{0.87}O_2$ nanosheet (not shown). According to FIG. 15, when this nanosheet monolayer film was stored in a dark place for 1 month to allow the contact angle (40°) to recover the initial state and then was irradiated with UV again, the contact angle changed from 40° to 0° within a very short time as a result of the UV irradiation. Thus, it was confirmed that the UV irradiation allows the nanosheet monolayer film to become hydrophilic. It was also found that an increased intensity of the UV irradiation resulted in an increased rate of the hydrophilization (not shown). Based on these findings, it was confirmed that the $Ti_{0.87}O_2$ nanosheet monolayer film obtained by the method of the invention has a light-induced hydrophilization property similarly to the $Ti_{0.87}O_2$ nanosheet monolayer film obtained by existing methods and does not affect the properties of the $Ti_{0.87}O_2$ nanosheet adversely.

The aforementioned Examples 1 to 8 and Comparative 1 to 23 indicated that according to the method of the invention, for a $Ti_{0.87}O_2$ nanosheet having a size within the range of 300 nm to 500 nm, a nanosheet monolayer film can surely be obtained through a simple operation within a short time period over the entire substrate having a large surface area, based on the preferable Equation (1) of the relationship between the organic solvent sol concentration and the spin coater rotation speed. It is also indicated that the thin film consisting of the nanosheet monolayer film obtained by the method of the invention is useful as a material whose surface is hyperhydrophilized by the UV irradiation.

FIG. 16 shows the results of the observation of the organic solvent sol of Example 9.

Based on FIG. 16, the organic solvent sol, when compared with that in Example 1, had an opal-like gloss due to the liquid crystal nature, revealing a difference in the dispersion state due to the difference in the size of the $Ti_{0.87}O_2$ nanosheet between Example 1 and Example 9.

FIG. 17 shows the SEM image of the $Ti_{0.87}O_2$ nanosheet monolayer film of Example 9.

Based on FIG. 17, a white region attributable to the Si wafer was not observed, similarly to Example 1, indicating that the Si wafer was covered entirely with the $Ti_{0.87}O_2$ nanosheets. From this, it is indicated that, according to the method of the invention, the $Ti_{0.87}O_2$ nanosheets having a nanosheet size within the range of 2 μm to 20 can be used to obtain a uniform $Ti_{0.87}O_2$ nanosheet monolayer film within a short time period over the entire substrate having a large surface area. Also when compared with FIG. 8, it was confirmed that a $Ti_{0.87}O_2$ nanosheet monolayer film can be obtained within a short time period over the entire substrate having a large surface area, even when the nanosheet size is in a different range.

FIG. 18 shows the AFM image of the $Ti_{0.87}O_2$ nanosheet monolayer film of Example 9.

According to FIG. 18, it was revealed that a $Ti_{0.87}O_2$ nanosheet monolayer film exhibiting a dense alignment with no overlapping of or gap between the $Ti_{0.87}O_2$ nanosheets was obtained. A detailed image analysis was conducted to obtain a % coverage. Based on the histogram (not shown), the overlapping was 2%, and the gap was 15%, indicating a dense alignment of the $Ti_{0.87}O_2$ nanosheets. While these overlapping and gap were larger slightly than those in Example 1, they are within the range posing no problems in a practical use.

FIG. 19 shows the AFM images of the $Ti_{0.87}O_2$ nanosheet monolayer films of Comparative 24 (A), Comparative 27 (B) and Comparative 34 (C).

According to FIG. 19 (A), it was revealed the $Ti_{0.87}O_2$ nanosheets were located sparsely and there were a lot of gaps. On the other hand, according to FIGS. 19 (B) and 19(C) it was revealed that a large number of the $Ti_{0.87}O_2$ nanosheets were overlapped with each other. Under the production condition in Comparatives, no $Ti_{0.87}O_2$ nanosheet monolayer film can be obtained at all.

FIG. 20 shows the absorption spectrum of the $Ti_{0.87}O_2$ nanosheet monolayer film of Example 9.

FIGS. 20 (A) to (C) are the absorption spectra of the center, the left end relative to the center and the right end relative to the center, respectively, of the quartz glass substrate. FIG. 20 (D) shows the position dependency of the absorbance at a wavelength of 265 nm obtained from FIGS. 20 (A) to (C).

According to FIGS. 20 (A) to (C), similarly to Example 1, the absorption band attributable to the $Ti_{0.87}O_2$ nanosheet was observed each at a wavelength of 265 nm. Also according to FIG. 20 (D), the absorbance at a wavelength of 265 nm was about 0.065 at any location with no dependency on the position on the quartz glass substrate. This value was within the absorbance corresponding to the $Ti_{0.87}O_2$ nanosheet monolayer film.

FIG. 21 shows the absorption spectra of the $Ti_{0.87}O_2$ nanosheet monolayer films of Examples 10 to 12 (A) to (C), Example 14 (D) and Example 16 (E).

FIG. 22 shows the absorption spectra of the $Ti_{0.87}O_2$ nanosheet monolayer films of Comparative 28 (A), Comparative 29 (B), Comparative 37 (C) and Comparative 38 (D).

According to FIG. 21 and FIG. 22, every absorption spectrum exhibited the absorption band attributable to the $Ti_{0.87}O_2$ nanosheet at a wavelength of 265 nm, but the absorbance varied greatly depending on the spin coat rotation speed and the organic solvent sol concentration.

As described above, FIG. 17 to FIG. 22 indicated that according to the method of the invention, for a specific nanosheet size (2 μm to 20 μm), a nanosheet monolayer film can surely be obtained by a simple operation within a short time period over the entire substrate having a large surface area by complying with a specific organic solvent sol concentration and a specific spin coat rotation speed.

FIG. 23 shows the relationship between the spin coater rotation speed and the organic solvent sol concentration in Example 9 to Example 17.

FIG. 23 shows the results of plotting the spin coater rotation speed and the organic solvent sol concentration as x (rpm) and y (% by weight) respectively with regard to Examples 9 to 17 having the absorbance (0.065 to 0.075) corresponding to the $Ti_{0.87}O_2$ nanosheet monolayer film. When calculating the approximation from the plots, Equation (2) was obtained.

$$y = 2 \times 10^{-8} x^2 + 2 \times 10^{-5} x \quad (2)$$

The $R^2$ value (correlation coefficient) of Equation (2) was 0.980, revealing an extremely high confidence. Since there are plots which are not necessarily positioned on Equation (2) in Examples 9 to 17, it was understood that the x value may include a range of ±300 rpm, and the value of y includes a range of ±10% based on the value of y.

The aforementioned Examples 9 to 17 and Comparatives 24 to 46 indicated that according to the method of the invention, for a $Ti_{0.87}O_2$ nanosheet having a size within the range of 2 μm to 20 μm, a nanosheet monolayer film can surely be obtained through a simple operation within a short time period over the entire substrate having a large surface area, based on the preferable Equation (2) of the relationship between the organic solvent sol concentration and the spin coater rotation speed. It is also indicated, from Examples 1 to 8 and Examples 9 to 17, that even when the range of the size of the $Ti_{0.87}O_2$ nanosheet is different, a satisfactory nanosheet monolayer film can be obtained by finding the preferable equation of the relationship between the organic solvent sol concentration and the spin coater rotation speed.

FIG. 24 shows the SEM image of the $Ca_2Nb_3O_{10}$ nanosheet monolayer film of Example 18.

Based on FIG. 24, a white region attributable to the Si wafer was not observed, similarly to Example 1 and Example 9, indicating that the Si wafer was covered entirely with the $Ca_2Nb_3O_{10}$ nanosheets. From this, it is indicated that, according to the method of the invention, the $Ca_2Nb_3O_{10}$ nanosheets having a nanosheet size within the range of 2 μm to 10 μm can be used to obtain a uniform $Ca_2Nb_3O_{10}$ nanosheet monolayer film within a short time period over the entire substrate having a large surface area. Also when compared with Example 1 to Example 17, it was confirmed that a uniform $Ca_2Nb_3O_{10}$ nanosheet monolayer film can be obtained within a short time period over the entire substrate having a large surface area, even when the type of the nanosheet is different.

FIG. 25 shows the AFM image of the $Ca_2Nb_3O_{10}$ nanosheet monolayer film of Example 18 (A) and Example 19 (B).

According to FIG. 25, it was revealed that a $Ca_2Nb_3O_{10}$ nanosheet monolayer film exhibiting a dense alignment with no overlapping of or gap between the $Ca_2Nb_3O_{10}$ nanosheets was obtained. A detailed image analysis was conducted to obtain a % coverage. Based on the histogram (not shown), the overlapping was 3%, and the gap was 6% in Example 18, and the overlapping was 5%, and the gap was 10% in Example 19. Each indicated a dense alignment of the $Ca_2Nb_3O_{10}$ nanosheets.

FIG. 26 shows the AFM images of the $Ca_2Nb_3O_{10}$ nanosheet monolayer films of Comparative 49 (A) and Comparative 50 (B).

According to FIG. 26 (A), the $Ca_2Nb_3O_{10}$ nanosheets were located sparsely and there were a lot of gaps. On the other hand, according to FIG. 26 (B) it was revealed that a large number of the $Ca_2Nb_3O_{10}$ nanosheets were overlapped with each other. Under the production condition in Comparatives, no $Ca_2Nb_3O_{10}$ nanosheet monolayer film can be obtained at all.

FIG. 27 shows the absorption spectrum of the $Ca_2Nb_3O_{10}$ nanosheet monolayer film of Example 18.

FIGS. 27 (A) to (C) are the absorption spectra of the center, the left end relative to the center and the right end relative to the center, respectively, of the quartz glass substrate. FIG. 27 (D) shows the position dependency of the absorbance at a wavelength of 270 nm obtained from FIGS. 20 (A) to (C).

According to FIGS. 27 (A) to (C), the absorption band attributable to the $Ca_2Nb_3O_{10}$ nanosheet was observed each at a wavelength of 270 nm. Also according to FIG. 27 (D), the absorbance at a wavelength of 270 nm was about 0.045 at any location with no dependency on the position on the quartz glass substrate. This value was within the absorbance corresponding to the $Ca_2Nb_3O_{10}$ nanosheet monolayer film.

FIG. 28 shows the absorption spectra of the $Ca_2Nb_3O_{10}$ nanosheet monolayer films of Examples 20 to 23 (A) to (D).

FIG. 29 shows the absorption spectra of the $Ca_2Nb_3O_{10}$ nanosheet monolayer films of Comparative 47 (A), Comparative 48 (B), Comparative 51 (C) and Comparative 52 (D).

According to FIG. 28 and FIG. 29, every absorption spectrum exhibited the absorption band attributable to the $Ca_2Nb_3O_{10}$ nanosheet at a wavelength of 270 nm, but the absorbance varied greatly depending on the spin coat rotation speed and the organic solvent sol concentration.

As described above, FIG. 24 to FIG. 29 indicated that according to the method of the invention, for a specific nanosheet size (2 μm to 10 μm), a nanosheet monolayer film can surely be obtained by a simple operation within a short time period over the entire substrate having a large surface area by complying with a specific organic solvent sol concentration and a specific spin coat rotation speed.

FIG. 30 shows the relationship between the spin coater rotation speed and the organic solvent sol concentration in Examples 18 and 20 to 23.

FIG. 30 shows the results of plotting the spin coater rotation speed and the organic solvent sol concentration as x (rpm) and y (% by weight) respectively with regard to Example 18 and Examples 20 to 23 having the absorbance (0.045 to 0.055) corresponding to the $Ca_2Nb_3O_{10}$ nanosheet monolayer film. When calculating the approximation from the plots, Equation (3) was obtained.

$$y=10^{-8}x^2+0.0002x \qquad (3)$$

The $R^2$ value (correlation coefficient) of Equation (3) was 0.9563, revealing an extremely high confidence. Since there are plots which are not necessarily positioned on Equation (3) in Example 18 and Examples 20 to 23, it was understood that the x value may include a range of ±300 rpm, and the value of y includes a range of ±10% based on the value of y.

The aforementioned Examples 18 to 23 and Comparatives 47 to 53 indicated that according to the method of the invention, for a $Ca_2Nb_3O_{10}$ nanosheet having a size within the range of 2 μm to 10 μm, a nanosheet monolayer film can surely be obtained through a simple operation within a short time period over the entire substrate having a large surface area, based on the preferable Equation (3) of the relationship between the organic solvent sol concentration and the spin coater rotation speed. It is also indicated, from Examples 1 to 17 and Examples 18 to 23, that, for the various sizes of the nanosheets exfoliated from inorganic layered compounds, a satisfactory nanosheet monolayer film can be obtained by finding the preferable equation of the relationship between the organic solvent sol concentration and the spin coater rotation speed.

FIG. 31 shows the absorption spectrum of the $Ti_{0.87}O_2$ nanosheet multilayer film (n=1 to 10) of Example 24.

FIG. 32 shows the absorption spectrum of the $Ti_{0.87}O_2$ nanosheet multilayer film (n=1 to 10) of Example 25.

FIG. 31 and FIG. 32 show that an increased n resulted in an increased absorbance at a wavelength of 265 nm. Accordingly, it was found that the method of the invention enables the conversion of the nanosheet monolayer films to be multilayered and allows the film thickness to surely be increased.

FIG. 33 shows the relationship between the number of layers and the absorbance at a wavelength of 265 nm in Example 24.

FIG. 34 shows the relationship between the number of layers and the absorbance at a wavelength of 265 nm in Example 25.

FIG. 33 and FIG. 34 indicate that an increase in the number of the layers (thus, the number of repeats of Step S401 in FIG. 4) leads to a linear increase in the absorbance. This means that by the method of the invention it is possible to be multilayered surely on the layer-by-layer basis. Also in such a multilayer, the quality of the multilayered film exhibits no substantial change whichever method shown in FIG. 5 or FIG. 6 is employed.

FIG. 35 shows the XRD pattern of the $Ti_{0.87}O_2$ nanosheet multilayer film (n=10) of Example 24.

FIG. 36 shows the XRD pattern of the $Ti_{0.87}O_2$ nanosheet multilayer film (n=10) of Example 25.

Any of FIG. 35 and FIG. 36 exhibited a sharp fundamental diffraction series of a titania. This means that the nanosheet monolayer films are stacked regularly at certain intervals, and it was confirmed that a nanosheet multilayer film having an orderly multilayer structure can be formed only by conducting Step S410 (FIG. 4) (repetitive spin coating).

As described above, FIG. 31 to FIG. 36 indicated that by employing the methods of the invention shown in FIG. 4 to FIG. 6 it becomes possible to conduct the multilayer of the nanosheet monolayer films, and even also the regulation of the layers on the layer-by-layer basis.

FIG. 37 shows the absorption spectrum of the $Ti_{0.87}O_2$ nanosheet multilayer film (n=1 to 10) of Example 26.

FIG. 38 shows the absorption spectrum of the $Ti_{0.87}O_2$ nanosheet multilayer film (n=1 to 10) of Example 27.

FIG. 37 and FIG. 38 show that an increased n resulted in an increased absorbance at a wavelength of 265 nm similarly to Examples 24 and 25. Accordingly, it was found that the method of the invention enables the conversion of the nanosheet monolayer films to be multilayered and allows the film thickness to surely be increased.

FIG. 39 shows the relationship between the number of layers and the absorbance at a wavelength of 265 nm in Example 26.

FIG. 40 shows the relationship between the number of layers and the absorbance at a wavelength of 265 nm in Example 27.

FIG. 39 and FIG. 40 indicate that an increase in the number of the layers (thus, the number of repeats of Step S401 in FIG. 4) leads to a linear increase in the absorbance similarly to Examples 24 and 25. This means that by the method of the invention it is possible to be multilayered surely on the layer-by-layer basis regardless of the size of the nanosheet. Also in such a multilayer, the quality of the multilayered film exhibits no substantial change whichever method shown in FIG. 5 or FIG. 6 is employed, regardless of the size of the nanosheet.

FIG. 41 shows the XRD pattern of the $Ti_{0.87}O_2$ nanosheet multilayer film (n=10) of Example 26.

FIG. 42 shows the XRD pattern of the $Ti_{0.87}O_2$ nanosheet multilayer film (n=10) of Example 27.

Any of FIG. 41 and FIG. 42 exhibited a sharp fundamental diffraction series of a titania similarly to Examples 24 and 25. This means that by the method of the invention the nanosheet monolayer films are stacked regularly at certain intervals regardless of the size of the nanosheet, and it was confirmed that a nanosheet multilayer having an orderly multilayer structure can be formed only by conducting Step S410 (FIG. 4) (repetitive spin coating).

As described above, FIG. 37 to FIG. 42 indicated that by employing the methods of the invention shown in FIG. 4 to FIG. 6 it becomes possible to conduct the multilayer of the nanosheet monolayer films, and even also the regulation of the layers on the layer-by-layer basis. Also from Examples 24 and 25 and Examples 26 and 27, it is indicated that the methods of the invention shown in FIG. 4 to FIG. 6 can be applied regardless of the size of the nanosheet.

FIG. 43 shows the UV irradiation-induced change in the XRD pattern of the $Ti_{0.87}O_2$ nanosheet multilayer film (n=10) of Example 26.

FIG. 43 indicates that a longer UV irradiation time resulted in a diffraction peak (010) shifted to a higher angle, i.e., resulted in a shorter inter-layer distance. This confirms that by the UV irradiation the organic substance positioned between the nanosheet monolayer films are removed.

FIG. 44 shows the UV irradiation time period dependency of the d value, the full width at half maximum and the peak intensity of the diffraction peak (010) of the $Ti_{0.87}O_2$ nanosheet multilayer film (n=10) of Example 26.

TABLE 5

Table 5: Change in d value, full width at half maximum and intensity of diffraction peak (010) by UV irradiation time in titania nanosheet multilayer film (size: 2 μm to 10 μm) of Example 26

| | | Main peak(010) | |
| --- | --- | --- | --- |
| Irradiation time (h) | d Value (Å) | Full width at half maximum (°) | Intensity (cps) |
| 0 | 14.2 | 0.54 | 10824 |
| 1 | 13.1 | 1.04 | 2798 |
| 2 | 12.4 | 1.12 | 2113 |
| 3 | 11.9 | 1.17 | 1811 |
| 5 | 11.6 | 1.15 | 1568 |
| 7 | 11.3 | 1.27 | 1423 |
| 10 | 10.9 | 1.44 | 1401 |
| 15 | 10.6 | 1.69 | 1263 |
| 20 | 10.5 | 1.58 | 1359 |
| 30 | 10.4 | 1.56 | 1454 |
| 40 | 10.3 | 1.52 | 1676 |
| 50 | 10.2 | 1.36 | 1723 |
| 70 | 10.0 | 1.29 | 1900 |
| 90 | 9.88 | 1.20 | 2114 |
| 110 | 9.84 | 1.12 | 2303 |
| 150 | 9.80 | 1.05 | 2741 |
| 200 | 9.69 | 1.00 | 2843 |
| 240 | 9.73 | 0.99 | 3037 |
| 280 | 9.63 | 0.94 | 3203 |
| 325 | 9.60 | 0.90 | 3471 |
| 365 | 9.56 | 0.90 | 3512 |
| 440 | 9.58 | 0.85 | 3688 |
| 505 | 9.58 | 0.82 | 4008 |
| 570 | 9.56 | 0.81 | 4197 |
| 720 | 9.46 | 0.77 | 4623 |
| 798 | 9.46 | 0.75 | 4876 |
| 981 | 9.42 | 0.76 | 4944 |
| 1000 | 9.38 | 0.74 | 4985 |
| 1156 | 9.38 | 0.74 | 4979 |

FIG. 44 (A) and Table 5 indicated that the inter-layer distance d was reduced markedly at a UV irradiation time of about 10 hours, and exhibited a mild reduction at 200 hours or later. FIG. 44 (B) and Table 5 indicated that the full width at half maximum was increased markedly at a UV irradiation time of about 10 hours, indicating a reduction in the crystallinity, but thereafter a further UV irradiation served to improve the crystallinity. The full width at half maximum exhibited a mild reduction at 200 hours of the UV irradiation and thereafter. FIG. 44 (C) and Table 5 indicated the behavior of the intensity which was opposite to FIG. 4 (B). Also from these findings, it was found that the UV irradiation time is preferably at least 200 hours for example when the nanosheet multilayer film has 10 layers.

As described above, FIG. 43 indicated that by employing the method of the invention shown in Step S420 in FIG. 4 it is possible, in the thin film formed by multilayering of nanosheet monolayer films, to remove the organic substances between the nanosheet monolayer films and to effect conversion into an inorganic thin film. Also from FIG. 44 and Table 5, it was found that the UV irradiation condition for removing the organic substances involves an irradiation time of at least 200 hours for removing the organic substances to an extent allowing the effect of the organic substances to be negligible, although it may vary depending on the number of the layers in the multilayer film.

FIG. 45 shows the XRD pattern of $SrTiO_3$ thin film on the $Ti_{0.87}O_2$ nanosheet monolayer film of Example 1.

FIG. 46 shows the XRD pattern of $SrTiO_3$ thin film on the $Ti_{0.87}O_2$ nanosheet monolayer film of Example 9.

FIG. 45 and FIG. 46 indicated that in each case the STO thin film was (110) oriented on the $Ti_{0.87}O_2$ nanosheet monolayer film. More specifically, the full widths at half maximum of the (110) diffraction peaks in FIG. 45 and FIG. 46 are 2.41 and 2.12, respectively. This indicates that, regardless of the size of the $Ti_{0.87}O_2$ nanosheet exfoliated from a layered titanium oxide as a seed layer, the resultant STO thin film is an oriented film having a high crystallinity.

FIG. 47 shows the XRD pattern of $SrTiO_3$ thin film on the $Ca_2Nb_3O_{10}$ nanosheet monolayer film of Example 18.

FIG. 47 indicated that the STO thin film was (100) oriented on the $Ca_2Nb_3O_{10}$ nanosheet monolayer film. More specifically, the full width at half maximum of the (200) diffraction peak was 0.263°, indicating that the resultant STO film is an oriented film having a high crystallinity.

As described above, from FIG. 45 to FIG. 47, the nanosheet monolayer film obtained by the production method of the invention was confirmed to serve as a seed layer for growing an oxide thin film. It should be understood that those skilled in the art can orient any oxide thin film other than the aforementioned STO thin film by selecting the nanosheet monolayer film which matches with the crystalline structure of the oriented film desired to be grown.

FIG. 48 shows the frequency dependency of the dielectric constant of $Ti_{0.87}O_2$ nanosheet multilayer film (n=10) of Example 28.

According to FIG. 48, the specific dielectric constant of the nanosheet multilayer film obtained by the method of the invention was 83.9. The nanosheet multilayer film of the invention was found to have a specific dielectric constant greater than the specific dielectric constant of a Rutile-type $TiO_2$ (20 to 60). In addition, the nanosheet multilayer film of the invention was found to have a satisfactory dielectric property without showing any frequency dependency of the specific dielectric constant.

FIG. 49 shows the applied voltage dependency of the leak current density of $Ti_{0.87}O_2$ nanosheet multilayer film (n=10) of Example 28.

According to FIG. 49, the nanosheet multilayer film obtained by the method of the invention exhibited an insulating property as satisfactory as $10^{-4}$ A/cm$^2$ or less in spite of the number of layers as small as 10. For example, at an applied voltage of 1.0 V, the leak current density was $1.11 \times 10^{-4}$ A/cm$^2$. Such a value of the leak current density is comparable to those of existing oxides having high dielectic constants (for example a Rutile-type $TiO_2$, $(Ba,Sr)TiO_3$).

As evident from FIG. 48 to FIG. 49 discussed above, the nanosheet multilayer film obtained by the method of the invention was found to have a high dielectric constant and serve as a satisfactory dielectric material.

Industrial Applicability

Since the production method of the invention can give a thin film consisting of nanosheet monolayer film(s) which has a large area and a high quality within a short period, it is useful as an industrial film-forming method. Also since the resultant thin film can have functions such as a semiconductor property, a dielectric property, a ferromagnetic property, a fluorescent property, an optical catalytic property and the like, and serves as a seed layer substrate to enable the orientation and growth of a crystalline thin film having various functions such as a dielectric property, a ferrodielectric property, a transparent conductivity, a ferromagnetic property, an illuminating property, an optical catalytic property, a semiconductor property, a high conductivity and the like, it is expected to be applied to an important part of various functional materials or devices.

LEGENDS

210 Nanosheet
220 Water
230 Organic solvent
310 Organic solvent sol
320 Substrate

CITATION LIST

Non-Patent Literature

Non-patent Literature 1: T. Tanaka et al, Adv. Mater., 16,872 (2004)
Non-patent Literature 2: K. Akatsuka et al, ACS Nano, 3,1097 (2009)

The invention claimed is:

1. A method for producing a thin film consisting of nanosheet monolayer film(s) in which nanosheets obtained by the exfoliation of an inorganic layered compound are aligned densely without overlapping in every monolayer by a spin coat method comprising:
a step for preparing an organic solvent sol formed by allowing nanosheets to be dispersed in an organic solvent; and
a step for dropping the organic solvent sol onto a substrate and rotating the substrate using a spin coater;
wherein the inorganic layered compound is selected from the group consisting of layered perovskite oxide, layered manganese oxide, layered cobalt oxide, layered manganese-cobalt oxide, layered manganese-iron oxide, layered tungsten oxide, layered niobium oxide, layered tantalum oxide, layered titanium-niobium oxide, layered titanium-tantalum oxide, layered molybdenum oxide, and layered ruthenium oxide,
in the step involving rotating, the relationship between the organic solvent sol concentration and the spin coater rotation speed is a relationship of a quadratic function, and
the relationship of a quadratic function depends on the type and the size of the nanosheet.

2. The method according to claim 1 wherein the organic solvent is selected from the group consisting of dimethyl sulfoxide, formamide, propanol, dimethyl formamide, tetrahydrofuran, N,N-dimethyl acetamide, 1,3-dimethyl-2-imidazolidinone and N,N'-dimethyl propylene urea.

3. The method according to claim 1 wherein:
the inorganic layered compound is a layered perovskite oxide which is $M1Ca_2Nb_3O_{10}$, (wherein M1 is at least one alkaline metal element);
the nanosheet has a size within the range of 2 μm to 10 μm; and,
in the step involving rotating the spin coater rotation speed x(rpm) and the organic solvent sol concentration y(wt%) satisfy Equation (3) shown below:

$$y=10^{-8}x^2+0.0002x \qquad (3)$$

in which the value of x includes an allowable range of ±300 rpm, and the value of y includes an allowable range of ±10% based on the value of y.

4. The method according to claim 1 wherein the step involving rotating is conducted until the organic solvent sol dropped onto the substrate is dried.

5. The method according to claim 1 further comprising a step for repeating the step for dropping the organic solvent sol onto a substrate and rotating the substrate using a spin coater.

6. The method according to claim 5 wherein the step for repeating further comprises:
a step, subsequent to the step for dropping the organic solvent sol onto a substrate and rotating the substrate using a spin coater, for heating the thin film consisting of nanosheet monolayer film(s) formed on the substrate; and,
a step for washing the thin film consisting of nanosheet monolayer film(s) formed on the substrate with pure water.

7. The method according to claim 6 wherein the step for heating involves heating the thin film consisting of nanosheet monolayer film(s) formed on the substrate at a temperature within the range from 150° C. to 250°C.

8. The method according to claim 5 wherein the step for repeating further comprises:
a step, subsequent to the step for dropping the organic solvent sol onto a substrate and rotating the substrate using a spin coater, for washing the thin film consisting of nanosheet monolayer film(s) formed on the substrate with a further organic solvent; and,
a step for heating the thin film consisting of nanosheet monolayer film(s) formed on the substrate;
wherein the further organic solvent has an affinity to the organic solvent and wherein the boiling point of the further organic solvent is lower than the boiling point of the organic solvent.

9. The method according to claim 8 wherein the further organic solvent is selected from the group consisting of alcohols, acetone and acetonitrile.

10. The method according to claim 8 wherein the step for heating heats the thin film consisting of nanosheet monolayer film(s) formed on the substrate at a temperature within the range from 50° C. to 150°C.

11. The method according to claim 5 further comprising, subsequent to the step for repeating, a step for irradiating an ultraviolet light and removing organic substances between the nanosheet monolayer films.

12. A method for producing a thin film consisting of nanosheet monolayer film(s) in which nanosheets obtained by the exfoliation from a layered titanium oxide are aligned densely without overlapping in every monolayer by a spin coat method comprising:
a step for preparing an organic solvent sol formed by allowing the nanosheets to be dispersed in an organic solvent, wherein the organic solvent is selected from the group consisting of dimethyl sulfoxide, formamide, dimethyl formamide, tetrahydrofuran, N,N-dimethyl acetamide, 1,3-dimethyl-2-imidazolidinone, and N,N'-dimethyl propylene urea; and a step for dropping the organic solvent sol onto a substrate and rotating the substrate using a spin coater, wherein: the nanosheet has a size within the range of 300 nm to 500 nm; and, in the step involving rotating the spin coater rotation speed x(rpm) and the organic solvent sol concentration y(wt%) satisfy Equation (1) shown below:

$$y=9\times10^{-9}x^2+4\times10^{-5}x+0.082 \quad (1)$$

in which the value of x includes an allowable range of ±300 rpm, and the value of y includes an allowable range of ±10% based on the value of y.

13. The method according to claim 12 wherein the step involving rotating is conducted until the organic solvent sol dropped onto the substrate is dried.

14. The method according to claim 12 further comprising a step for repeating the step for dropping the organic solvent sol onto a substrate and rotating the substrate using a spin coater.

15. A method for producing a thin film consisting of nanosheet monolayer film(s) in which nanosheets obtained by the exfoliation from a layered titanium oxide are aligned densely without overlapping in every monolayer by a spin coat method comprising:

a step for preparing an organic solvent sol formed by allowing the nanosheets to be dispersed in an organic solvent, wherein the organic solvent is selected from the group consisting of dimethyl sulfoxide, formamide, dimethyl formamide, tetrahydrofuran, N,N-dimethyl acetamide, 1,3-dimethyl-2-imidazolidinone, and N,N'-dimethyl propylene urea; and a step for dropping the organic solvent sol onto a substrate and rotating the substrate using a spin coater, wherein: the nanosheet has a size within the range of 2 μm to 20 μm; and, in the step involving rotating the spin coater rotation speed x(rpm) and the organic solvent sol concentration y(wt%) satisfy Equation (2) shown below:

$$y=2\times10^{-8}x^2+2\times10^{-5}x \quad (2)$$

in which the value of x includes an allowable range of ±300 rpm, and the value of y includes an allowable range of ±10% based on the value of y.

16. The method according to claim 15 wherein the step involving rotating is conducted until the organic solvent sol dropped onto the substrate is dried.

17. The method according to claim 15 further comprising a step for repeating the step for dropping the organic solvent sol onto a substrate and rotating the substrate using a spin coater.

* * * * *